(12) United States Patent
Matsuo et al.

(10) Patent No.: US 12,272,644 B2
(45) Date of Patent: Apr. 8, 2025

(54) SEMICONDUCTOR MEMORY DEVICE

(71) Applicant: Kioxia Corporation, Tokyo (JP)

(72) Inventors: Kouji Matsuo, Ama Aichi (JP);
Fumitaka Arai, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 714 days.

(21) Appl. No.: 17/471,584

(22) Filed: Sep. 10, 2021

(65) Prior Publication Data

US 2022/0302016 A1 Sep. 22, 2022

(30) Foreign Application Priority Data

Mar. 22, 2021 (JP) ................... 2021-047990

(51) Int. Cl.
| | |
|---|---|
| *H01L 23/528* | (2006.01) |
| *H01L 23/522* | (2006.01) |
| *H10B 41/27* | (2023.01) |
| *H10B 41/41* | (2023.01) |
| *H10B 43/27* | (2023.01) |
| *H10B 43/40* | (2023.01) |

(52) U.S. Cl.
CPC ........ *H01L 23/528* (2013.01); *H01L 23/5226* (2013.01); *H10B 41/27* (2023.02); *H10B 41/41* (2023.02); *H10B 43/27* (2023.02); *H10B 43/40* (2023.02)

(58) Field of Classification Search
None
See application file for complete search history.

(56) References Cited

U.S. PATENT DOCUMENTS

| | | |
|---|---|---|
| 7,688,648 B2 | 3/2010 | Kim |
| 8,987,088 B2 | 3/2015 | Sakuma |
| 9,029,938 B2 | 5/2015 | Nakaki |
| 9,177,809 B2 | 11/2015 | Sakuma et al. |
| 9,514,792 B2 | 12/2016 | Kajigaya |
| 10,340,281 B2 | 7/2019 | Jiang et al. |
| 10,366,922 B2 | 7/2019 | Lee |
| 10,607,995 B2 | 3/2020 | Roberts et al. |
| 2016/0190151 A1 | 6/2016 | Yang |
| 2017/0018570 A1 | 1/2017 | Lue et al. |

(Continued)

FOREIGN PATENT DOCUMENTS

| | | |
|---|---|---|
| JP | 2015-056452 A | 3/2015 |
| JP | 2020-092141 A | 6/2020 |
| TW | 202027070 A | 7/2020 |

*Primary Examiner* — Jack S Chen
(74) *Attorney, Agent, or Firm* — Foley & Lardner LLP

(57) ABSTRACT

A semiconductor memory device includes memory block regions arranged in a first direction, a hook-up region arranged in the first direction with respect to memory block regions, and a wiring region extending in the first direction and arranged with memory block regions and the hook-up region in a second direction. Each of memory block regions includes memory strings extending in the first direction and arranged in the second direction and a first wiring extending in the second direction and connected to memory strings in common. The wiring region includes a second wiring extending in the first direction and connected to first wirings corresponding to memory block regions in common. The hook-up region includes a third wiring connected to the second wiring and a contact electrode extending in a third direction and connected to the third wiring.

19 Claims, 48 Drawing Sheets

(56) References Cited

U.S. PATENT DOCUMENTS

| | | |
|---|---|---|
| 2017/0033118 A1 | 2/2017 | Fujii et al. |
| 2020/0176033 A1 | 6/2020 | Hosotani et al. |
| 2020/0286828 A1 | 9/2020 | Hosotani et al. |
| 2022/0302016 A1* | 9/2022 | Matsuo .................. H10B 41/40 |
| 2023/0307359 A1* | 9/2023 | Watanabe .............. H10B 43/50 |

* cited by examiner

SEMICONDUCTOR MEMORY DEVICE

CROSS-REFERENCE TO RELATED APPLICATIONS

This application is based upon and claims the benefit of Japanese Patent Application No. 2021-047990, filed on Mar. 22, 2021, the entire contents of which are incorporated herein by reference.

BACKGROUND

Field

Embodiments described herein relate generally to a semiconductor memory device.

Description of the Related Art

There has been known a semiconductor memory device in which a plurality of memory cells are stacked in a direction intersecting with a surface of a substrate.

DETAILED DESCRIPTION

Figure 1:
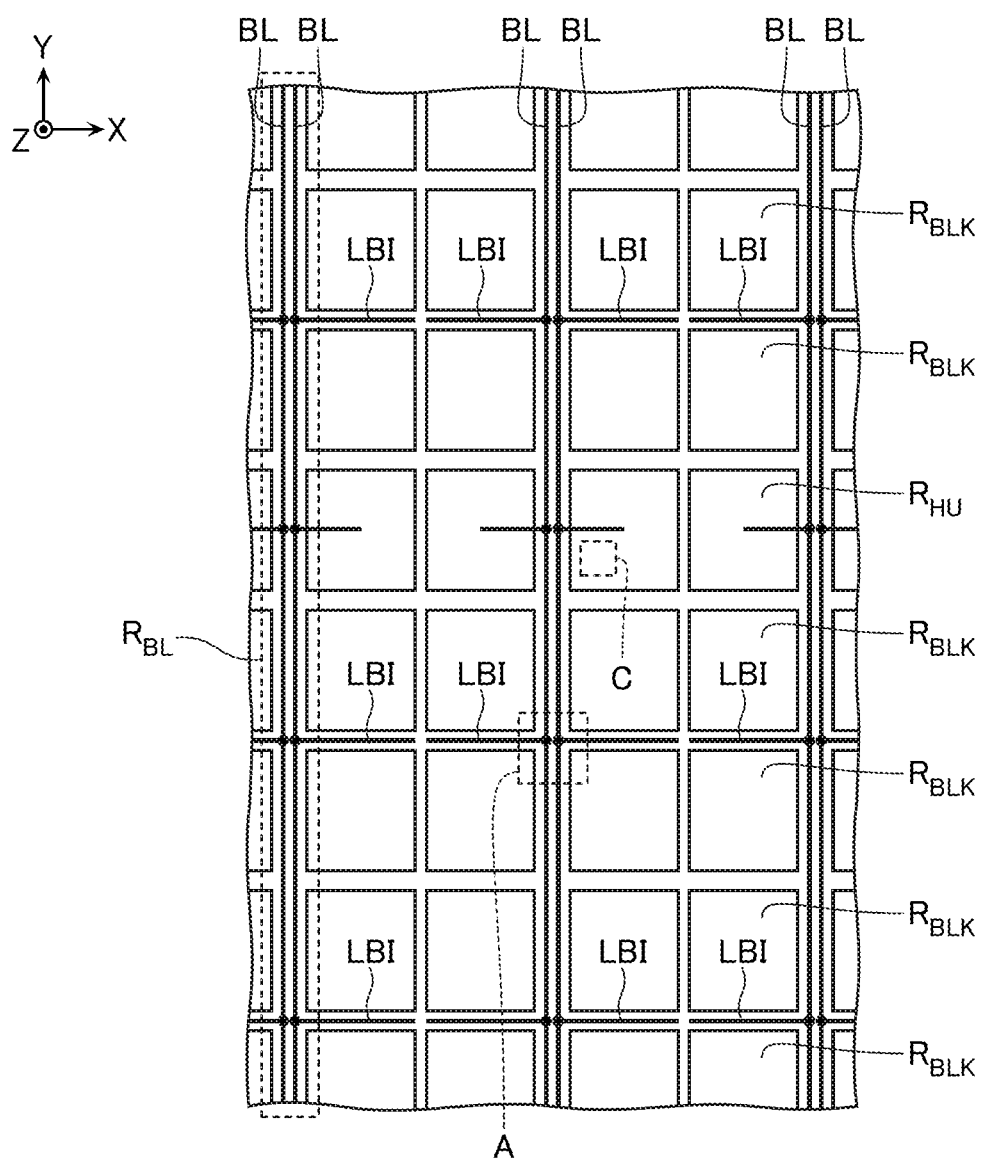
FIG. 1 is a schematic plan view illustrating a configuration of a part of a semiconductor memory device according to a first embodiment.

A semiconductor memory device according to one embodiment comprises a plurality of memory block regions arranged in a first direction, a hook-up region arranged in the first direction with respect to the plurality of memory block regions, and a wiring region extending in the first direction and arranged with the plurality of memory block regions and the hook-up region in a second direction intersecting with the first direction. Each of the plurality of memory block regions includes a plurality of memory strings extending in the first direction and arranged in the second direction and a first wiring extending in the second direction and connected to the plurality of memory strings in common. The wiring region includes a second wiring extending in the first direction and connected to a plurality of the first wirings corresponding to the plurality of memory block regions in common. The hook-up region includes a third wiring electrically connected to the second wiring and a contact electrode extending in a third direction intersecting with the first direction and the second direction and connected to the third wiring.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as aside surface and the like.

First Embodiment

[Configuration]

FIG. 1 is a schematic plan view illustrating a configuration of a part of a semiconductor memory device according to the first embodiment. The semiconductor memory device according to the embodiment includes a plurality of memory block regions $R_{BLK}$, a plurality of hook-up regions $R_{HU}$, and a plurality of bit line regions $R_{BL}$. The memory block regions $R_{BLK}$ are arranged in a matrix in an X-direction and a Y-direction. The respective hook-up regions $R_{HU}$ are disposed corresponding to the plurality of memory block regions $R_{BLK}$ arranged in the Y-direction. The hook-up regions $R_{HU}$ are arranged in the X-direction and adjacent to the memory block regions $R_{BLK}$ in the Y-direction. The respective bit line regions $R_{BL}$ are disposed corresponding to the plurality of memory block regions $R_{BLK}$ arranged in the Y-direction and the hook-up regions $R_{HU}$ corresponding to them. The bit line regions $R_{BL}$ are arranged with the plurality of memory block regions $R_{BLK}$ and the hook-up regions $R_{HU}$ in the X-direction.

In the example of FIG. 1, a local block connection line LBI extending in the X-direction is disposed between the two memory block regions $R_{BLK}$ arranged in the Y-direction. Configurations in the two memory block regions $R_{BLK}$ are each connected to the local block connection line LBI. In the bit line region $R_{BL}$, a bit line BL extending in the Y-direction is disposed. A plurality of the local block connection lines LBI arranged in the Y-direction are connected to the bit line BL in common. The bit line BL is electrically connected to a peripheral circuit (not illustrated) via the configuration in the hook-up region $R_{HU}$.

Figure 2:
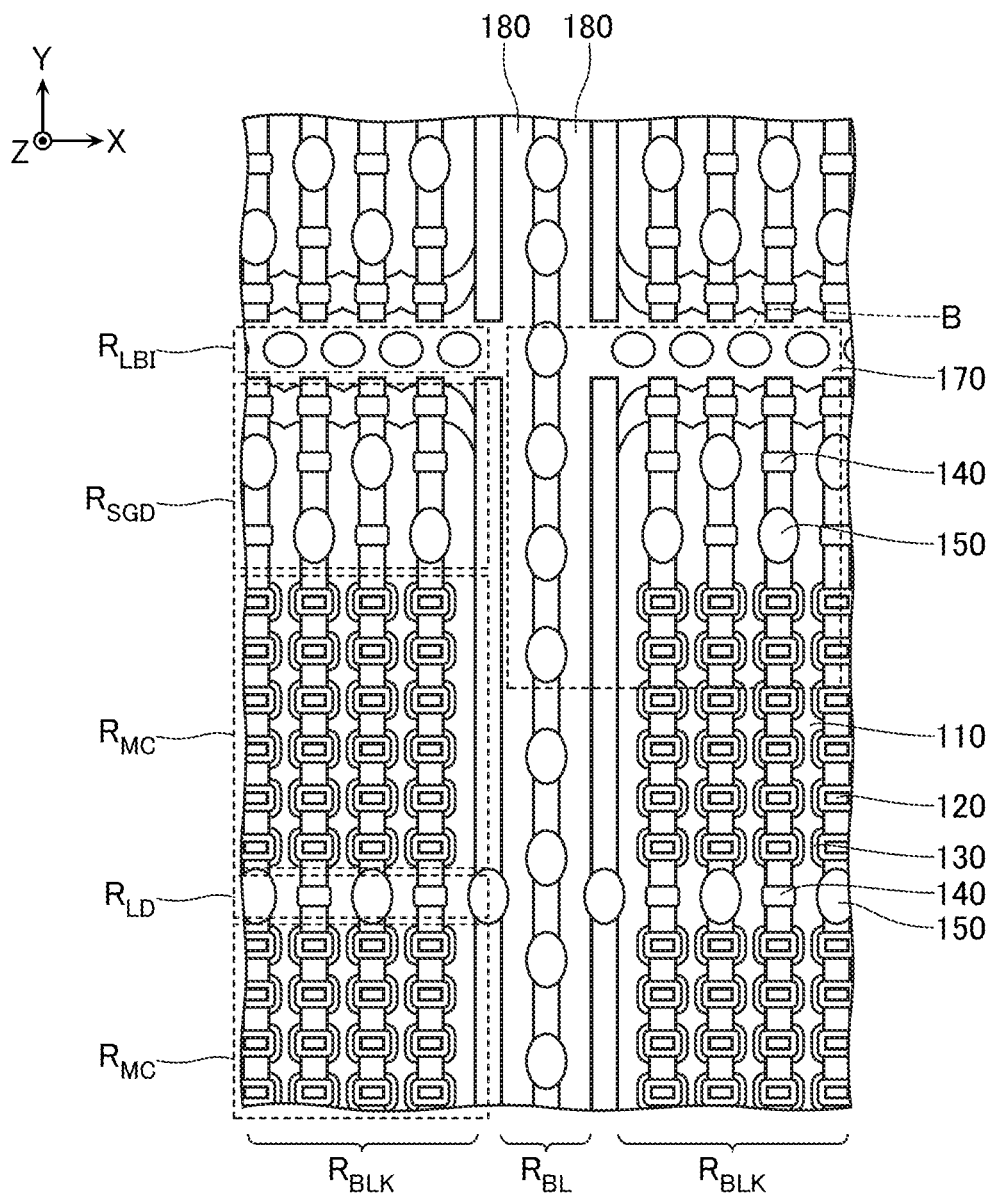
FIG. 2 is a schematic plan view illustrating an enlarged part indicated by A in FIG. 1.
Figure 3:
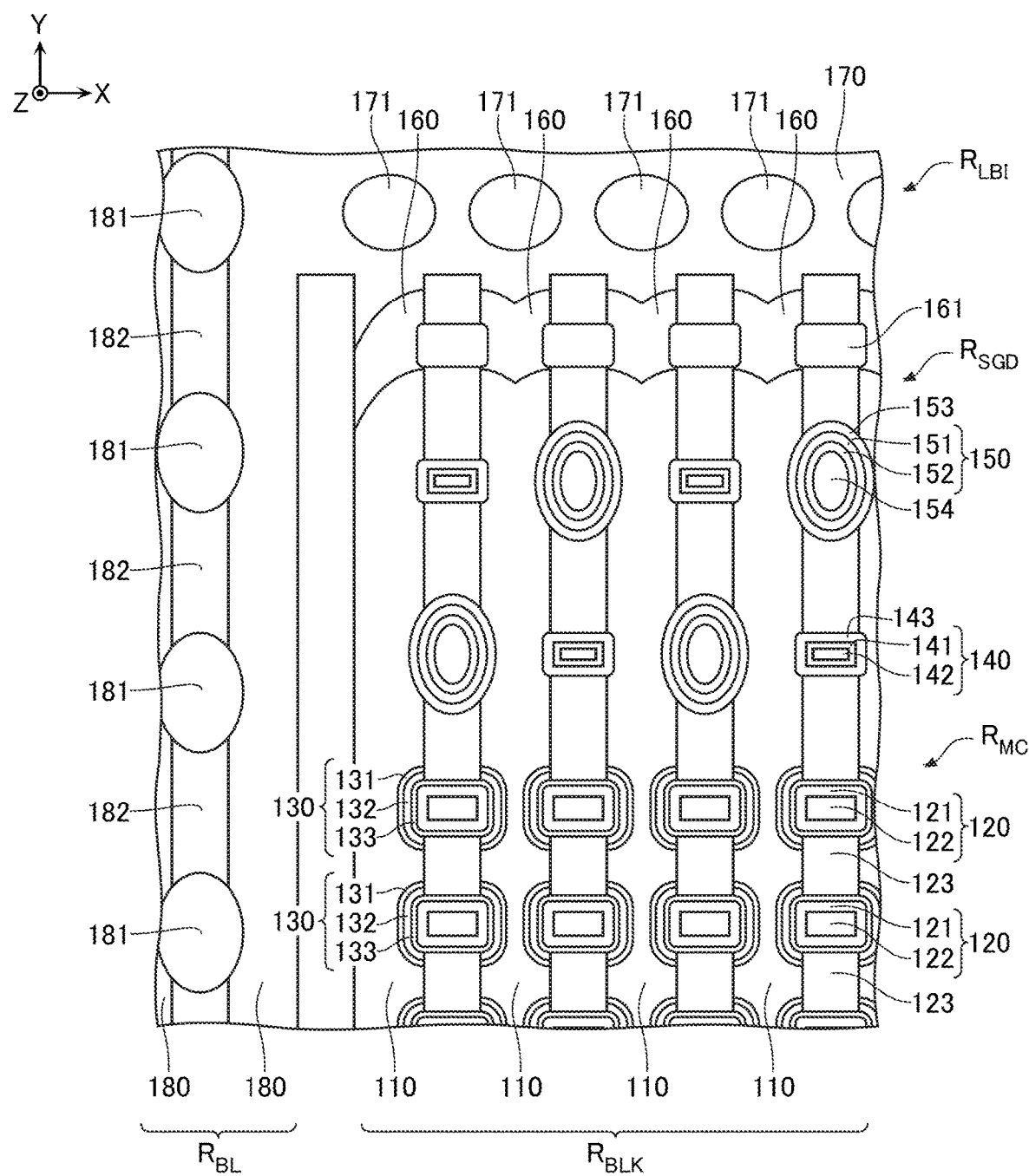
FIG. 3 is a schematic plan view illustrating an enlarged part indicated by B in FIG. 2.
Figure 4:
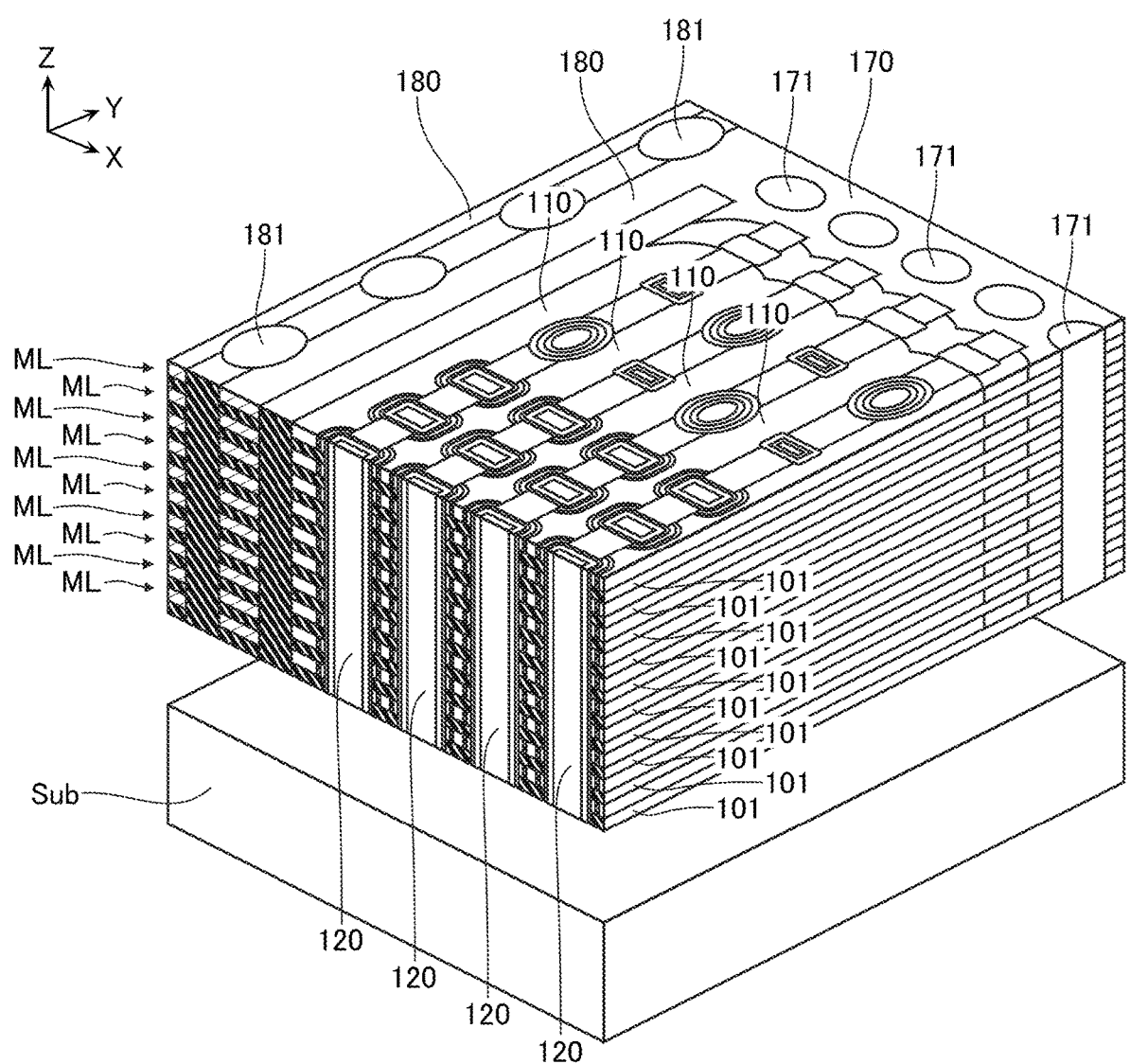
FIG. 4 is a schematic perspective view including a part illustrated in FIG. 3.

FIG. 2 is a schematic plan view illustrating an enlarged part indicated by A in FIG. 1. FIG. 3 is a schematic plan view illustrating an enlarged part indicated by B in FIG. 2. FIG. 4 is a schematic perspective view including a part illustrated in FIG. 3.

As illustrated in FIG. 2, the memory block region $R_{BLK}$ includes a plurality of memory cell regions $R_{MC}$ arranged in the Y-direction and a ladder region $R_{LD}$ disposed between the two memory cell regions $R_{MC}$ adjacent in the Y-direction. A select transistor region $R_{SGD}$ is disposed at an end portion in the Y-direction of the memory block region $R_{BLK}$. Between the two memory block regions $R_{BLK}$ arranged in the Y-direction, a local block connection line region $R_{LBI}$ is disposed.

FIG. 4 illustrates a part of a semiconductor substrate Sub. The semiconductor substrate Sub is a semiconductor substrate of, for example, silicon (Si) containing P-type impurities, such as boron (B). As illustrated in the drawing, the semiconductor memory device according to the embodiment includes a plurality of memory layers ML arranged in the Z-direction. Between the two memory layers ML adjacent in the Z-direction, an insulating layer 101 of, for example, silicon oxide ($SiO_2$) is disposed.

The memory layer ML includes a plurality of semiconductor layers 110 arranged in the X-direction. The plurality of semiconductor layers 110 each extend in the Y-direction across the plurality of memory cell regions $R_{MC}$ the plurality of ladder regions $R_{LD}$, and the select transistor region $R_{SGD}$ described with reference to FIG. 2. For example, the semiconductor layers 110 function as a plurality of memory transistors (memory cells) connected in series and a channel region of a select transistor connected to the memory transistors. In the following description, a configuration including the plurality of memory transistors connected in series and the select transistor connected to the memory transistors is referred to as a memory string in some cases. The semiconductor layer 110 may contain, for example, non-doped polycrystalline silicon (Si).

For example, as illustrated in FIG. 3, in the memory cell region $R_{MC}$, a plurality of conductive layers 120 positioned between the two semiconductor layers 110 adjacent in the X-direction and arranged in the Y-direction are disposed. In the memory cell region $R_{MC}$, the memory layer ML includes a plurality of gate insulating layers 130 disposed between side surfaces in the X-direction of the plurality of conductive layers 120 and the semiconductor layer 110.

The conductive layers 120 function as, for example, gate electrodes of the plurality of memory transistors and word lines connected to the gate electrodes. For example, as illustrated in FIG. 3, the conductive layer 120 may include a barrier conductive layer 121 of, for example, titanium nitride (TiN) and a conductive layer 122 of, for example, tungsten (W). For example, as illustrated in FIG. 4, the conductive layer 120 passes through the plurality of memory layers ML and extends in the Z-direction. Between the two conductive layers 120 adjacent in the Y-direction, an insulating layer 123 (FIG. 3) of, for example, silicon oxide ($SiO_2$) is disposed.

For example, the gate insulating layer 130 includes tunnel insulating layers 131 disposed on side surfaces in the X-direction of the semiconductor layer 110, electric charge accumulating layers 132 disposed on side surfaces in the X-direction, and a block insulating layer 133 disposed on side surfaces in the X-direction.

The tunnel insulating layer 131 may contain, for example, silicon oxide ($SiO_2$).

The electric charge accumulating layer 132 may contain, for example, polycrystalline silicon (Si). The polycrystalline silicon (Si) may contain N-type impurities, such as phosphorus (P), or P-type impurities, such as boron (B), or needs not contain these impurities.

The block insulating layer 133 may contain, for example, silicon oxide ($SiO_2$). The block insulating layer 133 may include any insulating metal oxide film including aluminum oxide (AlO) and hafnium oxide (HfO).

In the select transistor region $R_{SGD}$ (FIG. 2), a conductive layer 140 and a conductive layer 150 positioned between the two semiconductor layers 110 adjacent in the X-direction and arranged in the Y-direction are disposed. In the select transistor region $R_{SGD}$, the memory layer ML includes a plurality of semiconductor layers 160 connected to one ends in the Y-direction of the plurality of semiconductor layers 110.

The conductive layer 140 functions as, for example, a contact electrode to form a channel of holes in the semiconductor layer 110 and supply a voltage to the channel of holes formed in the semiconductor layer 110. For example, as illustrated in FIG. 3, the conductive layer 140 may include a semiconductor layer 141 of, for example, polycrystalline silicon (Si) containing P-type impurities, such as boron (B), and a conductive layer 142 of, for example, titanium nitride (TiN). The conductive layer 140 passes through the plurality of memory layers ML and extends in the Z-direction. A semiconductor layer 143 containing, for example, non-doped polycrystalline silicon (Si) may be disposed on an outer peripheral surface of the conductive layer 140. The semiconductor layer 143 may be omitted.

The conductive layer 150 functions as, for example, a gate electrode of a transistor and a wiring connected to the gate electrode. For example, as illustrated in FIG. 3, the conductive layer 150 may include a semiconductor layer 151 of, for example, polycrystalline silicon (Si), containing N-type impurities, such as phosphorus (P), and a conductive layer 152 of, for example, titanium nitride (TiN). The conductive layer 150 passes through the plurality of memory layers ML and extends in the Z-direction. An insulating layer 153 of, for example, silicon oxide ($SiO_2$) is disposed on an outer peripheral surface of the conductive layer 150. An insulating layer 154 of, for example, silicon oxide ($SiO_2$) may be disposed at a center part of the conductive layer 150. A width in the Y-direction of the conductive layer 150 may be larger than a width in the Y-direction of the conductive layer 140.

The semiconductor layer 160 may include a semiconductor layer of, for example, polycrystalline silicon (Si) containing N-type impurities, such as phosphorus (P). Between the two semiconductor layers 160 adjacent in the X-direction, an insulating layer 161 is disposed. The insulating layer 161 may contain, for example, silicon oxide ($SiO_2$). The insulating layer 161 passes through the plurality of memory layers ML and extends in the Z-direction.

In the ladder region $R_{LD}$ (FIG. 2), the conductive layer 140 or the conductive layer 150 is disposed between the two semiconductor layers 110 adjacent in the X-direction. Although the illustration is omitted, the semiconductor layer 143 (FIG. 3) and the insulating layer 153 (FIG. 3) are disposed on the outer peripheral surfaces of the conductive layer 140 and the conductive layer 150, respectively.

In the local block connection line region $R_{LBI}$ (FIG. 2), the memory layer ML includes a conductive layer 170. In the local block connection line region $R_{LBI}$, a plurality of insulating layers 171 (FIG. 3) arranged in the X-direction along the conductive layer 170 are disposed.

The conductive layer 170 functions as, for example, the local block connection line LBI (FIG. 1). The conductive layer 170 may include a conductive layer of, for example, titanium nitride (TiN). The conductive layer 170 extends in the X-direction and is connected to the plurality of semiconductor layers 110 via the plurality of semiconductor layers 160. The conductive layer 170 is electrically connected to the semiconductor layers 110 in the two memory block regions $R_{BLK}$ arranged in the Y-direction.

The insulating layer 171 may contain, for example, silicon oxide ($SiO_2$). For example, as illustrated in FIG. 4, the insulating layer 171 passes through the plurality of memory layers ML and extends in the Z-direction.

In the bit line region $R_{BL}$, the memory layer ML includes a pair of conductive layers 180 extending in the Y-direction. In the bit line region $R_{BL}$, a plurality of insulating layers 181 positioned between the two conductive layers 180 adjacent in the X-direction and arranged in the Y-direction are disposed.

The conductive layer 180 functions as, for example, the bit line BL (FIG. 1). The conductive layer 180 may include a conductive layer of, for example, titanium nitride (TiN). The conductive layer 180 extends in the Y-direction and is connected to one end portions in the X-direction of the plurality of conductive layers 170.

The insulating layer 181 may contain, for example, silicon oxide ($SiO_2$). The insulating layer 181 passes through the plurality of memory layers ML and extends in the Z-direction. Between the two insulating layers 181 adjacent in the Y-direction, an insulating layer 182 of, for example, silicon oxide ($SiO_2$) is disposed. A width in the X-direction of the insulating layer 181 may be larger than a width in the X-direction of the insulating layer 182.

Figure 5:
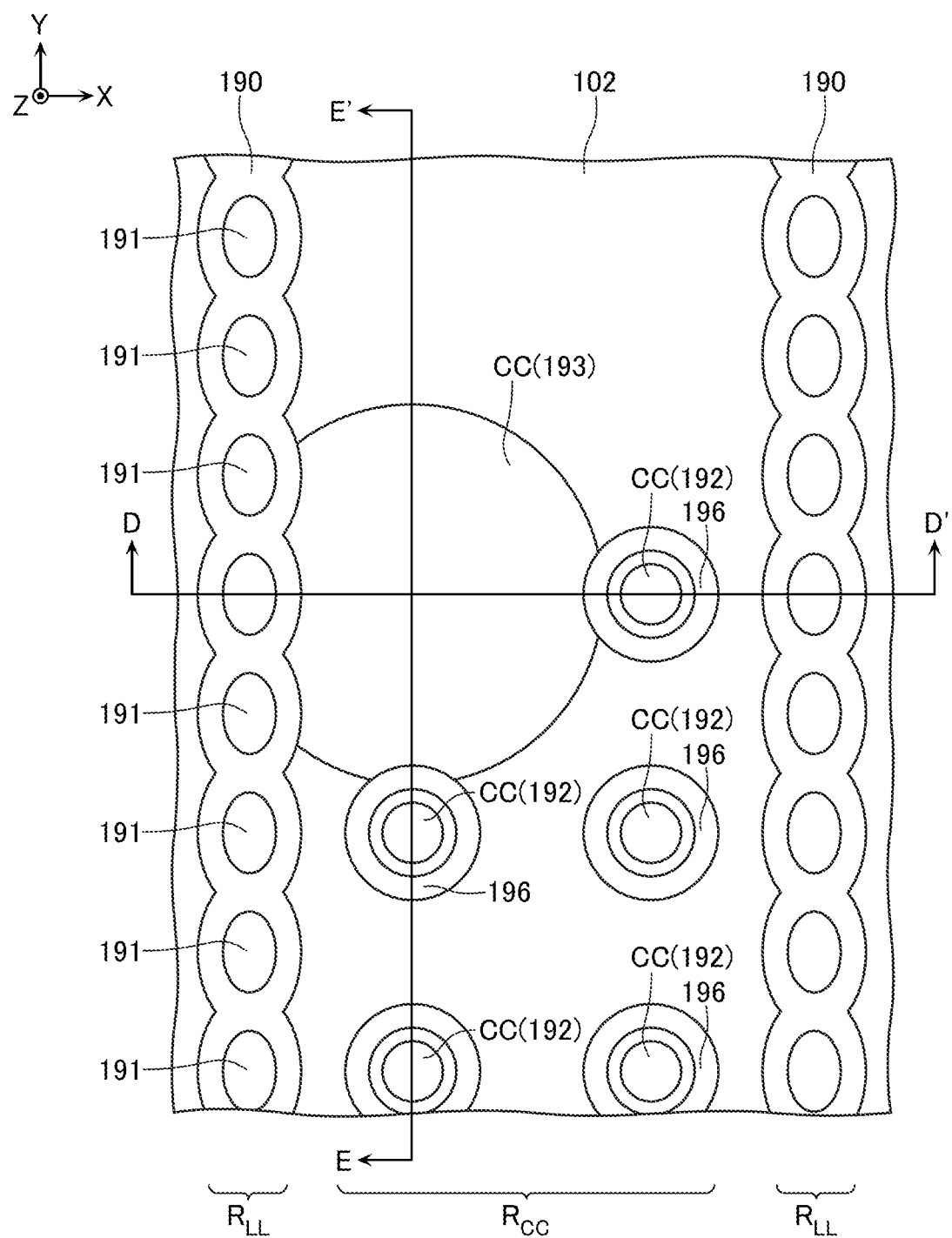
FIG. 5 is a schematic plan view illustrating an enlarged part indicated by C in FIG. 1.
Figure 6:
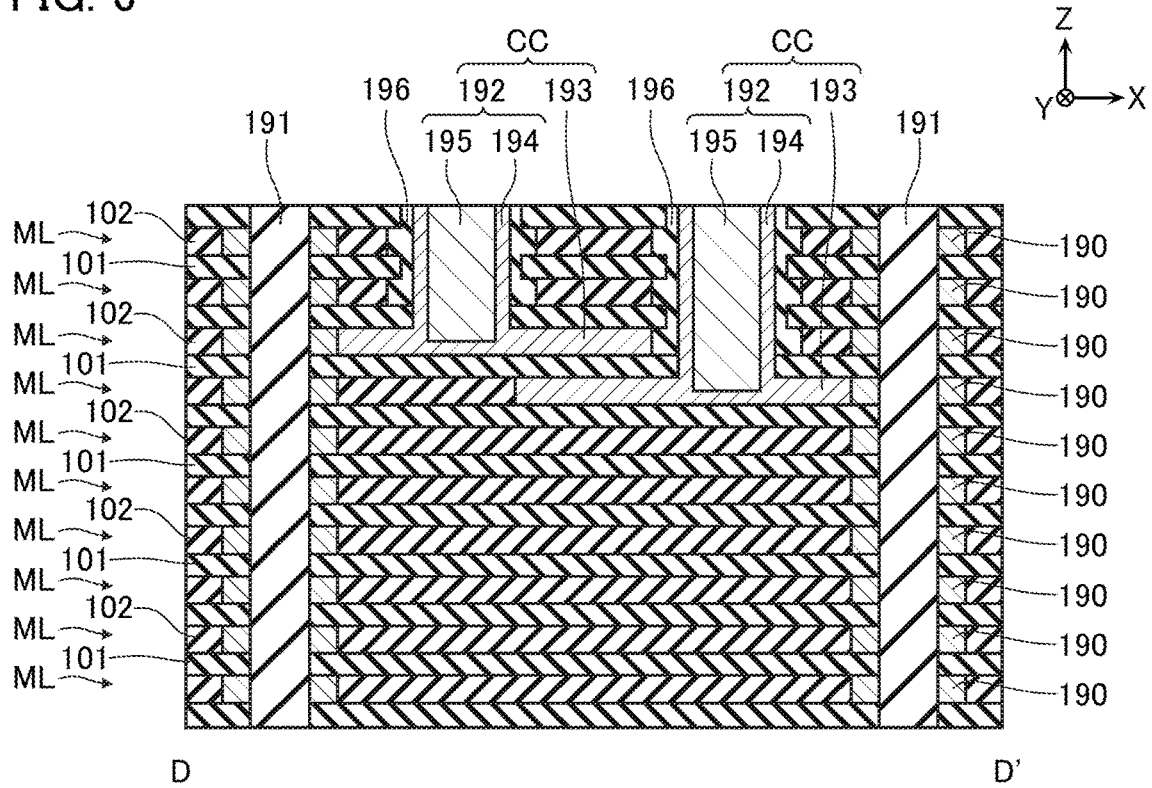
FIG. 6 is a schematic cross-sectional view of a structure illustrated in FIG. 5 taken along the line D-D' and viewed along the arrow direction.
Figure 7:
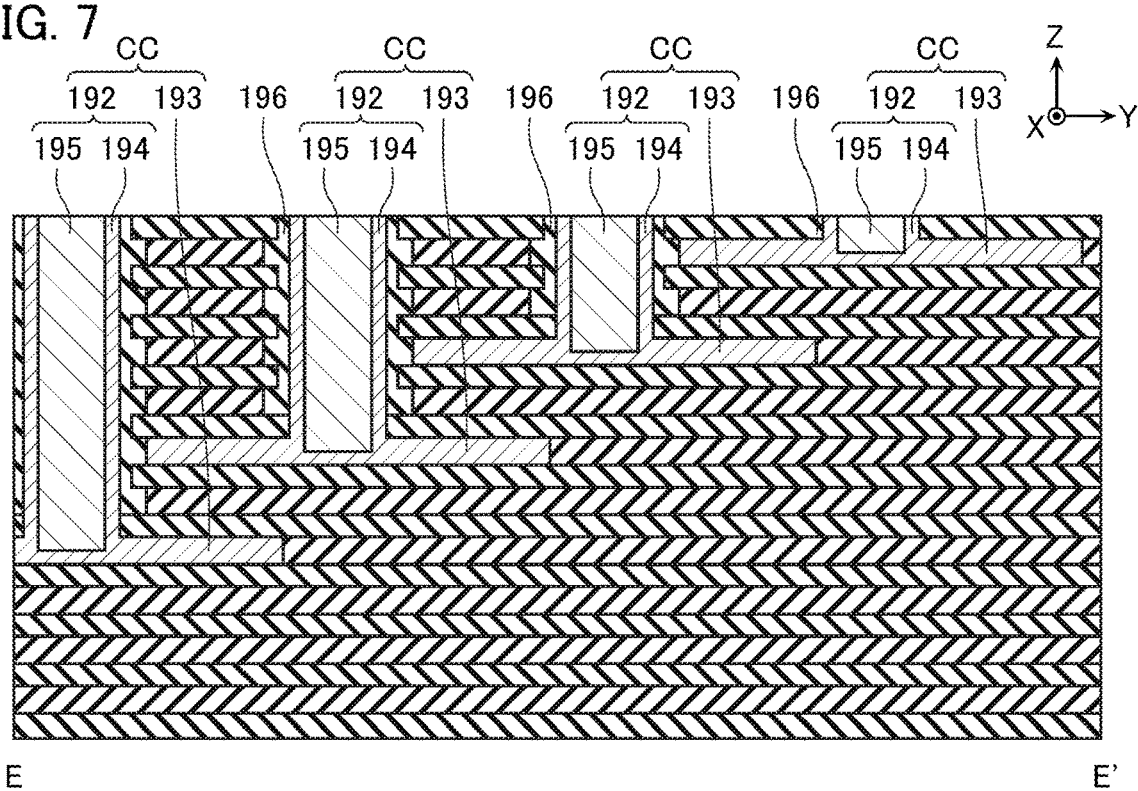
FIG. 7 is a schematic cross-sectional view of the structure illustrated in FIG. 5 taken along the line E-E' and viewed along the arrow direction.

FIG. 5 is a schematic plan view illustrating an enlarged part indicated by C in FIG. 1. FIG. 6 is a schematic cross-sectional view of a structure illustrated in FIG. 5 taken along the line D-D" and viewed along the arrow direction. FIG. 7 is a schematic cross-sectional view of the structure illustrated in FIG. 5 taken along the line E-E" and viewed along the arrow direction.

As illustrated in FIG. 5, the hook-up region $R_{HU}$ includes a plurality of lead line regions $R_{LL}$ arranged in the X-direction and a contact electrode region $R_{CC}$ disposed between the two lead line regions $R_{LL}$ adjacent in the X-direction.

In the lead line region $R_{LL}$, the memory layer ML includes a conductive layer 190 extending in the Y-direction. The lead line region $R_{LL}$ includes a plurality of insulating layers 191 arranged in the Y-direction along the conductive layer 190.

The conductive layer 190 may include a conductive layer of, for example, titanium nitride (TiN). The conductive layer 190 electrically conducts with the conductive layer 180, which have been described with reference to FIG. 2 to FIG. 4, and electrically conducts with the conductive layer 170, which has been described with reference to FIG. 2 to FIG. 4 via the conductive layers 180. In the example of FIG. 5, a plurality of convex curved surfaces corresponding to the plurality of insulating layers 191 are disposed on side surfaces in the X-direction of the conductive layer 190.

The insulating layer 191 may include an insulating layer of, for example, silicon oxide ($SiO_2$). For example, as illustrated in FIG. 6, the insulating layer 191 passes through the plurality of memory layers ML and extends in the Z-direction.

For example, as illustrated in FIG. 5, the contact electrode region $R_{CC}$ includes a plurality of contact electrodes CC arranged in the Y-direction along the conductive layer 190. In the contact electrode region $R_{cc}$, the memory layer ML includes an insulating layer 102 of, for example, silicon nitride ($Si_3N_4$).

For example, as illustrated in FIG. 6, the contact electrode CC includes a part 192 having an approximately columnar shape and a part 193 having an approximately disk shape disposed on a lower end portion of the part 192.

The part 192 may include a barrier conductive layer 194 of, for example, titanium nitride (TiN) and a conductive layer 195 of, for example, tungsten (W). The part 192 passes through the plurality of memory layers ML and extends in the Z-direction. An insulating layer 196 of, for example, silicon oxide ($SiO_2$) may be disposed on an outer peripheral surface of the part 192. A part of the outer peripheral surface of the insulating layer 196 is in contact with the insulating layers 101. A part of an outer peripheral surface of the insulating layer 196 is in contact with the insulating layers 102. A thickness in a radial direction of the part in contact with the insulating layer 102 of the insulating layer 196 may be larger than a thickness in a radial direction of the part in contact with the insulating layer 101 of the insulating layer 196.

The part 193 may include the barrier conductive layer 194 of, for example, titanium nitride (TiN). The part 193 is included in any of the memory layers ML and connected to a side surface in the X-direction of the conductive layer 190 included in any of the memory layers ML. In the hook-up region $R_{HU}$, the contact electrodes CC corresponding to all of the memory layers ML may be disposed. In this case, the number of contact electrodes CC may match the number of memory layers ML, or may be larger than the number of memory layers ML.

For example, as illustrated in FIG. 5 as an example, outlines of the parts 192 may be disposed along circumferences of circles having predetermined radii. A part of an outline of the part 193 maybe disposed along a circumference of a circle having a radius larger than this. A part other than the part of the outline of the part 193 maybe disposed inside this circle. For example, in the example of FIG. 5, a connection part with the conductive layer 190 of the part 193 includes a plurality of recessed curved surfaces. The parts are disposed inside the circle. In the example of FIG. 5, a connection part with the insulating layer 196 of the part 193 includes a recessed curved surface disposed along an outer peripheral surface of a circle having a center point of the contact electrode CC corresponding to the insulating layer 196 as its center. The part is disposed inside the circle. An area in an X-Y cross-sectional surface of the part 193 may be larger than an area in the X-Y cross-sectional surface of the part 192.

Effects

There has been known a semiconductor memory device that includes a plurality of conductive layers or semiconductor layers arranged in the Z-direction. In the semiconductor memory device, a hook-up region to connect the plurality of conductive layers or semiconductor layers and a peripheral circuit is disposed in some cases. The hook-up region includes a plurality of contact electrodes extending in the Z-direction. In the hook-up region, to connect the plurality of conductive layers or semiconductor layers with a plurality of contact electrodes, for example, end portion positions of the plurality of conductive layers or semiconductor layers are displaced and approximately staircase structures are formed in some cases. In this case, as the number of conductive layers or semiconductor layers arranged in the Z-direction increases, the area of the hook-up region increases.

Here, as described with reference to FIG. 1, in the semiconductor memory device according to the embodiment, the plurality of memory block regions $R_{BLK}$ are arranged in the Y-direction. Additionally, hook-up regions are not disposed corresponding to the plurality of respective memory block regions $R_{BLK}$, but the common hook-up region $R_{HU}$ is disposed corresponding to the plurality of memory block regions $R_{BLK}$. With the configuration, the area of the hook-up region $R_{HU}$ can be substantially reduced.

To employ the approximately staircase structure as described above, the entire lower surface of the conductive layer or the semiconductor layer is opposed to the upper surface of the conductive layer or the semiconductor layer lower than the layers. Therefore, there may be a case where an electrostatic capacity between the two conductive layers or semiconductor layers adjacent in the Z-direction becomes comparatively large. The lower the conductive layer or the semiconductor layer is disposed, the more the opposed area becomes.

Therefore, in the semiconductor memory device according to the embodiment, instead of the approximately staircase structure as described above, the contact electrodes CC described with reference to FIG. 5 to FIG. 7 are employed. The contact electrode CC includes the part 192 extending in the Z-direction and the approximately disk-shaped part 193 connected to the lower end of the part 192. Each of the approximately disk-shaped parts 193 is connected to the side surface of the conductive layer 190.

The configuration allows comparatively decreasing the opposed area between the two parts 193 arranged in the Z-direction. This allows comparatively decreasing the electrostatic capacity between the two conductive layers or semiconductor layers adjacent in the Z-direction. This configuration also allows reducing the electrostatic capacity between the conductive layers or the semiconductor layers disposed at the lower layers within a range of a fixed size.

[Manufacturing Method]

FIG. 8 to FIG. 39 are schematic cross-sectional views or plan views for describing the manufacturing method of the semiconductor memory device according to the first embodiment. FIG. 8, FIG. 10, FIG. 11, FIG. 13, FIG. 14, FIG. 16, FIG. 17, FIG. 19 to FIG. 22, FIG. 28, and FIG. 29 correspond to the cross-sectional surface illustrated in a part of FIG. 4. However, for convenience of description, a cross-sectional surface corresponding to an insulating layer 181 is added to these drawings. FIG. 9, FIG. 12, FIG. 15, FIG. 18, and FIG. 23 to FIG. 27 illustrate a part corresponding to FIG. 3. FIG. 30, FIG. 32, FIG. 34, FIG. 36, and FIG. 38 illustrate a part corresponding to FIG. 6. FIG. 31, FIG. 33, FIG. 35, FIG. 37, and FIG. 39 illustrate a part corresponding to FIG. 7.

Figure 8:
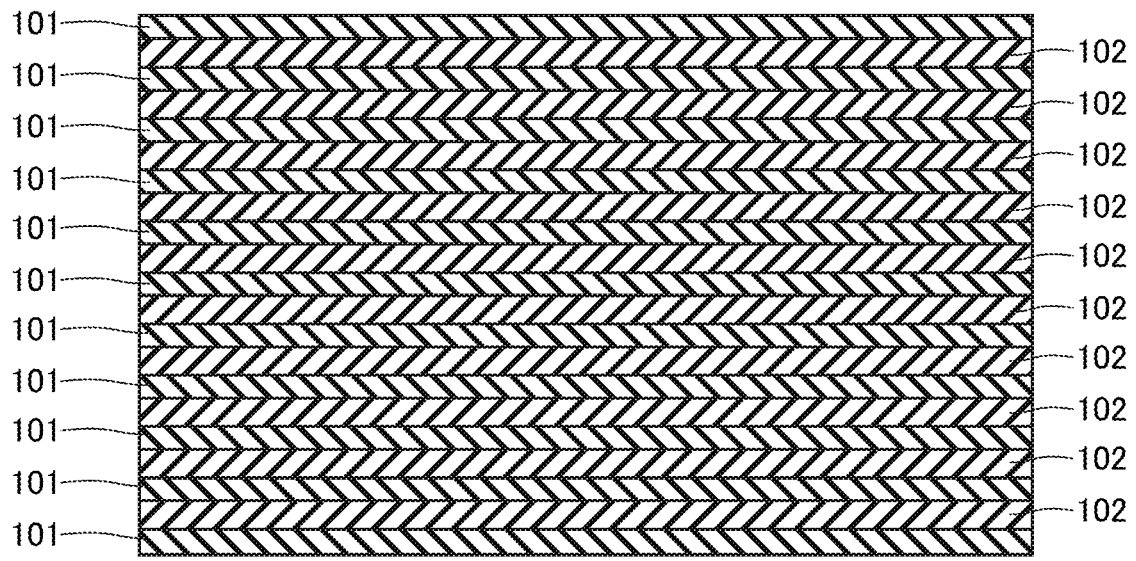
FIG. 8 is a schematic cross-sectional view for describing a manufacturing method of a semiconductor memory device according to the first embodiment.

In the manufacturing method, for example, as illustrated in FIG. 8, the plurality of insulating layers 101 and the plurality of insulating layers 102 are formed in alternation. The step is performed by, for example, Chemical Vapor Deposition (CVD).

Figure 9:
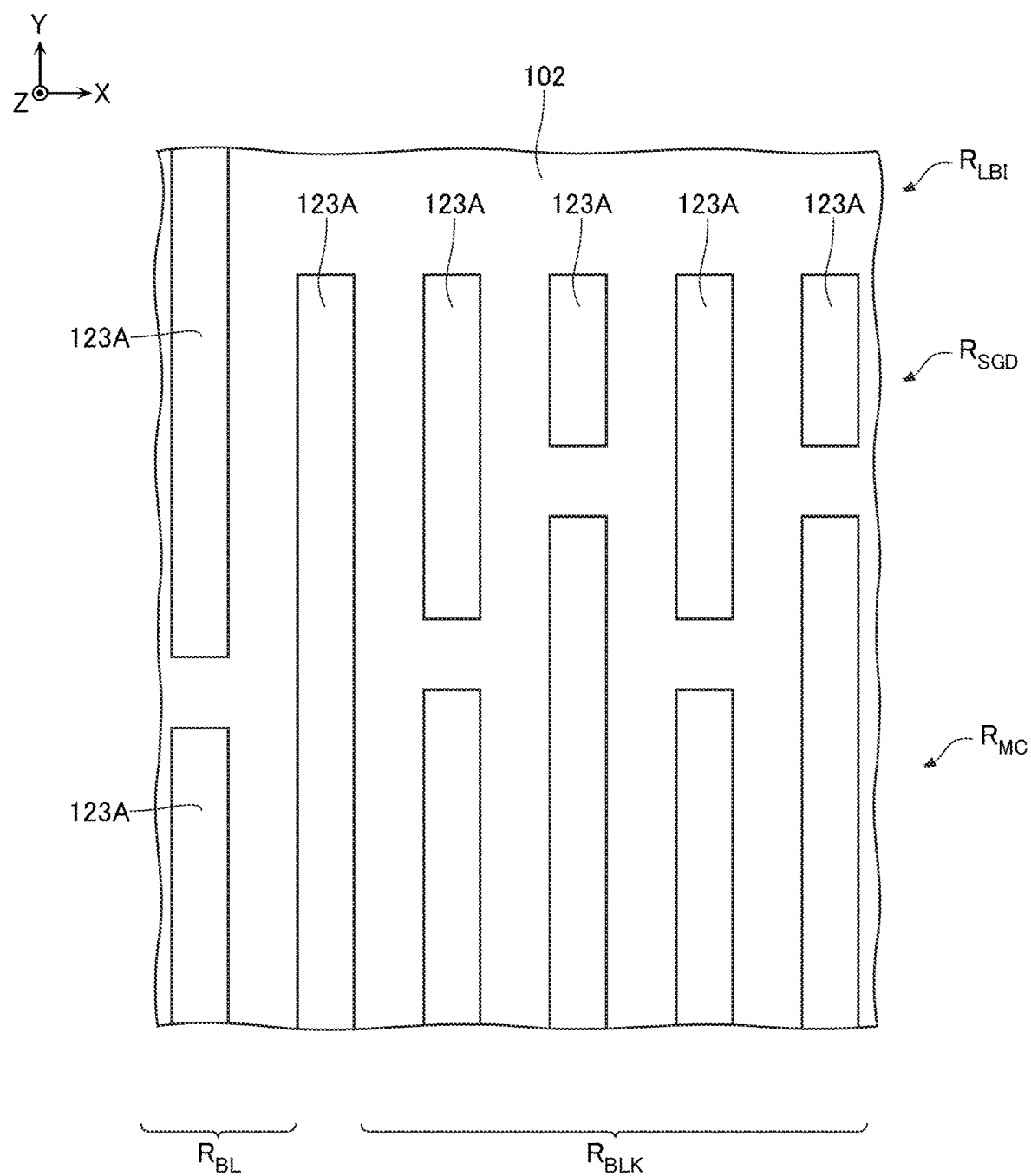
FIG. 9 is a schematic plan view for describing the manufacturing method.
Figure 10:
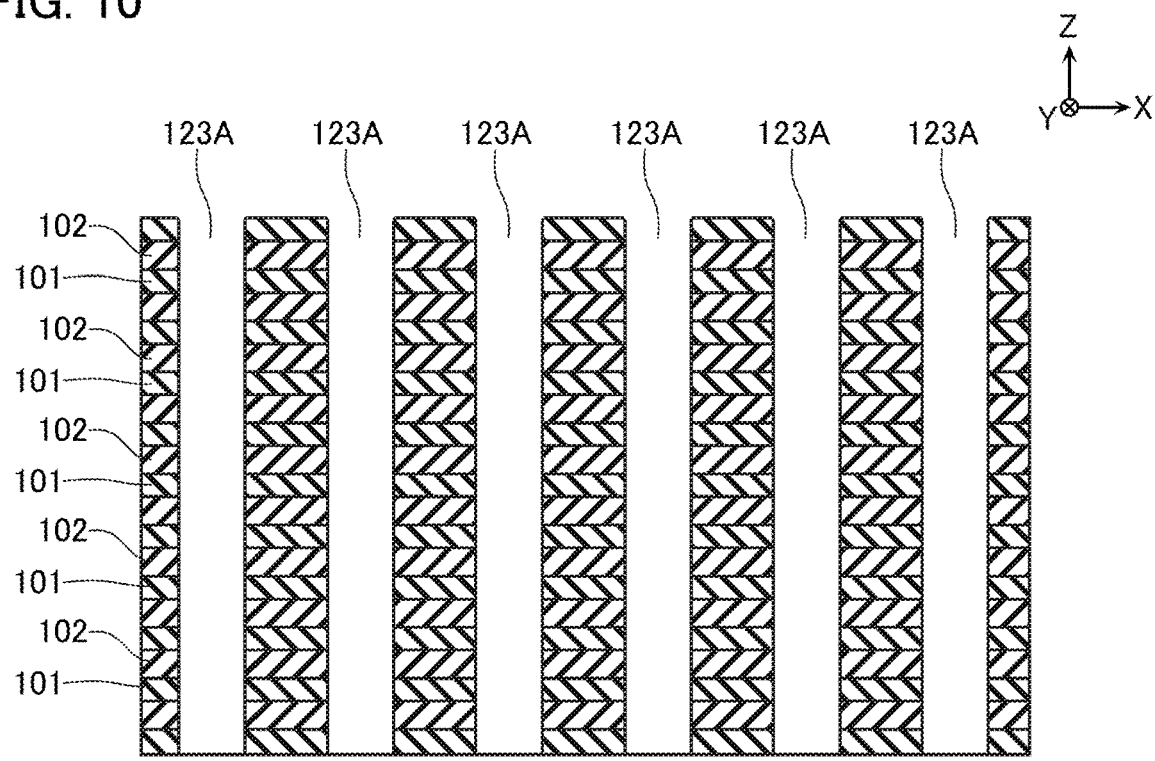
FIG. 10 is a schematic cross-sectional view for describing the manufacturing method.

Next, for example, as illustrated in FIG. 9 and FIG. 10, openings 123A are formed. As illustrated in FIG. 9, the openings 123A extend in the Y-direction and are arranged in the X-direction. As illustrated in FIG. 10, the openings 123A extend in the Z-direction and pass through the plurality of insulating layers 101 and the plurality of insulating layers 102 arranged in the Z-direction. The step is performed by, for example, Reactive Ion Etching (RIE).

Figure 11:
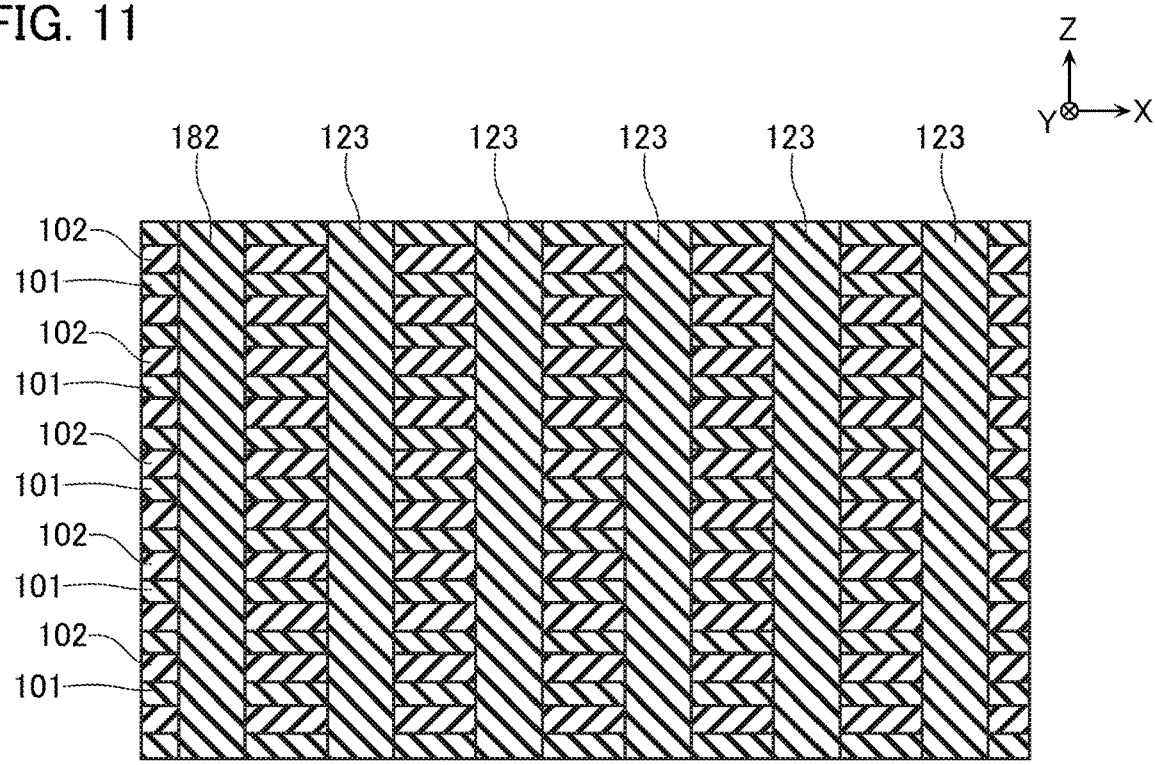
FIG. 11 is a schematic cross-sectional view for describing the manufacturing method.

Next, for example, as illustrated in FIG. 11, insulating layers 123 and 182 are formed. The step is performed by, for example, CVD.

Figure 12:
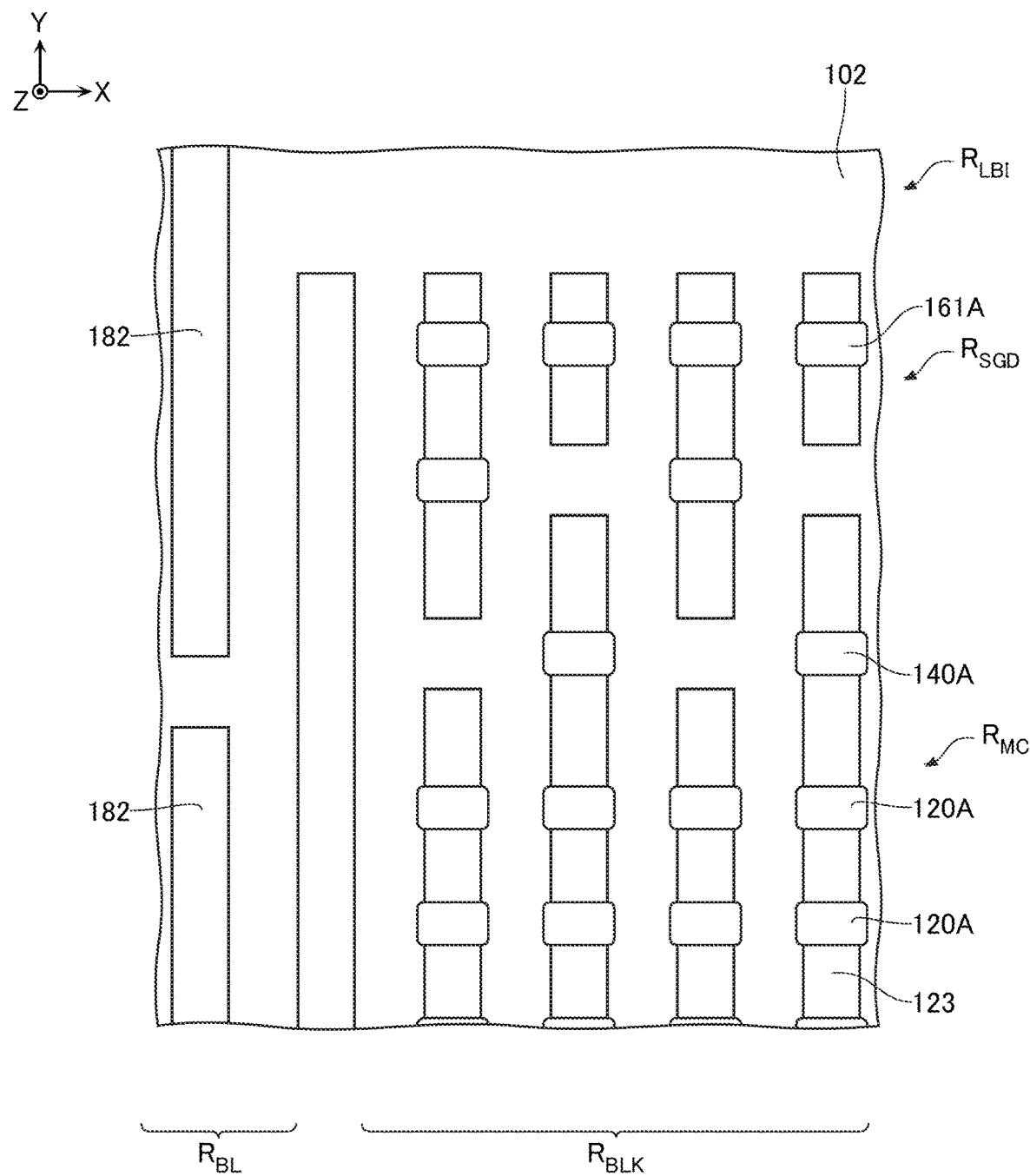
FIG. 12 is a schematic plan view for describing the manufacturing method.
Figure 13:
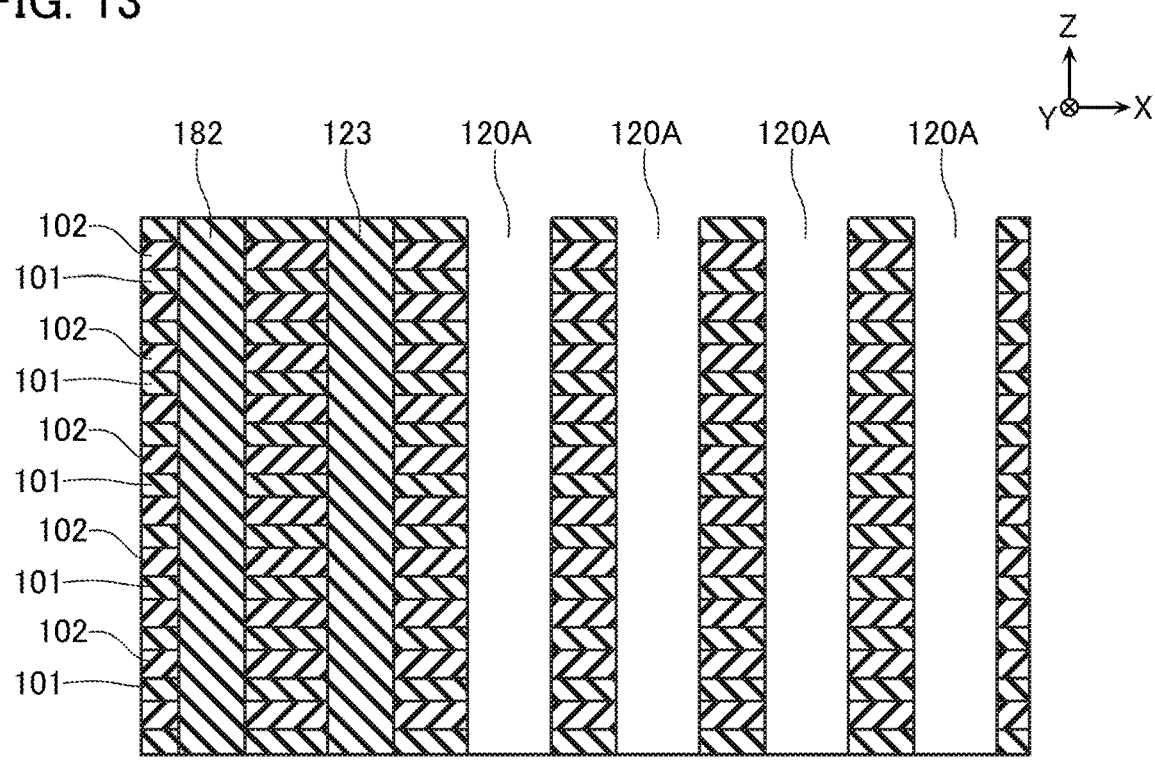
FIG. 13 is a schematic cross-sectional view for describing the manufacturing method.

Next, for example, as illustrated in FIG. 12 and FIG. 13, openings 120A are formed at positions corresponding to the conductive layers 120. Openings 140A are formed at positions corresponding to the conductive layers 140. Openings 161A are formed at positions corresponding to the insulating layers 161. As illustrated in FIG. 13, the openings 120A, 140A, and 161A extend in the Z-direction to expose side surfaces in the X-direction of the plurality of insulating layers 101 and the plurality of insulating layers 102 arranged in the Z-direction. The step is performed by, for example, RIE.

Figure 14:
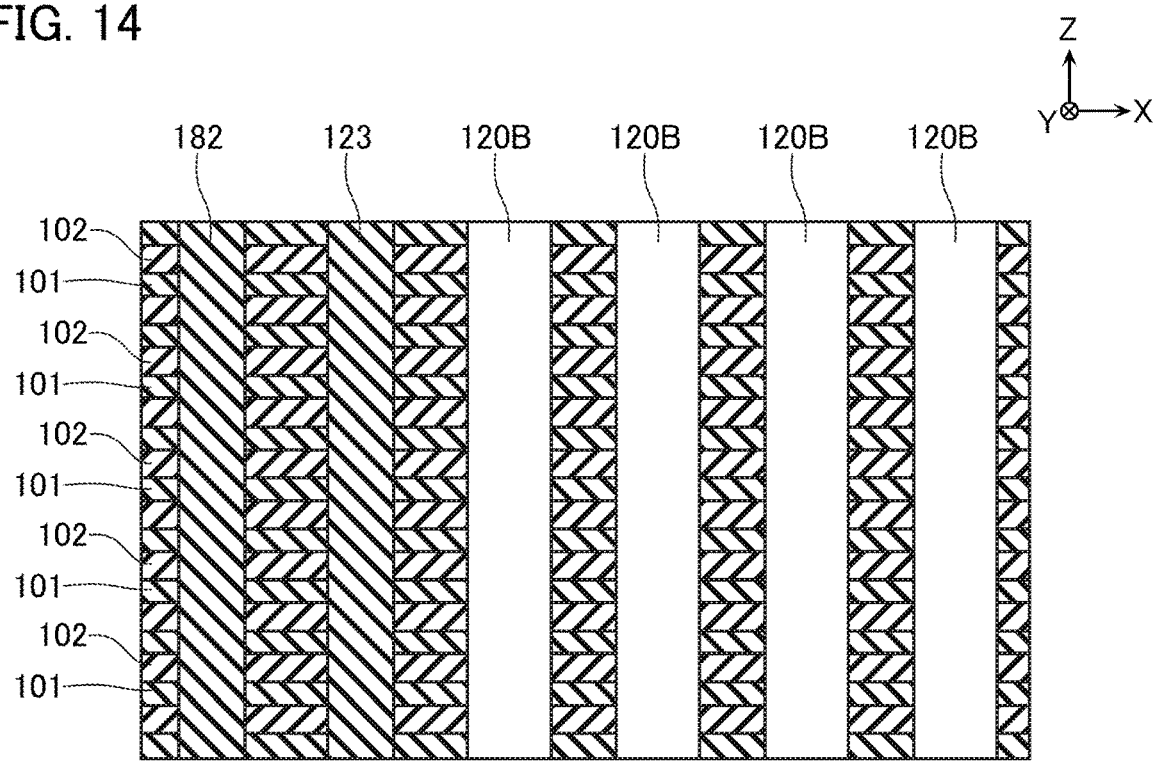
FIG. 14 is a schematic cross-sectional view for describing the manufacturing method.

Next, for example, as illustrated in FIG. 14, sacrifice layers 120B are formed inside the openings 120A. Although the illustration is omitted, sacrifice layers 140B are formed inside the openings 140A. Although the illustration is omitted, sacrifice layers 161B are formed inside the openings 161A. The step is performed by, for example, CVD.

Figure 15:
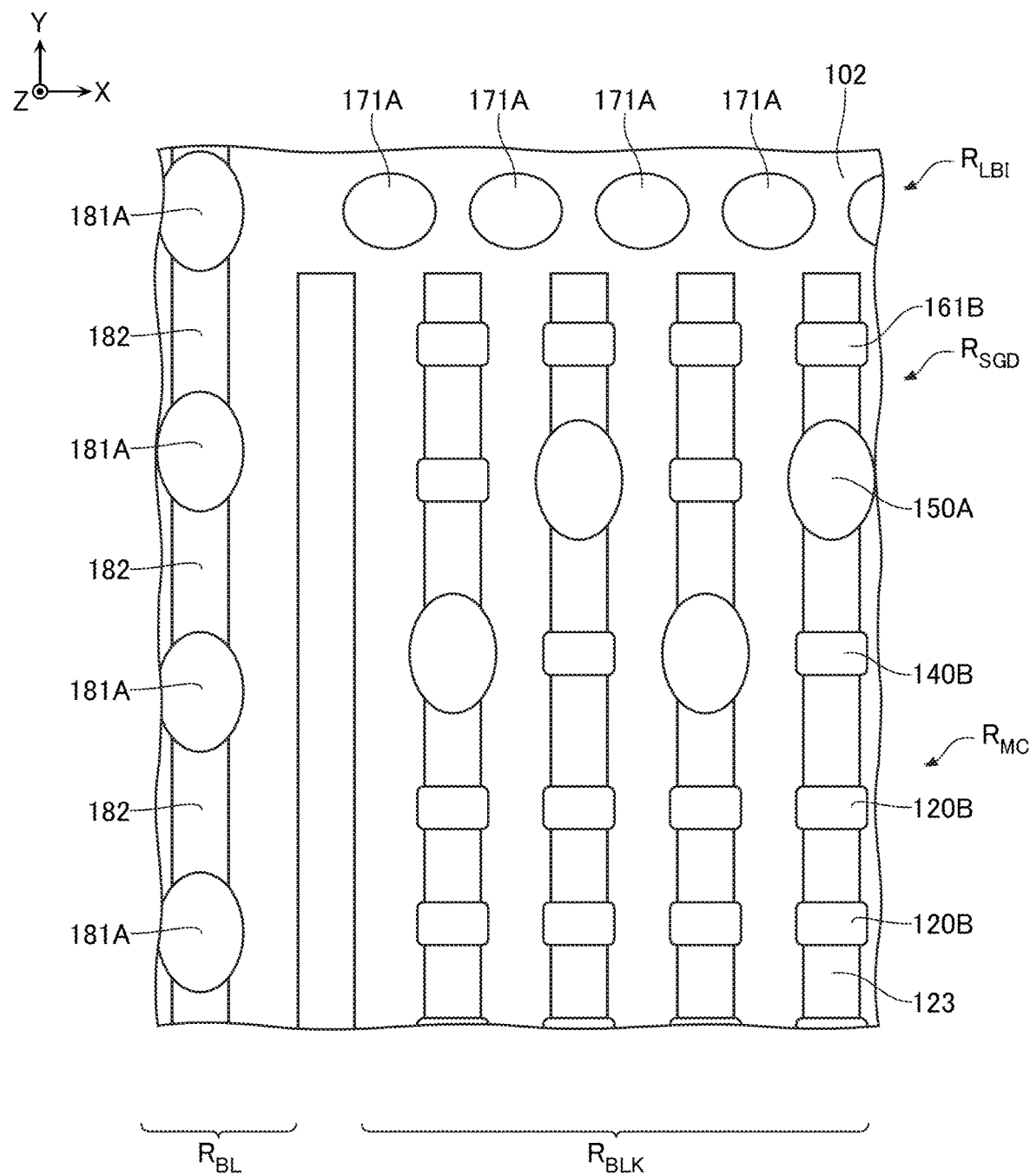
FIG. 15 is a schematic plan view for describing the manufacturing method.
Figure 16:
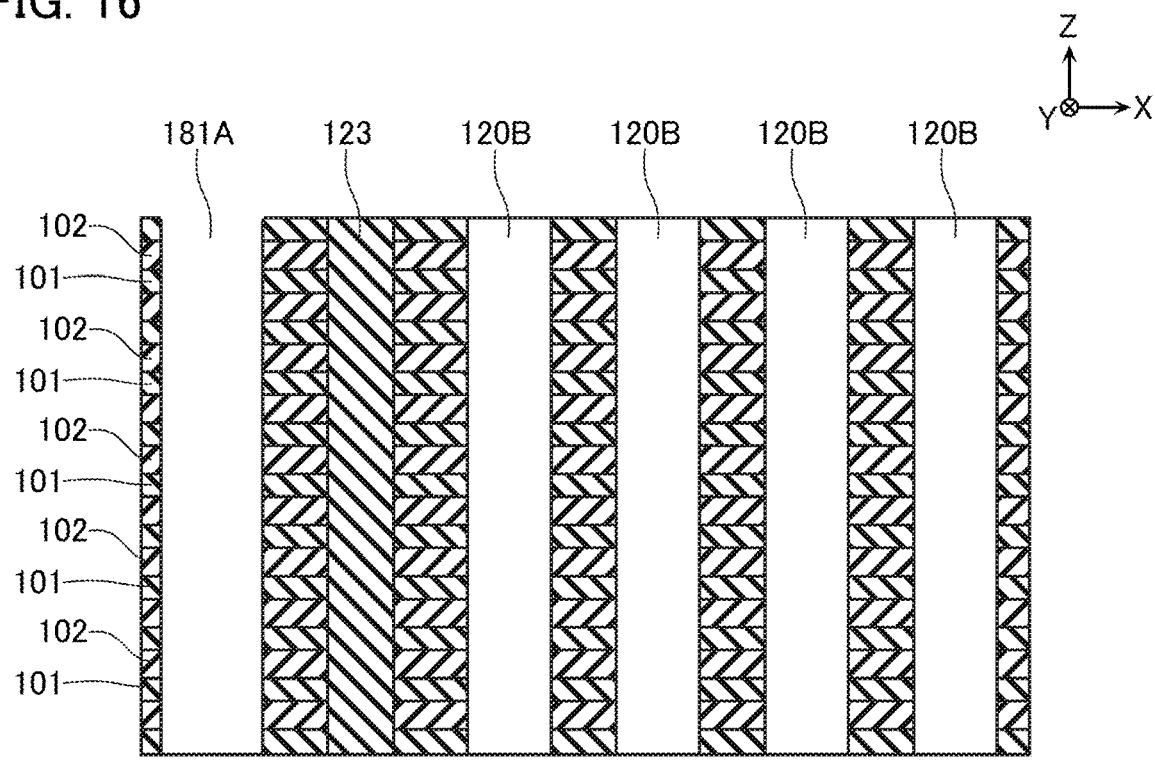
FIG. 16 is a schematic cross-sectional view for describing the manufacturing method.

Next, for example, as illustrated in FIG. 15 and FIG. 16, openings 150A are formed at positions corresponding the conductive layers 150. Openings 171A are formed at positions corresponding to the insulating layers 171. Openings 181A are formed at positions corresponding to the insulating layers 181. Although the illustration is omitted, openings are formed at positions corresponding to the insulating layers 191 (FIG. 5). The openings 150A, 171A, and 181A and the like extend in the Z-direction as illustrated in FIG. 16 to expose side surfaces in the X-direction of the plurality of insulating layers 101 and the plurality of insulating layers 102 arranged in the Z-direction. The step is performed by, for example, RIE.

Figure 17:
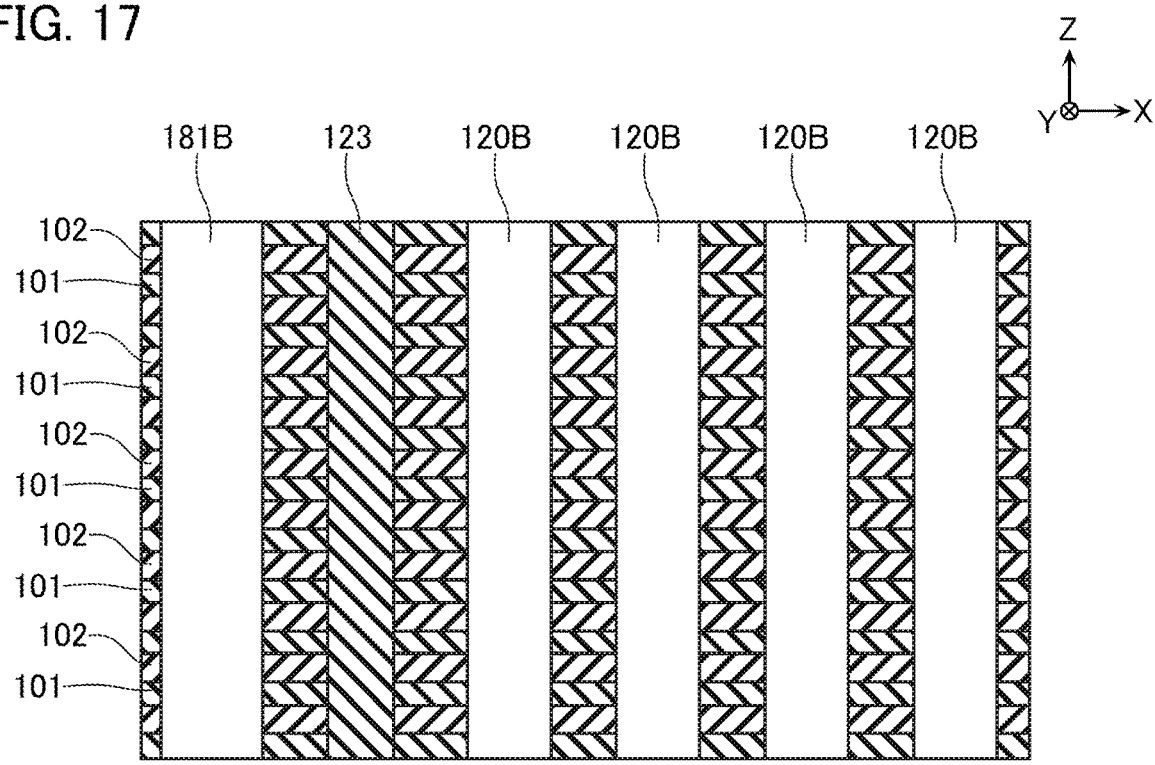
FIG. 17 is a schematic cross-sectional view for describing the manufacturing method.

Next, for example, as illustrated in FIG. 17, a sacrifice layer 181B is formed inside the opening 181A. Although the illustration is omitted, sacrifice layers 150B are formed inside the openings 150A. Although the illustration is omitted, sacrifice layers 171B are formed inside the openings 171A. Although the illustration is omitted, sacrifice layers are formed at positions corresponding to the insulating layers 191 (FIG. 5). The step is performed by, for example, CVD.

Figure 18:
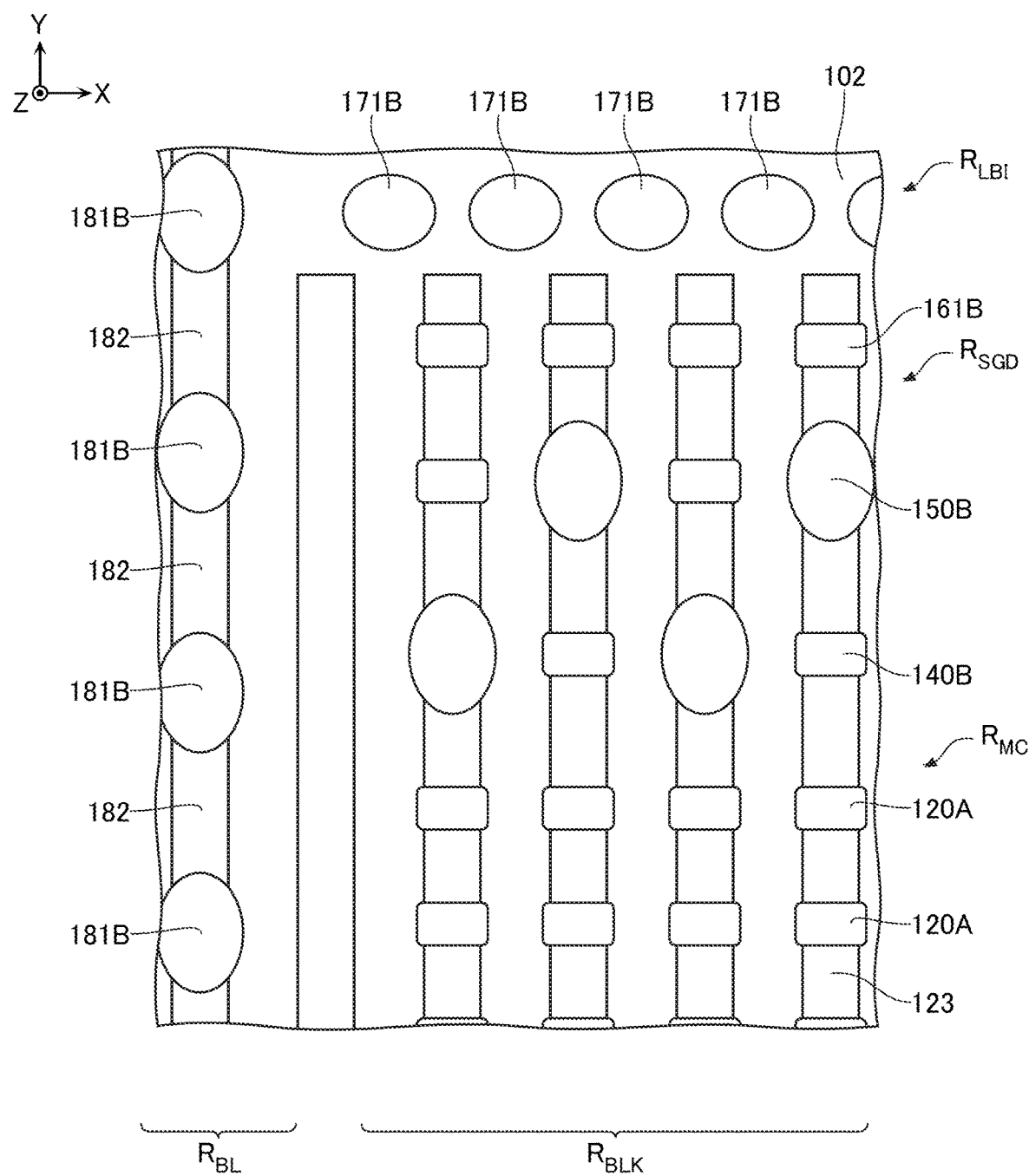
FIG. 18 is a schematic plan view for describing the manufacturing method.
Figure 19:
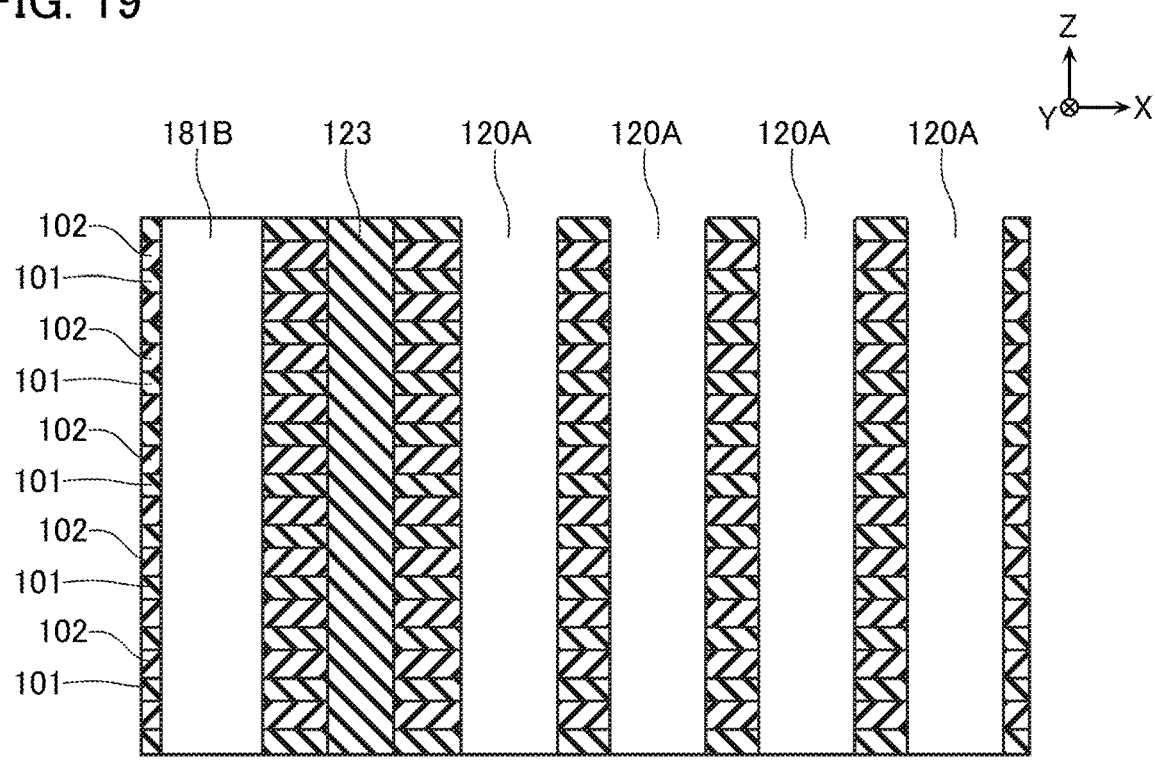
FIG. 19 is a schematic cross-sectional view for describing the manufacturing method.

Next, for example, as illustrated in FIG. 18 and FIG. 19, the sacrifice layers 120B are removed. The step is performed by, for example, wet etching.

Figure 20:
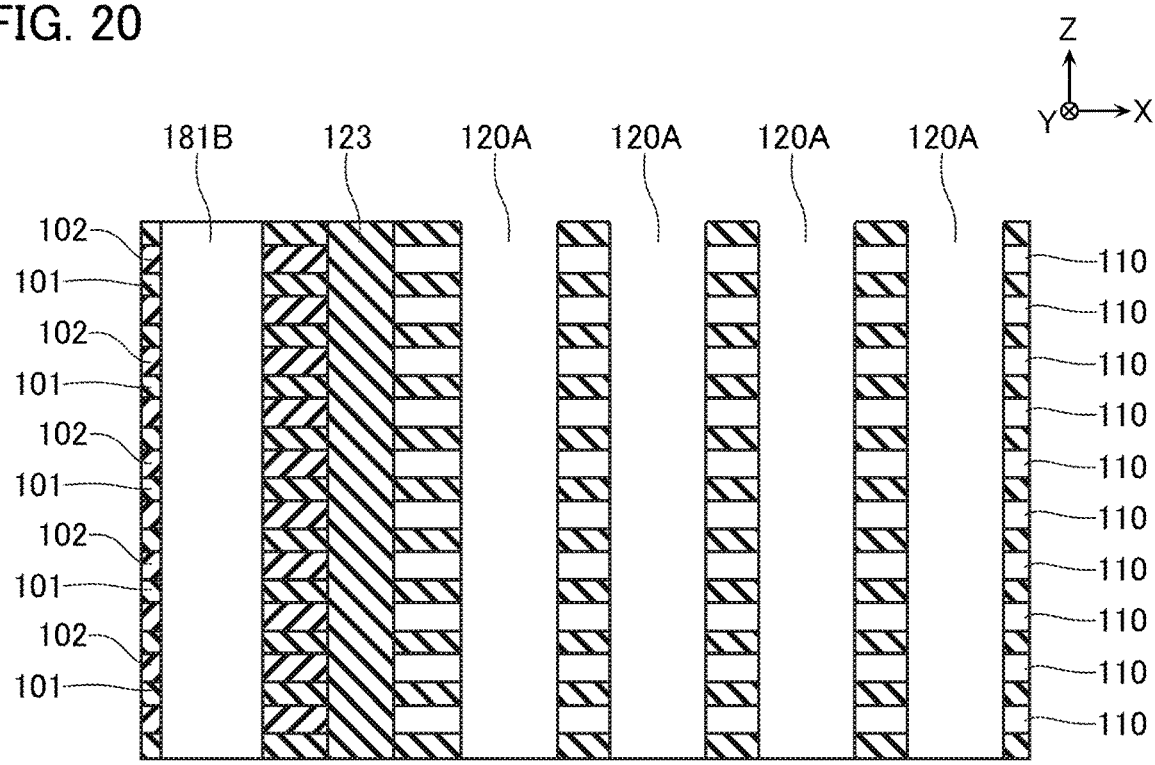
FIG. 20 is a schematic cross-sectional view for describing the manufacturing method.

Next, for example, as illustrated in FIG. 20, a part of the semiconductor layers 110 are formed. In the step, for example, a part of the insulating layers 102 are removed via the openings 120A by a method such as wet etching. A part of the semiconductor layers 110 are formed by a method such as CVD.

Figure 21:
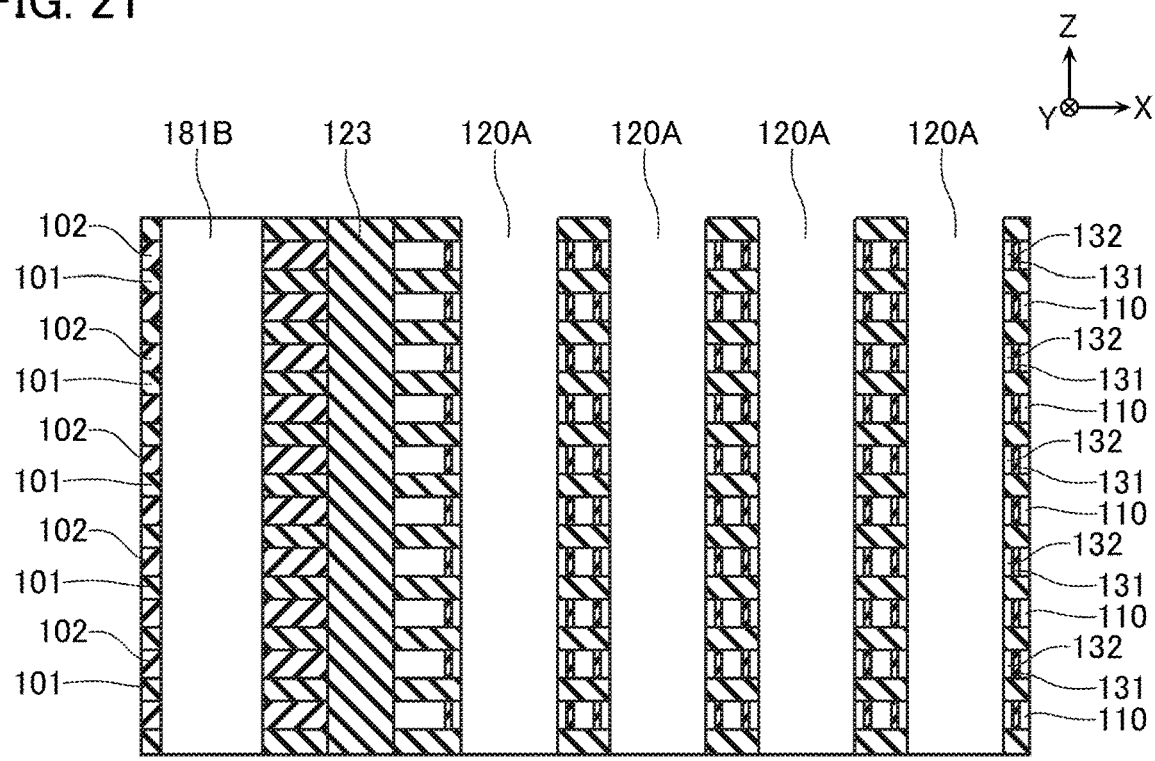
FIG. 21 is a schematic cross-sectional view for describing the manufacturing method.

Next, for example, as illustrated in FIG. 21, the tunnel insulating layers 131 and the electric charge accumulating layers 132 are formed. In the step, for example, the semiconductor layers 110 are partially removed via the openings 120A by a method such as wet etching to partially expose upper surfaces and lower surfaces of the insulating layers 101. The tunnel insulating layers 131 are formed by a method such as an oxidized treatment or CVD. The electric charge accumulating layers 132 are formed by a method such as CVD. A part of the electric charge accumulating layers 132 are removed by a method such as wet etching to separate the electric charge accumulating layer 132 in the Z-direction.

Figure 22:
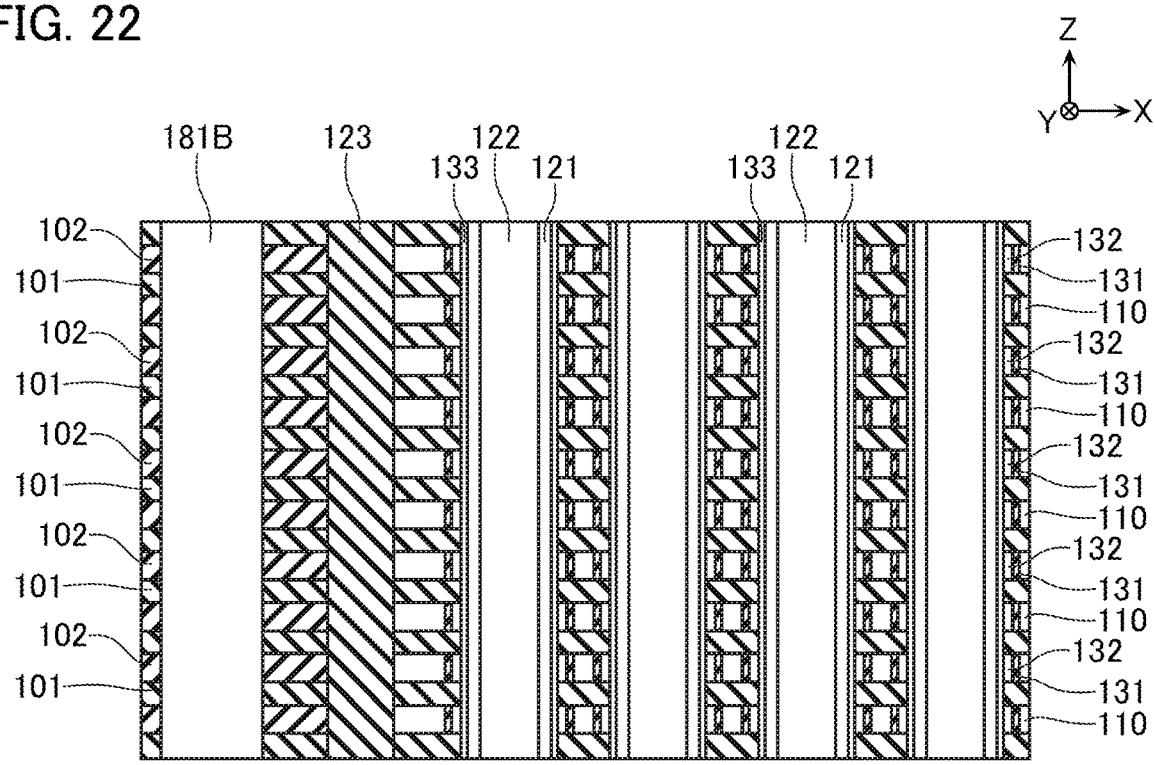
FIG. 22 is a schematic cross-sectional view for describing the manufacturing method.

Next, for example, as illustrated in FIG. 22, the block insulating layers 133, the barrier conductive layers 121, and the conductive layers 122 are formed inside the openings 120A. The step is performed by a method such as CVD.

Figure 23:
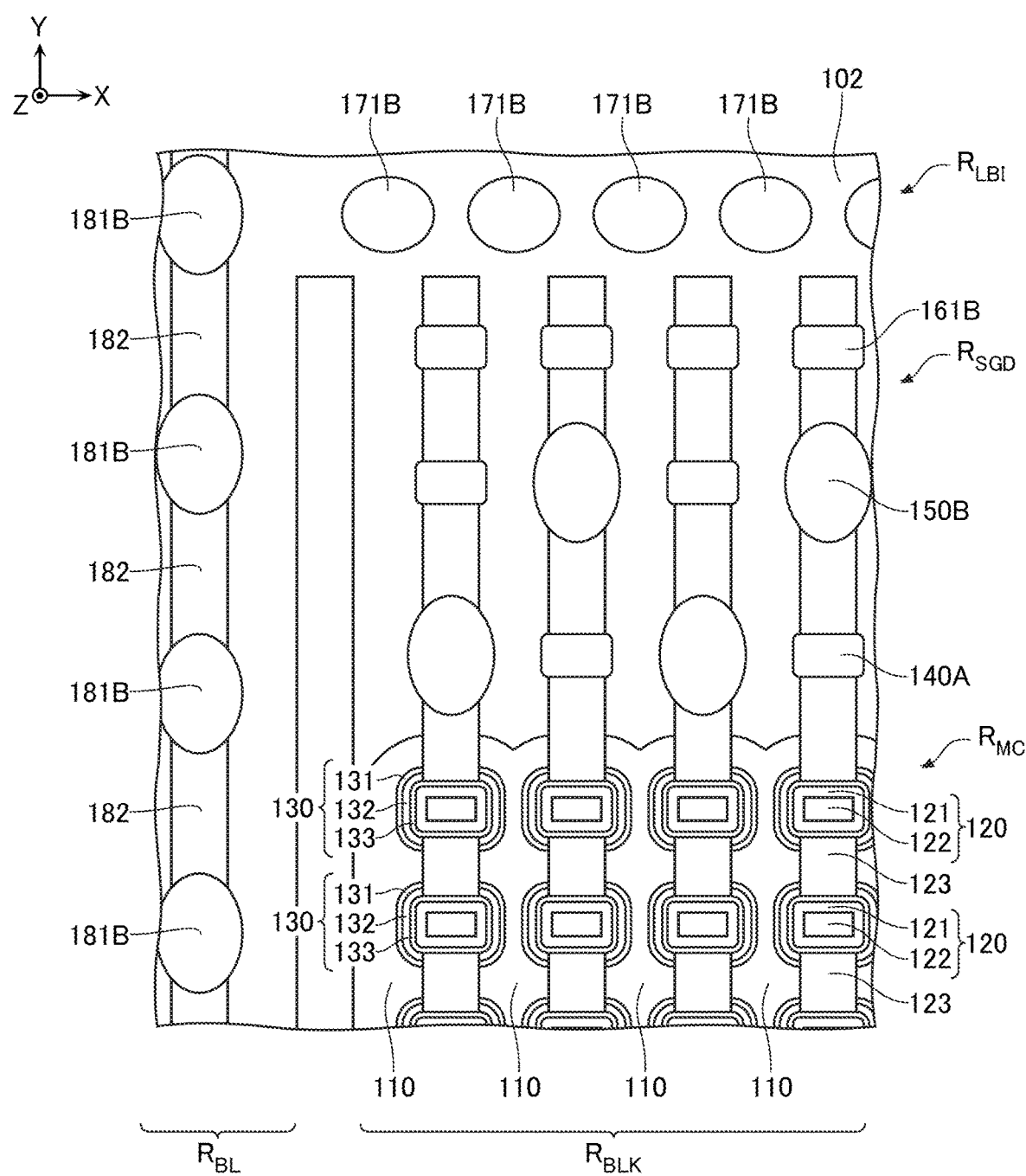
FIG. 23 is a schematic plan view for describing the manufacturing method.

Next, for example, as illustrated in FIG. 23, the sacrifice layers 140B are removed. The step is performed by, for example, wet etching.

Figure 24:
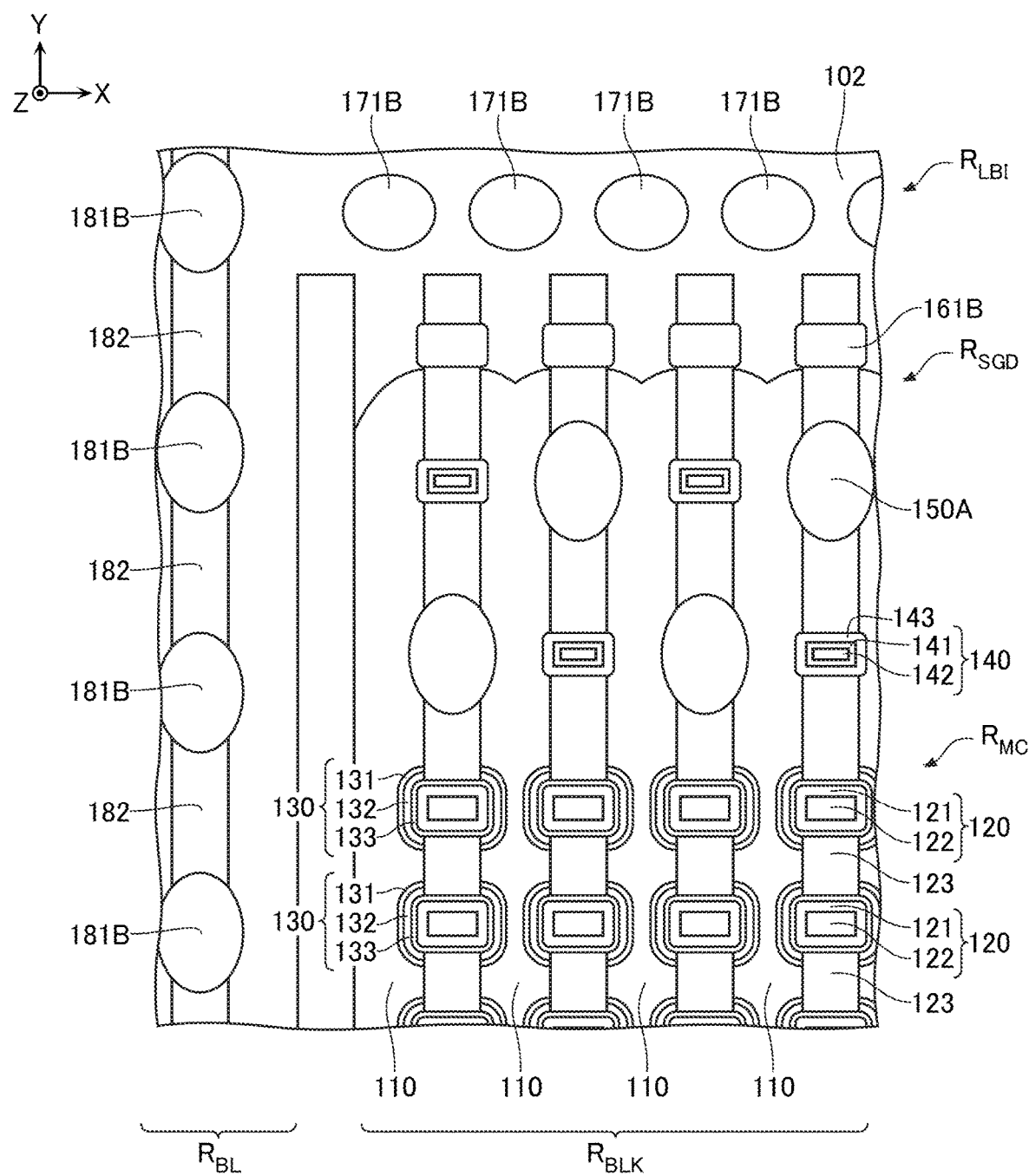
FIG. 24 is a schematic plan view for describing the manufacturing method.

Next, for example, as illustrated in FIG. 24, a part of the semiconductor layers 110 are formed. In the step, for example, a part of the insulating layer 102 is removed via the openings 140A by a method such as wet etching. A part of the semiconductor layers 110 are formed by a method such as CVD.

Next, the semiconductor layer 143, the semiconductor layer 141, and the conductive layer 142 are formed inside the opening 140A. The step is performed by a method such as CVD.

Next, the sacrifice layers 150B are removed. The step is performed by, for example, wet etching.

Figure 25:
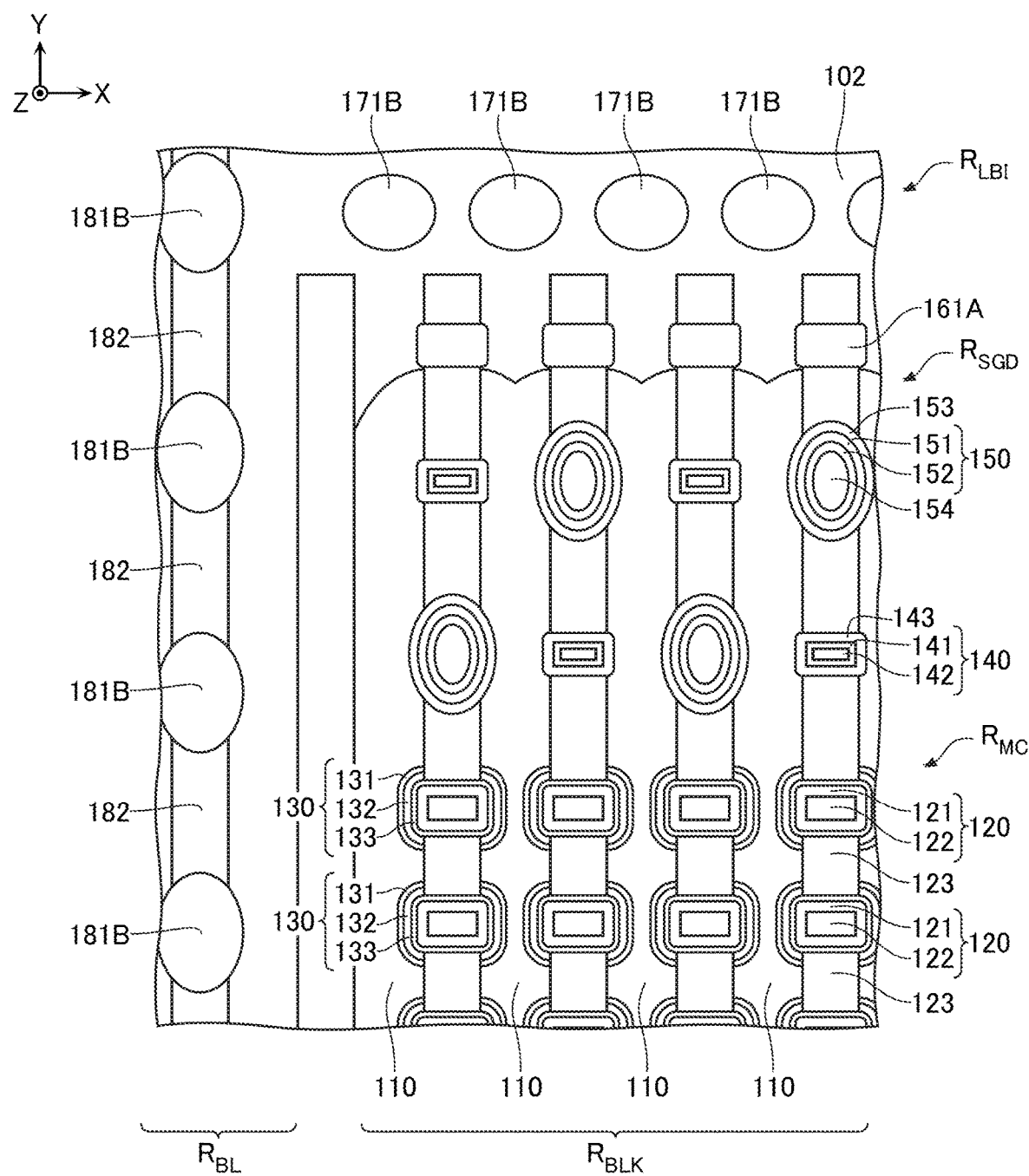
FIG. 25 is a schematic plan view for describing the manufacturing method.

Next, for example, as illustrated in FIG. 25, the insulating layer 153, the semiconductor layer 151, the conductive layer 152, and the insulating layer 154 are formed inside the opening 150A. The step is performed by a method such as CVD.

Next, the sacrifice layers 161B are removed. The step is performed by, for example, wet etching.

Figure 26:
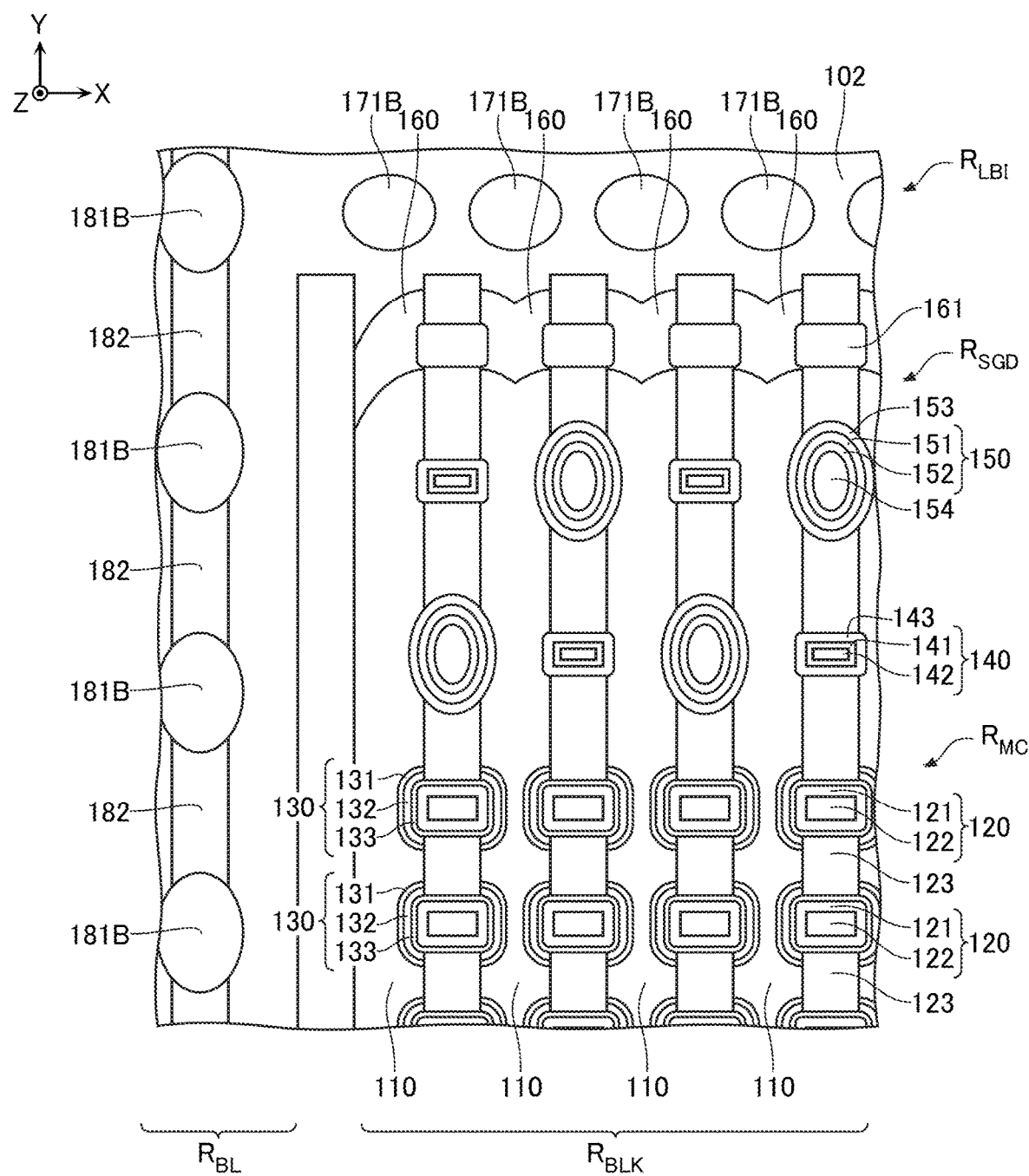
FIG. 26 is a schematic plan view for describing the manufacturing method.

Next, for example, as illustrated in FIG. 26, the semiconductor layers 160 are formed. In the step, for example, a part of the insulating layer 102 is removed via the openings 161A by a method such as wet etching. The semiconductor layers 160 are formed by a method such as CVD.

Next, the insulating layers 161 are formed inside the openings 161A. The step is performed by a method such as CVD.

Figure 27:
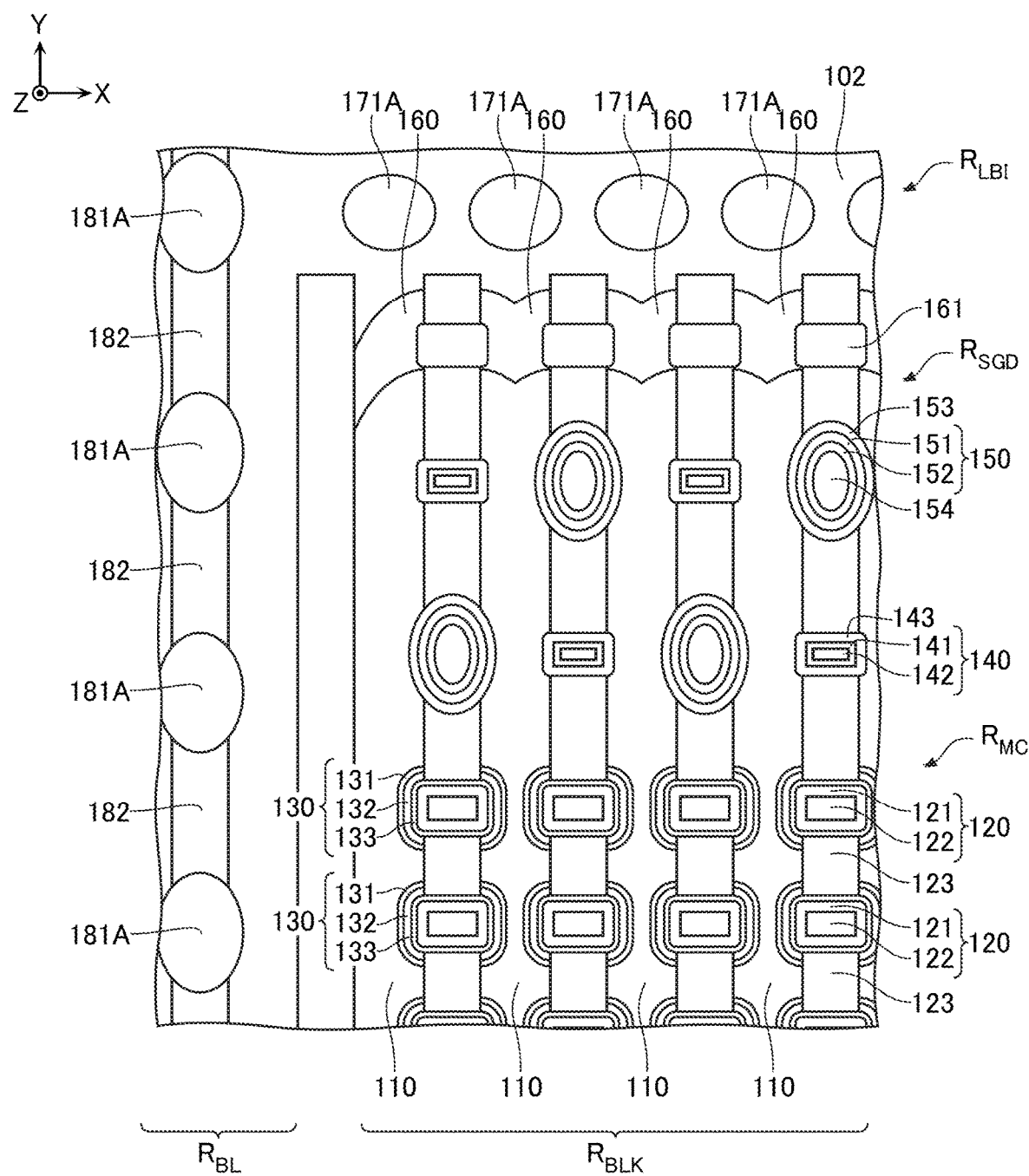
FIG. 27 is a schematic plan view for describing the manufacturing method.
Figure 28:
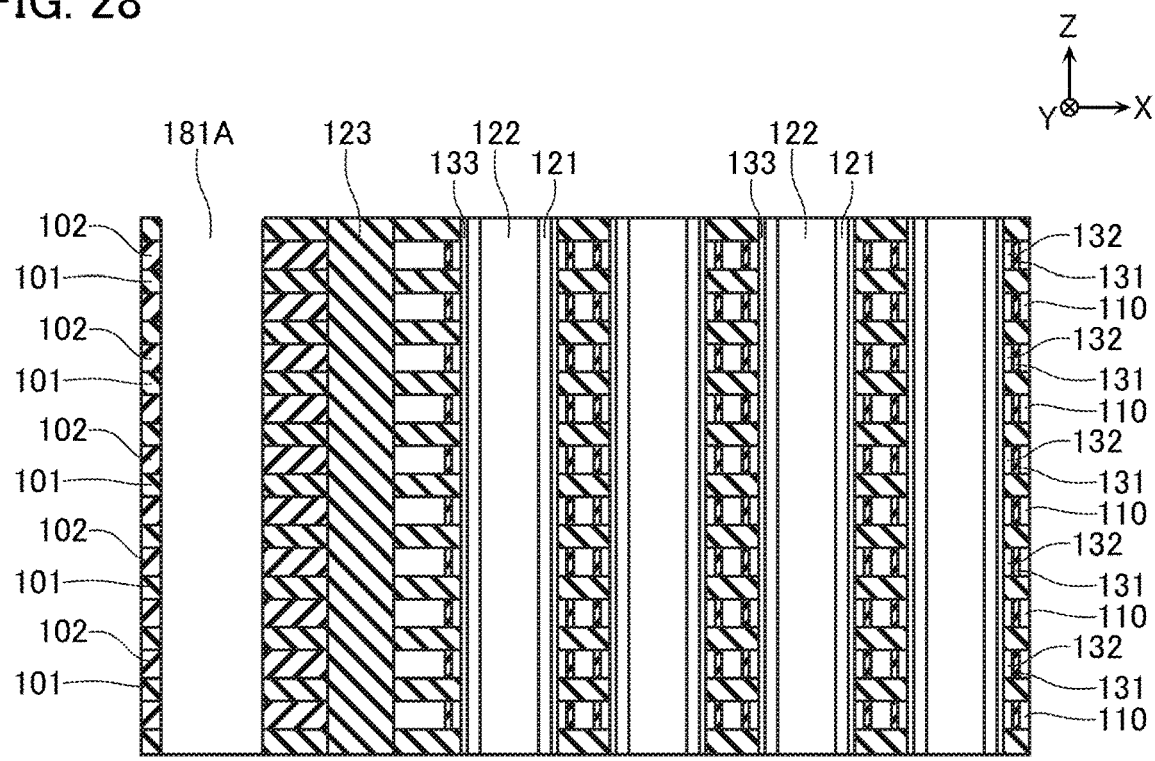
FIG. 28 is a schematic cross-sectional view for describing the manufacturing method.

Next, for example, as illustrated in FIG. 27 and FIG. 28, the sacrifice layers 171B and 181B are removed. Although the illustration is omitted, sacrifice layers are removed at positions corresponding to the insulating layers 191. The step is performed by, for example, wet etching.

Figure 29:
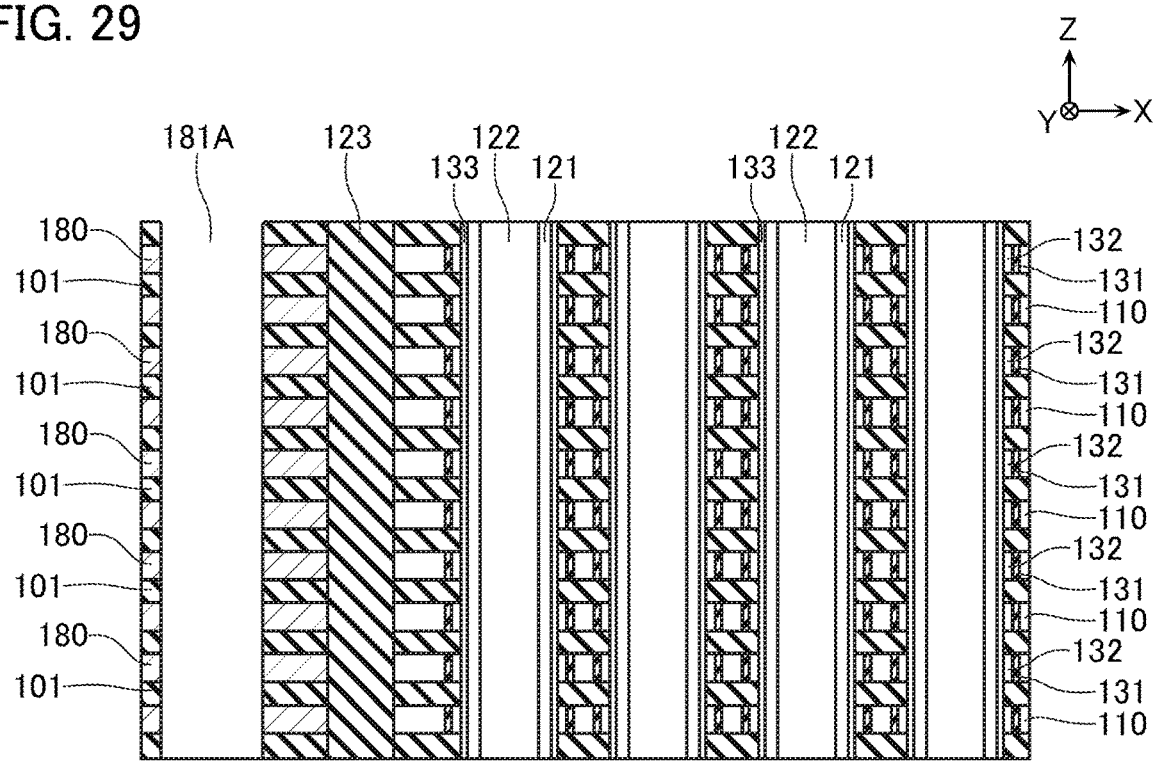
FIG. 29 is a schematic cross-sectional view for describing the manufacturing method.

Next, for example, as illustrated in FIG. 29, the conductive layers 180 are formed. Although the illustration is omitted, the conductive layer 170 (FIG. 3) and the conductive layers 190 (FIG. 5) are formed. In the step, for example, a part of the insulating layers 102 are removed via the openings 171A and 181A and the like by a method such as wet etching. The conductive layers 170, 180, and 190 are formed by a method such as CVD.

Next, for example, as illustrated in FIG. 3 and FIG. 4, the insulating layers 171 and 181 are formed inside the openings 171A and 181A. Although the illustration is omitted, the insulating layers 191 (FIG. 5 and FIG. 6) are formed. The step is performed by a method such as CVD.

Figure 30:
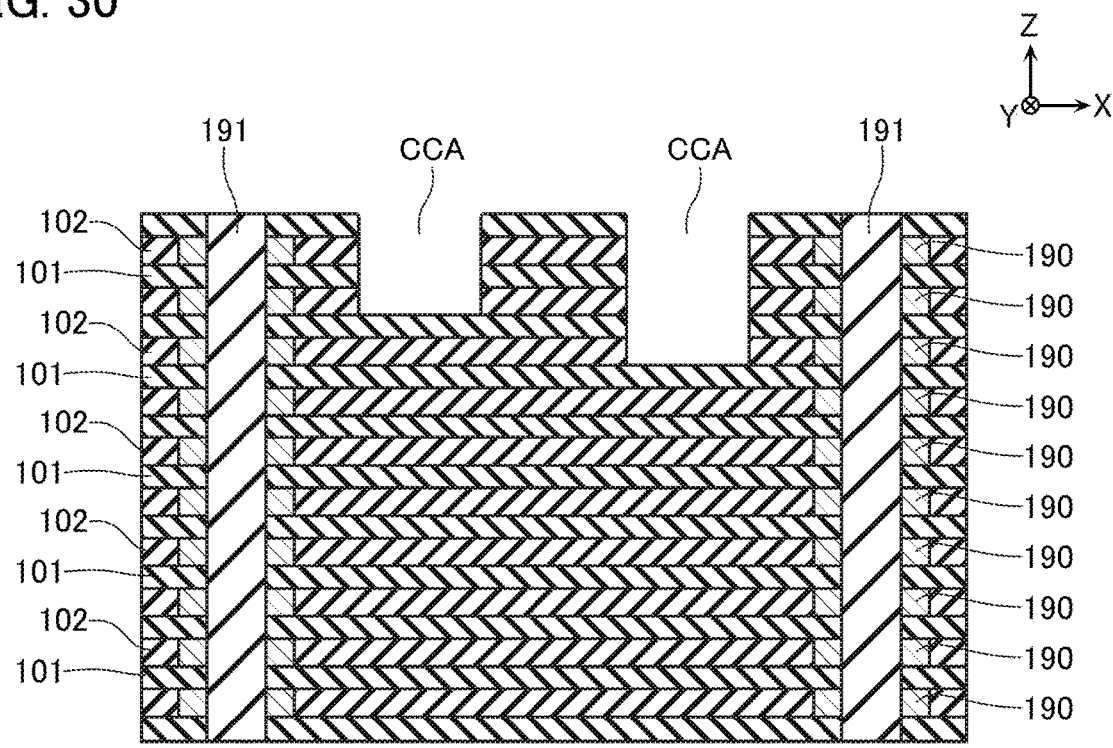
FIG. 30 is a schematic cross-sectional view for describing the manufacturing method.
Figure 31:
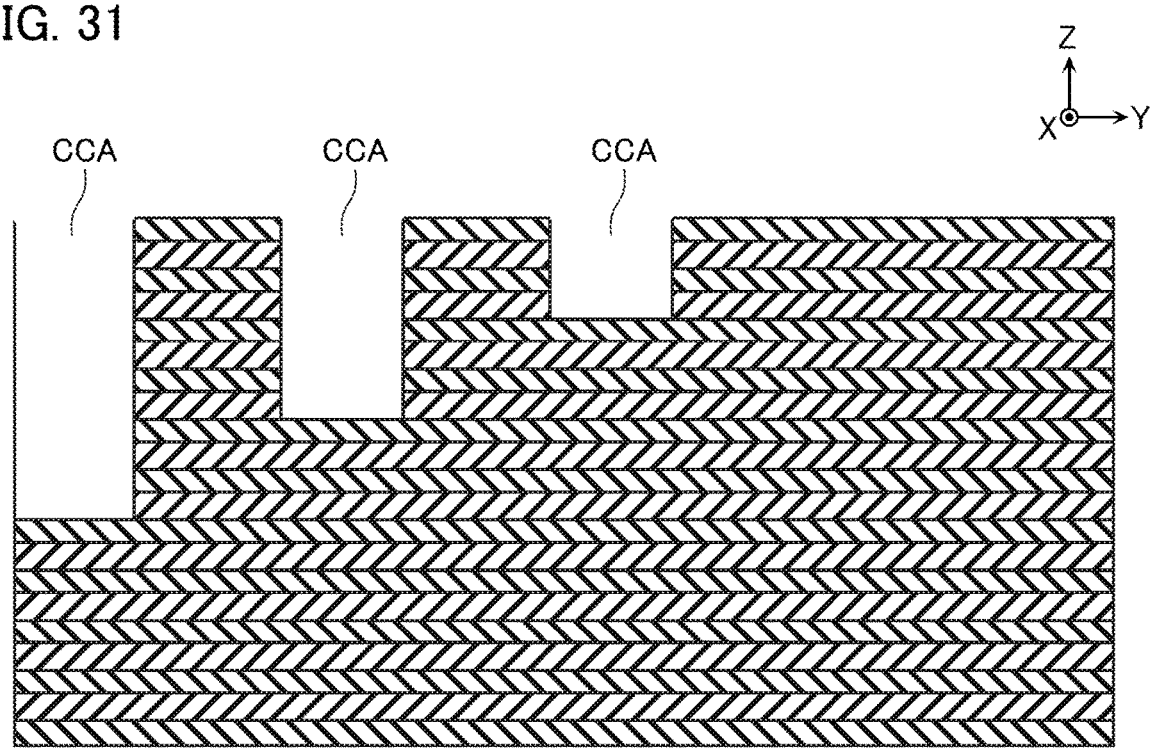
FIG. 31 is a schematic cross-sectional view for describing the manufacturing method.

Next, for example, as illustrated in FIG. 30 and FIG. 31, openings CCA are formed at positions corresponding to the contact electrodes CC. The opening CCA extends in the Z-direction to expose a part of the upper surface of any of the insulating layers 101. In the step, apart of the upper surfaces of all of the insulating layers 101 disposed in the hook-up region $R_{HU}$ may be exposed via a plurality of the openings CCA. The plurality of openings CCA pass through the plurality of insulating layers 101 and 102 and extend in the Z-direction to expose the side surfaces of the insulating layers 101 and 102.

Figure 32:
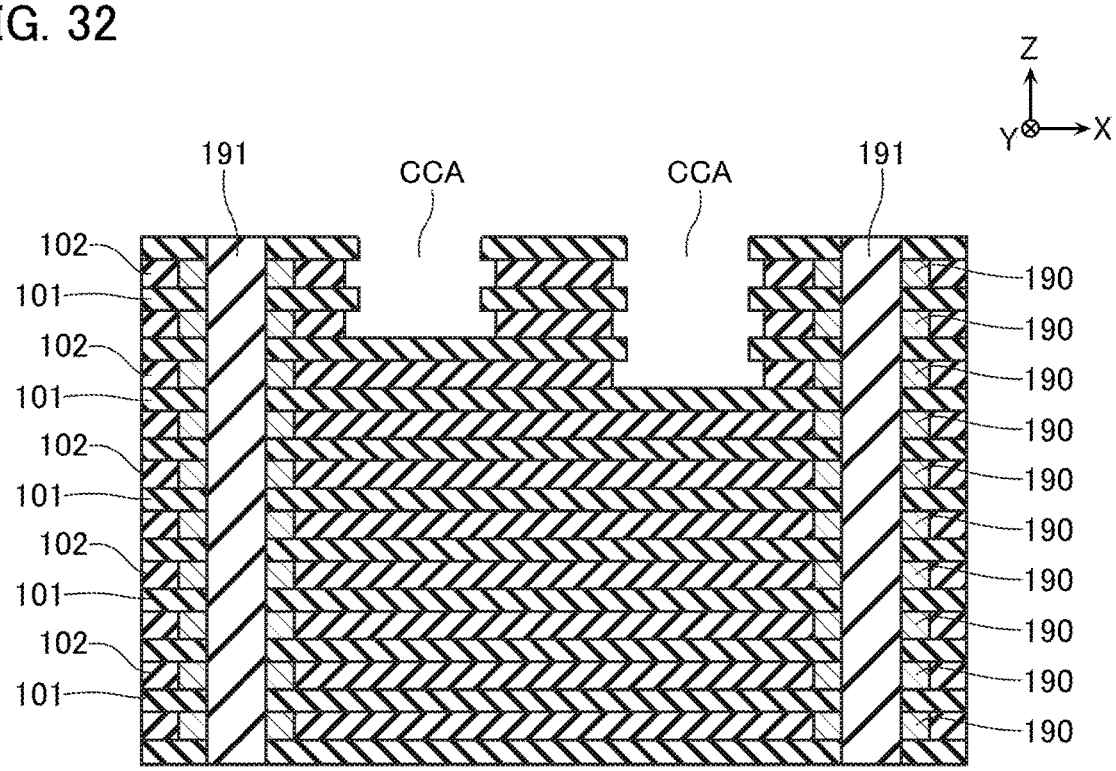
FIG. 32 is a schematic cross-sectional view for describing the manufacturing method.
Figure 33:
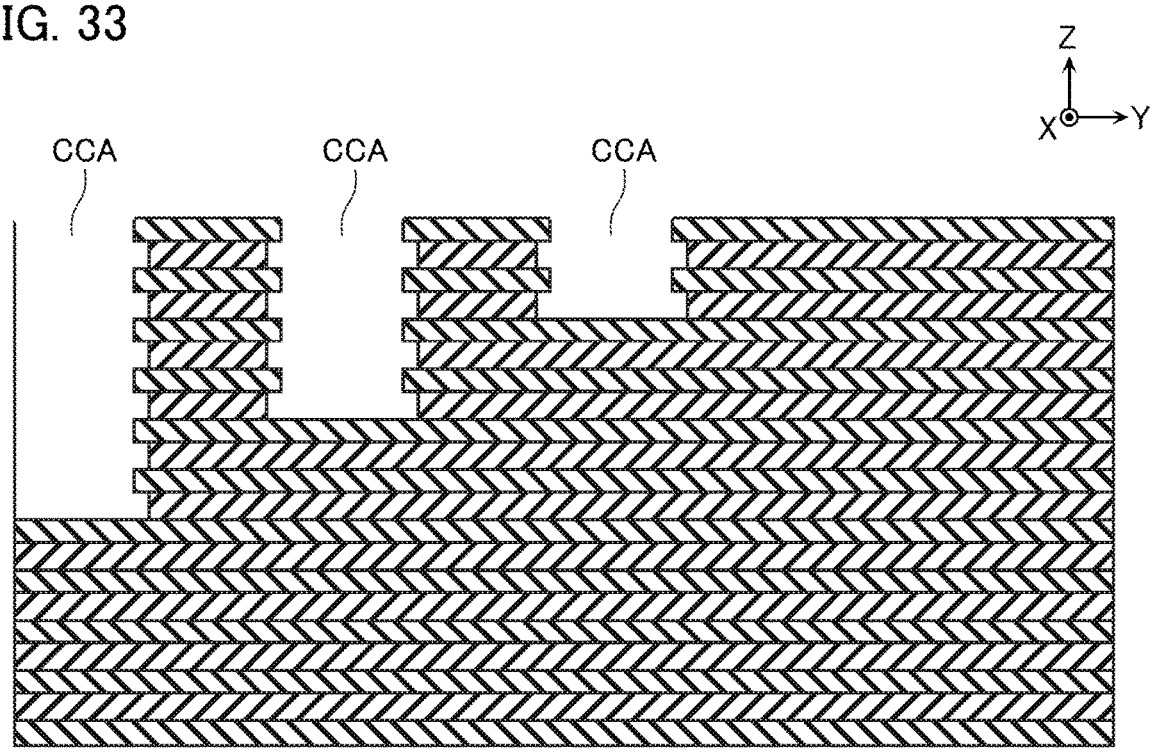
FIG. 33 is a schematic cross-sectional view for describing the manufacturing method.

Next, for example, as illustrated in FIG. 32 and FIG. 33, apart of the insulating layers 102 are removed via the openings CCA. The step is performed by a method such as wet etching.

Figure 34:
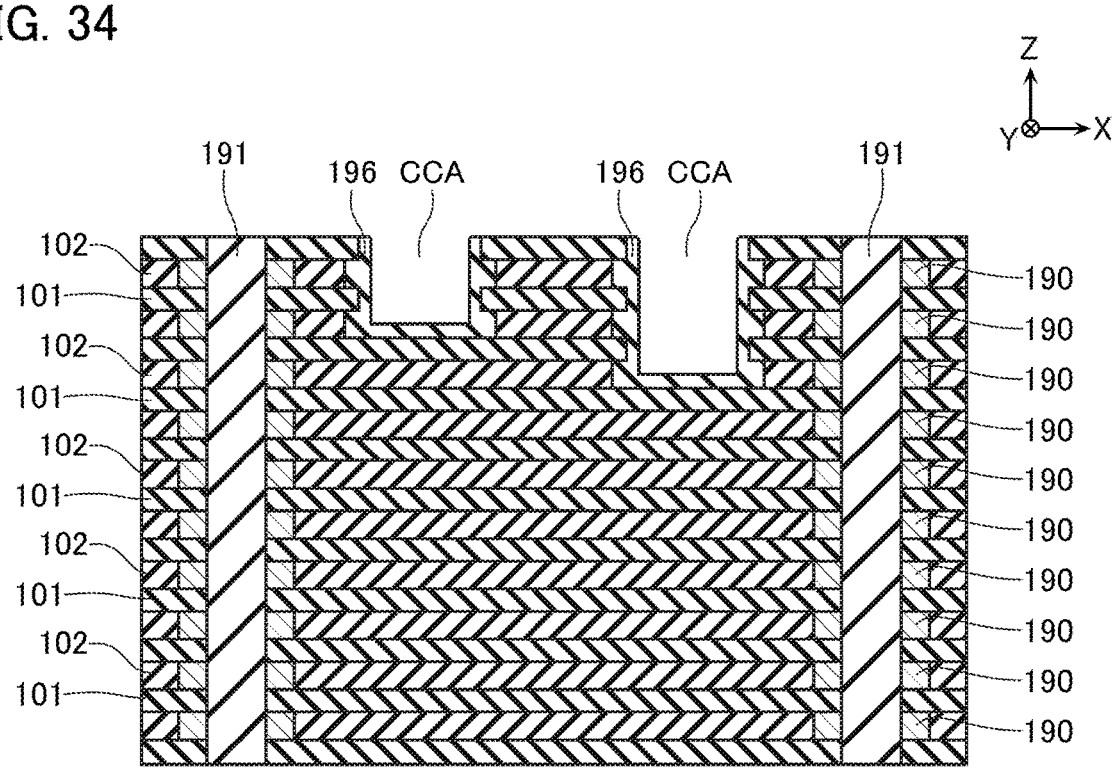
FIG. 34 is a schematic cross-sectional view for describing the manufacturing method.
Figure 35:
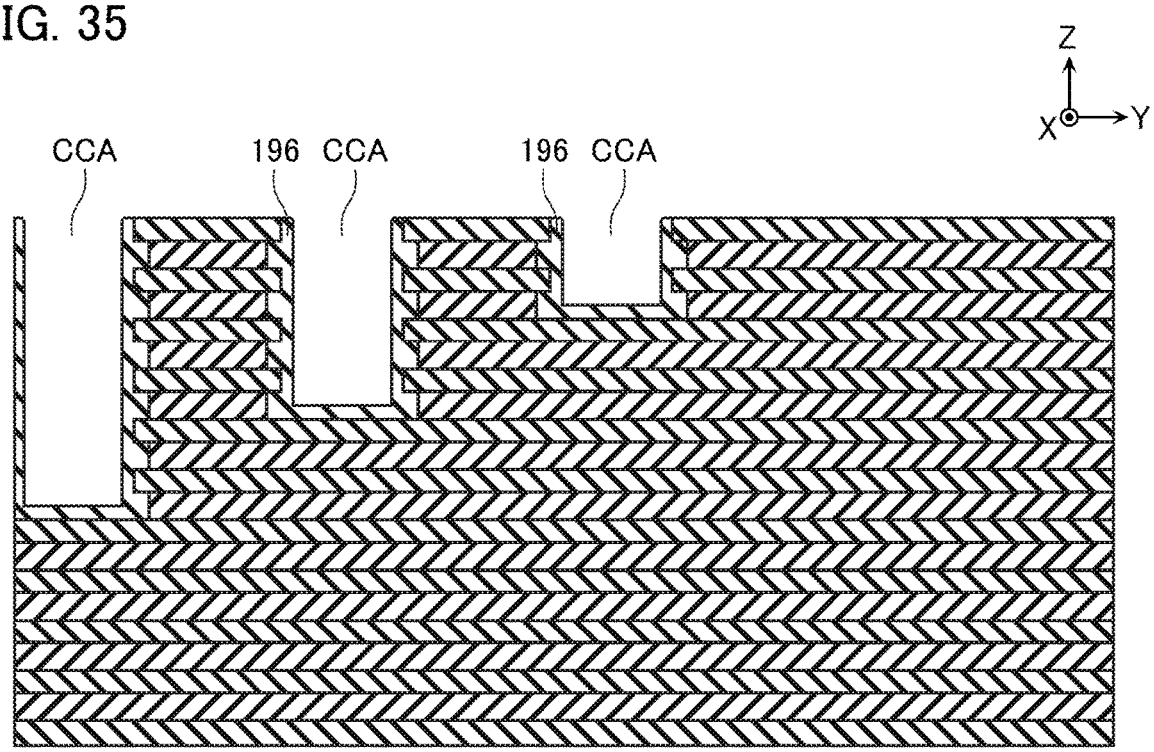
FIG. 35 is a schematic cross-sectional view for describing the manufacturing method.

Next, for example, as illustrated in FIG. 34 and FIG. 35, the insulating layers 196 are formed via the openings CCA. The step is performed by a method such as CVD.

Figure 36:
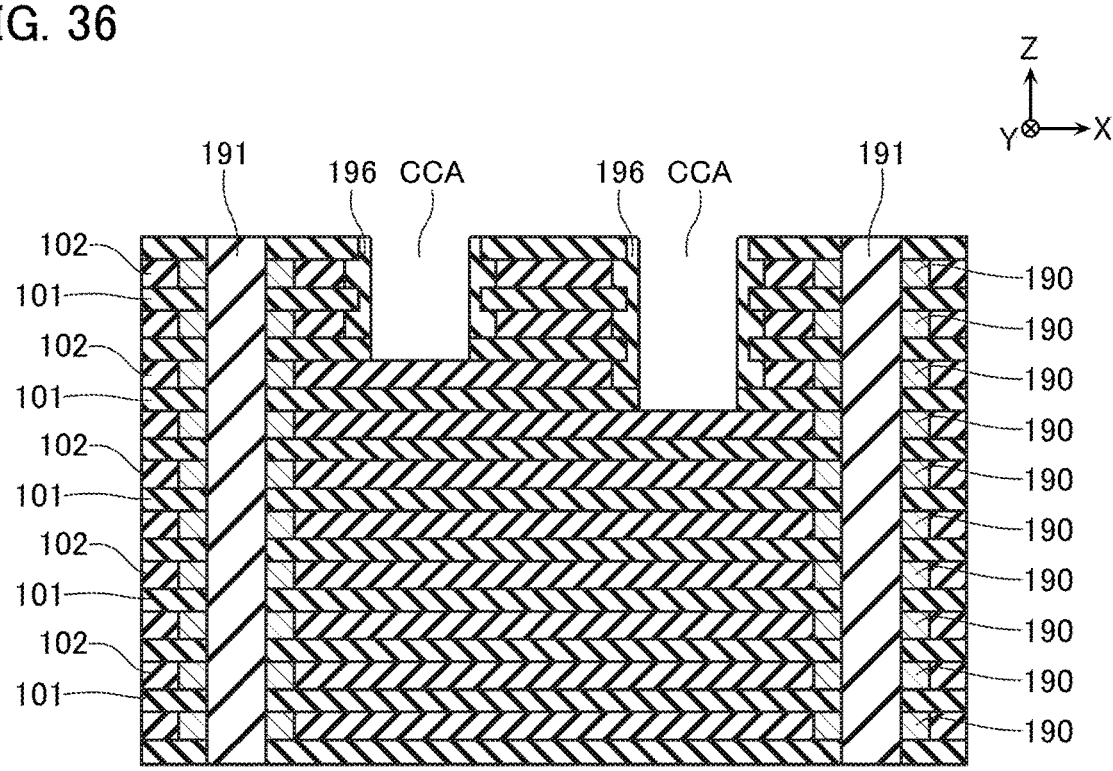
FIG. 36 is a schematic cross-sectional view for describing the manufacturing method.
Figure 37:
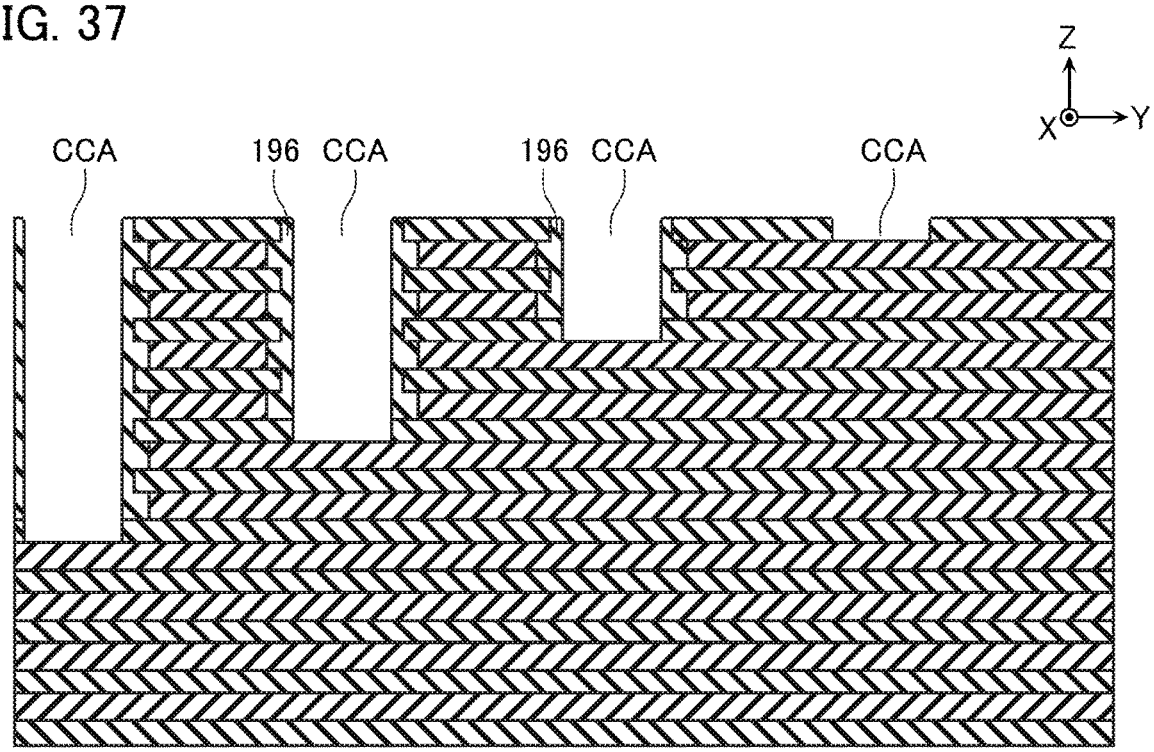
FIG. 37 is a schematic cross-sectional view for describing the manufacturing method.

Next, for example, as illustrated in FIG. 36 and FIG. 37, a part of the insulating layers 196 and a part of the insulating layers 101 are removed via the openings CCA to expose the upper surfaces of the insulating layers 102. The step is performed by a method such as RIE.

Figure 38:
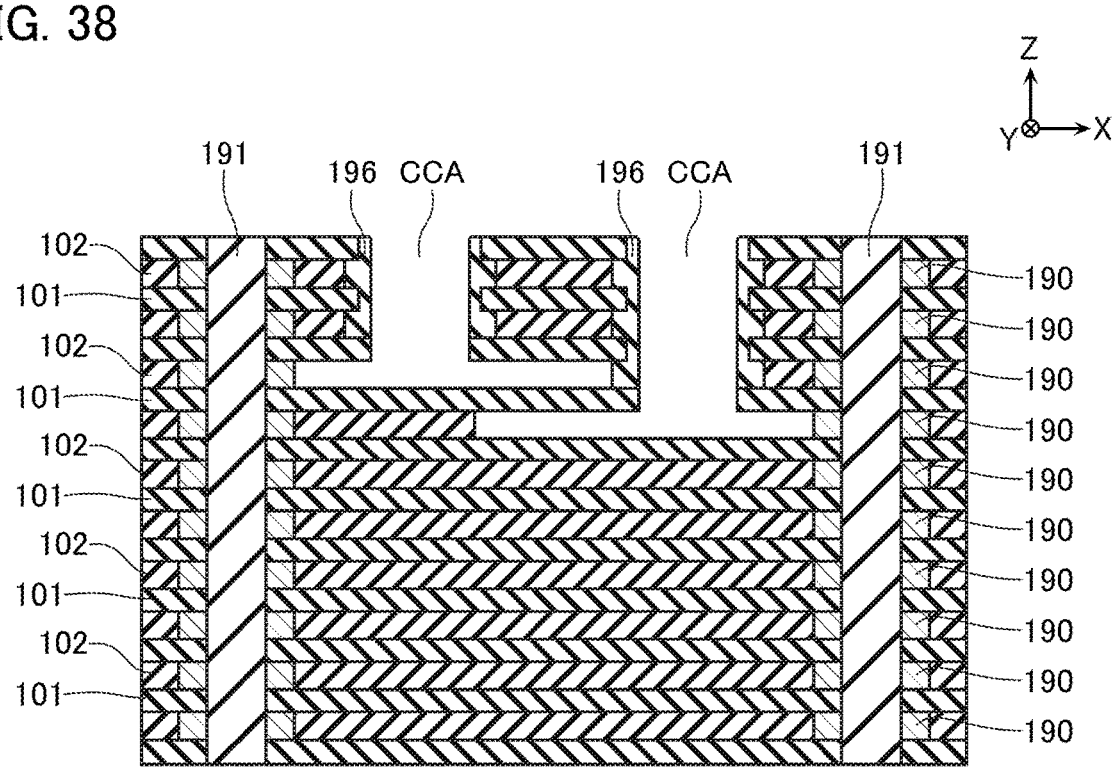
FIG. 38 is a schematic cross-sectional view for describing the manufacturing method.
Figure 39:
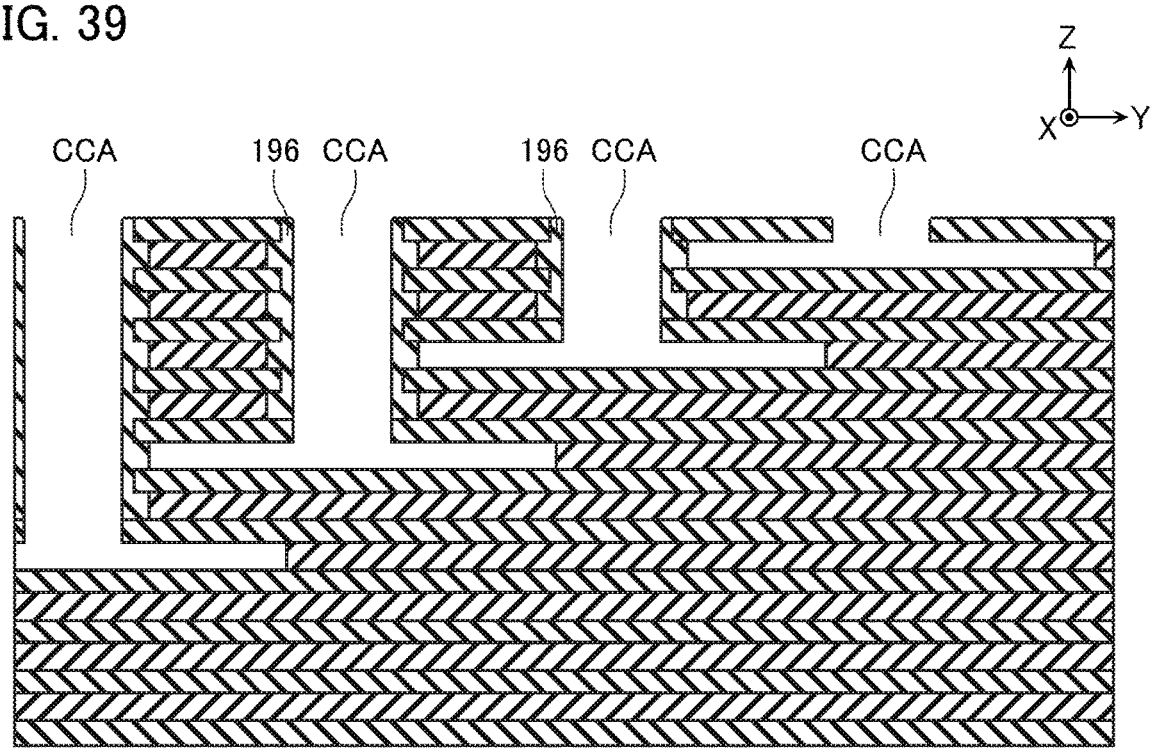
FIG. 39 is a schematic cross-sectional view for describing the manufacturing method.

Next, for example, as illustrated in FIG. 38 and FIG. 39, apart of the insulating layers 102 are removed via the openings CCA. The step is performed by a method such as wet etching. In the step, for example, the insulating layers 102 are removed until the side surfaces in the X-direction of the conductive layers 190 are exposed to inside the openings CCA.

Next, for example, as illustrated in FIG. 5 to FIG. 7, the contact electrodes CC are formed inside the openings CCA. The step is performed by a method such as CVD.

Second Embodiment

[Configuration]

Figure 40:
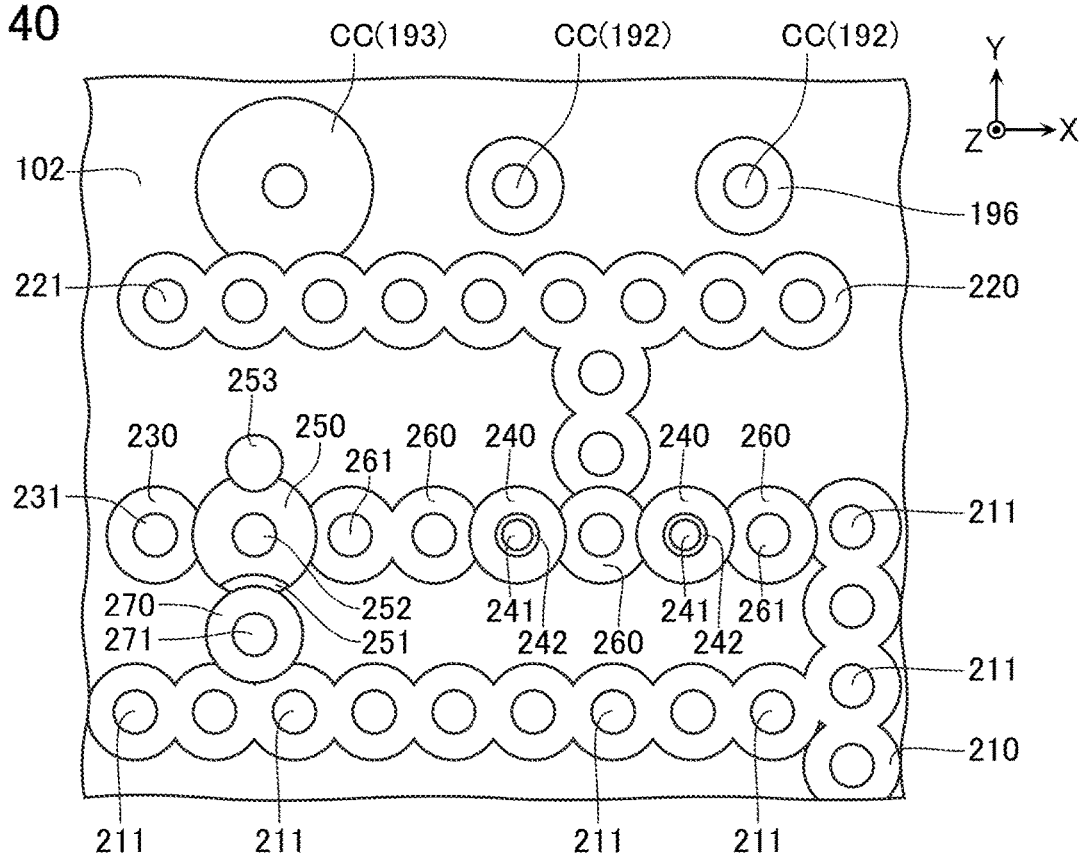
FIG. 40 is a schematic plan view illustrating a configuration of a part of a semiconductor memory device according to a second embodiment.
Figure 41:
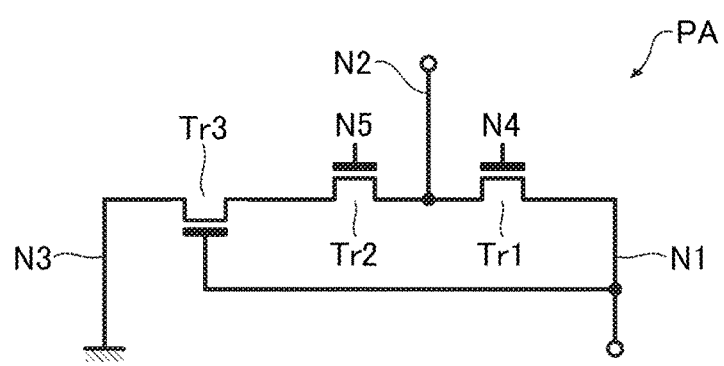
FIG. 41 is a schematic circuit diagram illustrating a configuration of a part of the semiconductor memory device.
Figure 42:
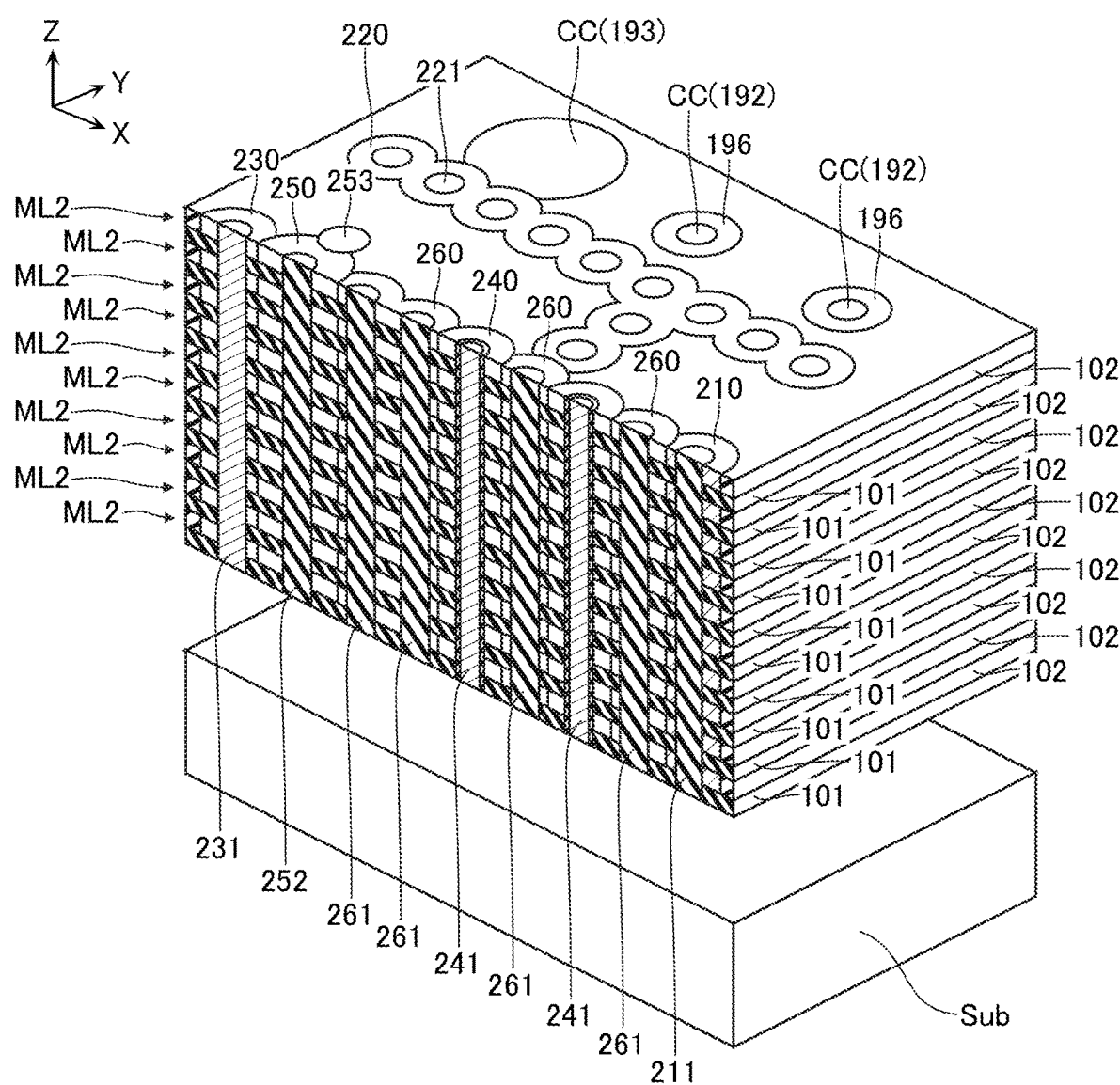
FIG. 42 is a schematic perspective view illustrating a configuration of a part of the semiconductor memory device.

FIG. 40 is a schematic plan view illustrating a configuration of a part of a semiconductor memory device according to the second embodiment. FIG. 41 is a schematic circuit diagram illustrating a configuration of a part of the semiconductor memory device. FIG. 42 is a schematic perspective view illustrating a configuration of a part of the semiconductor memory device.

In the following description, same reference numerals are given to configurations similar to those of the first embodiment, and the description thereof will be omitted.

The semiconductor memory device according to the second embodiment is configured basically similarly to the semiconductor memory device according to the first embodiment. However, the semiconductor memory device according to the second embodiment includes memory layers ML2 (FIG. 42) instead of the memory layers ML. The memory layers ML2 are configured basically similarly to the memory layers ML. However, the structure of the memory layers ML2 in a hook-up region differs from the structure of the memory layers ML in the hook-up region $R_{HU}$.

In the hook-up region, the memory layer ML2 includes a pre-amplifier circuit PA (a signal amplifier circuit) illustrated in FIG. 41 as an example.

Next, a circuit configuration of the pre-amplifier circuit PA will be described.

The pre-amplifier circuit PA includes nodes N1 to N5. The node N1 electrically conducts with the conductive layers 180 (the bit lines BL), which have been described with reference to FIG. 2 to FIG. 4. The node N2 electrically conducts with the contact electrodes CC, which have been described with reference to FIG. 5 to FIG. 7. The node N3 electrically conducts with a voltage supply line to which a ground voltage is supplied. The nodes N4 and N5 are each connected to a sequencer (not illustrated).

The pre-amplifier circuit PA includes a transistor Tr1, which is connected between the nodes N1 and N2, and transistors Tr2 and Tr3, which are connected in series between the nodes N2 and N3. The transistors Tr1 to Tr3 are, for example, N channel type field effect transistors.

A source electrode of the transistor Tr1 is connected to the node N2. A drain electrode of the transistor Tr1 is connected to the node N1. A gate electrode of the transistor Tr1 is connected to the node N4.

A source electrode of the transistor Tr2 is connected to a drain electrode of the transistor Tr3. A drain electrode of the transistor Tr2 is connected to the node N2. A gate electrode of the transistor Tr2 is connected to the node N5.

A source electrode of the transistor Tr3 is connected to the node N3. A drain electrode of the transistor Tr3 is connected to the source electrode of the transistor Tr2. A gate electrode of the transistor Tr3 is connected to the node N1.

Next, an operation of the pre-amplifier circuit PA will be briefly described.

For example, in the read operation of the semiconductor memory device, first, signals of "H, L" are supplied to the nodes N4 and N5. Thus, the transistor Tr1 is set to an ON state and the transistor Tr2 is set to an OFF state. In the state, the bit lines BL (FIG. 1) are charged via the nodes N1 and N2.

Next, signals of "L, L" are supplied to the nodes N4 and N5. Thus, the transistors Tr1 and Tr2 are set to an OFF state. In the state, a read voltage is supplied to the predetermined conductive layer 120 (FIG. 2 to FIG. 4). Thus, the selected memory cell connected to the conductive layer 120 enters an ON state or an OFF state according to the stored data. Read pass voltages larger than the read voltage are supplied to the plurality of conductive layers 120 (FIG. 2 to FIG. 4). Thus, the selected memory cell electrically conducts with the bit line BL (FIG. 1) and a source line SL (not illustrated). Accordingly, electric charge of the bit line connected to the selected memory cell in the ON state is discharged. In association with this, the transistor Tr3 (FIG. 41) enters the OFF state. On the other hand, electric charge of the bit line connected to the selected memory cell in the OFF state is maintained. In this case, the transistor Tr3 (FIG. 41) is maintained in the ON state.

Next, signals "L, H" are supplied to the nodes N4 and N5. Thus, the transistor Tr1 is set to the OFF state, and the transistor Tr2 is set to the ON state. In this case, a current does not flow through the contact electrode CC corresponding to the selected memory cell in the ON state. On the other hand, a current flows the contact electrode CC corresponding to the selected memory cell in the OFF state. Therefore, detecting the current allows detecting the data stored in the selected memory cell.

In the configuration, to discharge the bit line BL (FIG. 1) that electrically conducts with the node N1, the bit line BL is electrically separated from the contact electrode CC. Accordingly, the bit line BL can be discharged at a comparatively high speed.

Next, a configuration of the pre-amplifier circuit PA will be described in more detail.

In the hook-up region, for example, as illustrated in FIG. 40, the memory layer ML2 includes a conductive layer 210. The hook-up region includes a plurality of insulating layers 211 arranged along the conductive layer 210.

The conductive layer 210 functions as the node N1, which has been described with reference to FIG. 41. The conductive layer 210 may include, for example, a barrier conductive layer of, for example, titanium nitride (TiN), and a conductive layer of, for example, tungsten (W).

The insulating layer 211 may contain, for example, silicon oxide ($SiO_2$). For example, as illustrated in FIG. 42, the insulating layer 211 passes through the plurality of memory layers ML2 and extends in the Z-direction.

In the hook-up region, the memory layer ML2 includes a conductive layer 220. The hook-up region includes a plurality of insulating layers 221 arranged along the conductive layer 220.

The conductive layer 220 functions as the node N2, which has been described with reference to FIG. 41. The conductive layer 220 may include a barrier conductive layer of, for example, titanium nitride (TiN) and a conductive layer of, for example, tungsten (W).

The insulating layer 221 may contain, for example, silicon oxide ($SiO_2$). The insulating layer 221 passes through the plurality of memory layers ML2 and extends in the Z-direction.

In the hook-up region, the memory layer ML2 includes a semiconductor layer 230. The hook-up region includes a conductive layer 231 connected to the semiconductor layer 230.

The semiconductor layer 230 functions as a source region of the transistor Tr3, which has been described with reference to FIG. 41. The semiconductor layer 230 may contain, for example, polycrystalline silicon (Si) containing N-type impurities, such as phosphorus (P).

The conductive layer 231 functions as the node N3, which has been described with reference to FIG. 41. The conductive layer 231 may include a barrier conductive layer of, for example, titanium nitride (TiN) and a conductive layer of, for example, tungsten (W). For example, as illustrated in FIG. 42, the conductive layer 231 passes through the plurality of memory layers ML2 and extends in the Z-direction.

In the hook-up region, the memory layer ML2 includes a plurality of semiconductor layers 240. The hook-up region includes a plurality of conductive layers 241 disposed corresponding to a plurality of semiconductor layers 240 and insulating layers 242 that cover outer peripheral surfaces of the plurality of conductive layers 241.

The semiconductor layers 240 function as channel regions of the transistors Tr1 and Tr2, which have been described with reference to FIG. 41. The semiconductor layer 240 may contain, for example, polycrystalline silicon (Si) containing P-type impurities, such as boron (B).

The conductive layers 241 function as gate electrodes of the transistors Tr1 and Tr2, which have been described with reference to FIG. 41. The conductive layer 241 functions as the node N4 or the node N5, which has been described with reference to FIG. 41. The conductive layer 241 may include a barrier conductive layer of, for example, titanium nitride (TiN) and a conductive layer of, for example, tungsten (W).

The insulating layers 242 function as gate insulating films of the transistors Tr1 and Tr2, which have been described with reference to FIG. 41. The insulating layer 242 may contain, for example, silicon oxide ($SiO_2$). For example, as illustrated in FIG. 42, the conductive layer 241 and the insulating layer 242 pass through the plurality of memory layers ML2 and extend in the Z-direction.

In the hook-up region, the memory layer ML2 includes a semiconductor layer 250 connected to a part of an outer peripheral surface of the semiconductor layer 230 and an insulating layer 251 connected to apart of an outer peripheral surface of the semiconductor layer 250. The hook-up region includes an insulating layer 252 connected to the semiconductor layer 250 and a semiconductor layer 253 connected to a part of the outer peripheral surface of the semiconductor layer 250.

The semiconductor layer 250 functions as a channel region of the transistor Tr3, which has been described with reference to FIG. 41. The semiconductor layer 250 may contain, for example, polycrystalline silicon (Si) containing P-type impurities, such as boron (B).

The insulating layer 251 functions as a gate insulating film of the transistor Tr3, which has been described with reference to FIG. 41. The insulating layer 251 may contain, for example, silicon oxide ($SiO_2$).

The insulating layer 252 may contain, for example, silicon oxide ($SiO_2$). For example, as illustrated in FIG. 42, the insulating layer 252 passes through the plurality of memory layers ML2 and extends in the Z-direction.

The semiconductor layer 253 reduces a leak current in the transistor Tr3 configured of the semiconductor layer 250 and the like. The semiconductor layer 253 may function as a body contact that controls an electric potential of the semiconductor layer 250 in the transistor Tr3. The semiconductor layer 253 may contain, for example, polycrystalline silicon (Si) containing P-type impurities, such as boron (B). A concentration of the impurities contained in the semiconductor layer 253 is larger than a concentration of the impurities contained in the semiconductor layer 250. The semiconductor layer 253 passes through the plurality of memory layers ML2 and extends in the Z-direction.

In the hook-up region, the memory layer ML2 includes a plurality of semiconductor layers 260. The hook-up region includes a plurality of insulating layers 261 connected to the plurality of semiconductor layers 260.

A part of the plurality of semiconductor layers 260 is connected to the conductive layer 210 and the semiconductor layer 240. The semiconductor layer 260 functions as a drain region of the transistor Tr1, which has been described with reference to FIG. 41. Apart of the plurality of semiconductor layers 260 is connected to the two semiconductor layers 240 and the conductive layer 220. The semiconductor layers 260 function as a source region of the transistor Tr1, which has described with reference to FIG. 41, and a drain region of the transistor Tr2, which has described with reference to FIG. 41. A part of the plurality of semiconductor layers 260 are connected to the semiconductor layer 240 and the semiconductor layer 250. The semiconductor layers 260 function as a source region of the transistor Tr2, which has described with reference to FIG. 41, and a drain region of the transistor Tr3, which has been described with reference to FIG. 41. The semiconductor layer 260 may contain, for example, polycrystalline silicon (Si) containing N-type impurities, such as phosphorus (P).

The insulating layer 261 may contain, for example, silicon oxide ($SiO_2$). The insulating layer 261 passes through the plurality of memory layers ML2 and extends in the Z-direction.

In the hook-up region, the memory layer ML2 includes a semiconductor layer 270. The semiconductor layer 270 is opposed to the semiconductor layer 250 via the insulating layer 251 and connected to the conductive layer 210. In the hook-up region, an insulating layer 271 connected to the semiconductor layer 270 is disposed.

The semiconductor layer 270 functions as the gate electrode of the transistor Tr3, which has been described with reference to FIG. 41. The semiconductor layer 270 may contain, for example, polycrystalline silicon (Si) containing N-type impurities, such as phosphorus (P).

The insulating layer 271 may contain, for example, silicon oxide ($SiO_2$). The insulating layer 271 passes through the plurality of memory layers ML2 and extends in the Z-direction.

[Manufacturing Method]

FIG. 43 to FIG. 72 are schematic cross-sectional views or plan views for describing the manufacturing method of the semiconductor memory device according to the second embodiment. FIG. 43, FIG. 45, FIG. 47, FIG. 51, FIG. 55, FIG. 59, and FIG. 63 to FIG. 69 illustrate plan views corresponding to FIG. 40. FIG. 44, FIG. 46, FIG. 48 to FIG. 50, FIG. 52 to FIG. 54, FIG. 56 to FIG. 58, FIG. 60 to FIG. 62, and FIG. 70 to FIG. 72 correspond to a cross-sectional surface illustrated in a part of FIG. 42.

The semiconductor memory device according to the second embodiment is manufactured basically similarly to the semiconductor memory device according to the first embodiment.

Figure 43:
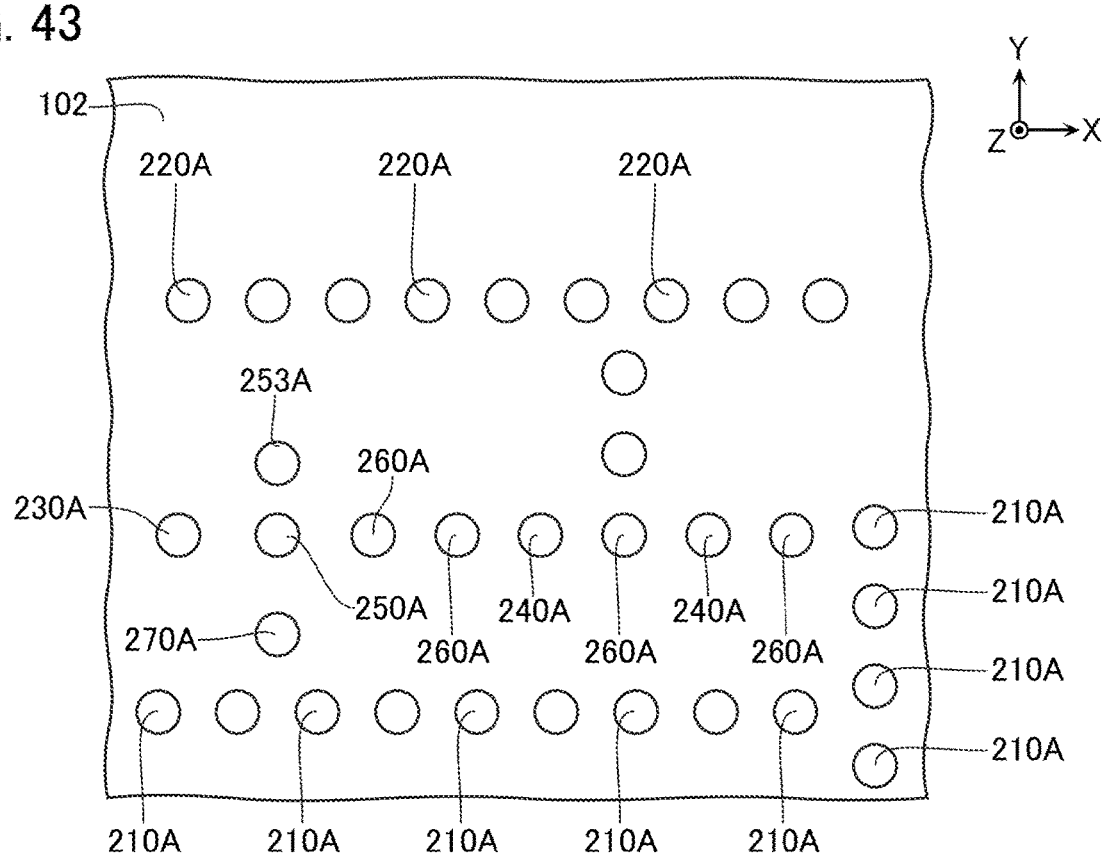
FIG. 43 is a schematic plan view for describing a manufacturing method of the semiconductor memory device according to the second embodiment.
Figure 44:
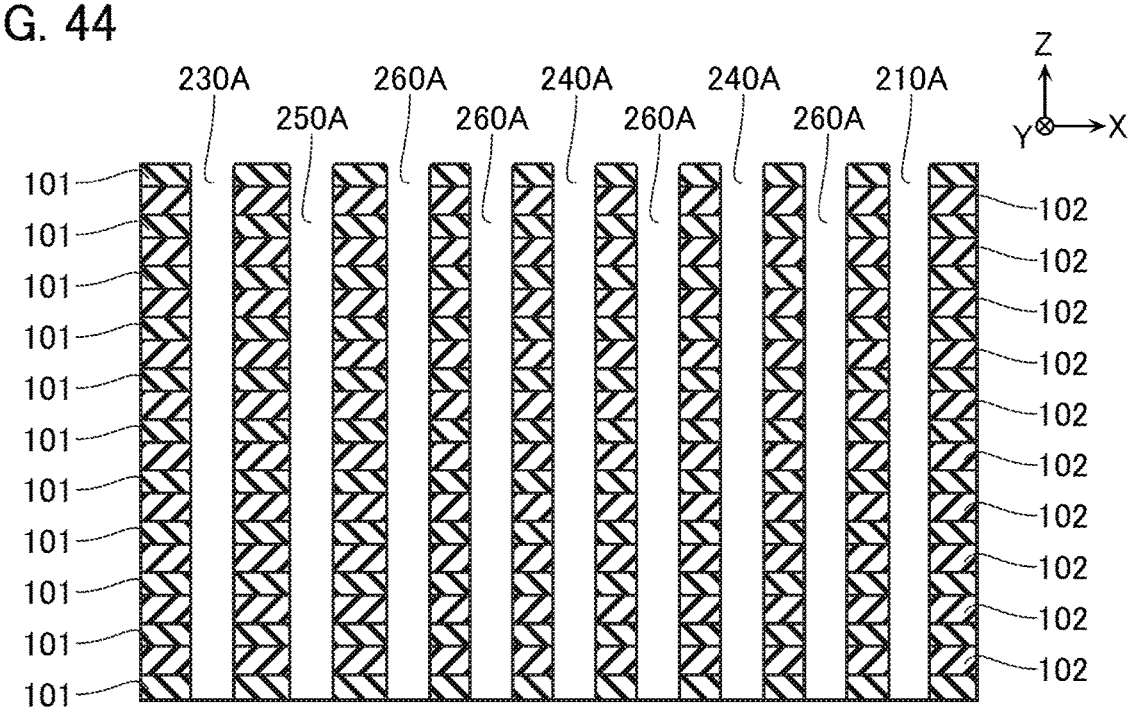
FIG. 44 is a schematic cross-sectional view for describing the manufacturing method.

However, the manufacturing method of the semiconductor memory device according to the second embodiment forms openings 210A at positions corresponding to the insulating layers 211, for example, as illustrated in FIG. 43 and FIG. 44 in the step described with reference to FIG. 12 and FIG. 13 or the step described with reference to FIG. 15 and FIG. 16. Openings 220A are formed at positions corresponding to the insulating layers 221. An opening 230A is formed at a position corresponding to the conductive layer 231. Openings 240A are formed at positions corresponding to conductive layers 241. An opening 250A is formed at a position corresponding to the insulating layer 252. An opening 253A is formed at a position corresponding to the semiconductor layer 253. Openings 260A are formed at positions corresponding to the insulating layers 261. An opening 270A is formed at a position corresponding to the insulating layer 271. The openings 210A, the openings 220A, the opening 230A, the openings 240A, the opening 250A, the opening 253A, the openings 260A, and the opening 270A extend in the Z-direction as illustrated in FIG. 44 to expose the side surfaces in the X-direction of the plurality of insulating layers 101 and the plurality of insulating layers 102 arranged in the Z-direction. The step is performed by, for example, RIE.

Figure 45:
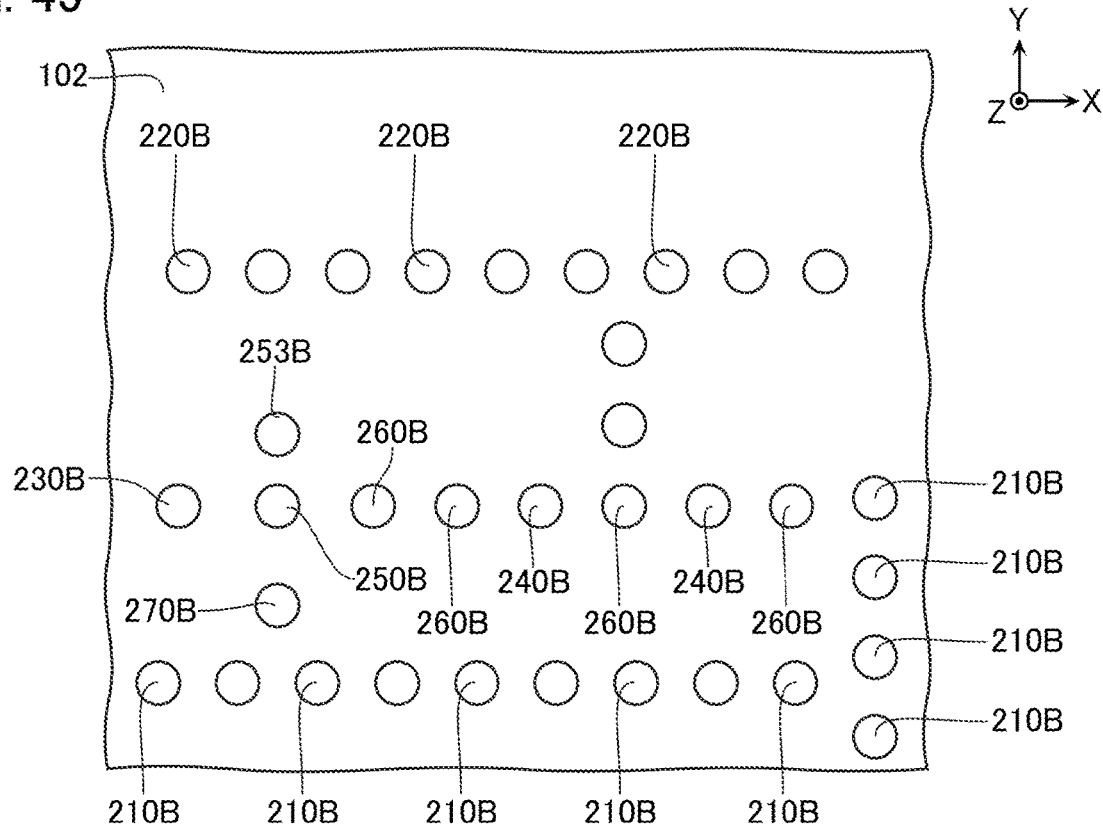
FIG. 45 is a schematic plan view for describing the manufacturing method.
Figure 46:
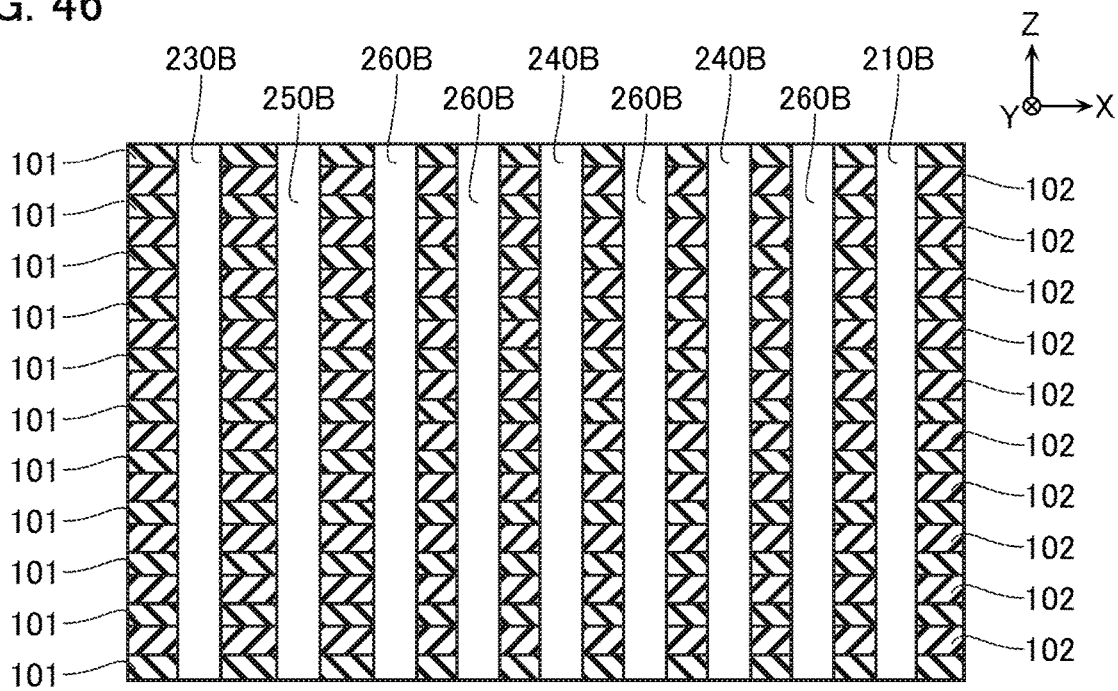
FIG. 46 is a schematic cross-sectional view for describing the manufacturing method.

Next, for example, as illustrated in FIG. 45 and FIG. 46, inside the openings 210A, the openings 220A, the opening 230A, the openings 240A, the opening 250A, the opening 253A, the openings 260A, and the opening 270A, a sacrifice layer 230B, sacrifice layers 240B, a sacrifice layer 250B, a sacrifice layer 253B, sacrifice layers 260B, and a sacrifice layer 270B are formed. The step is performed by, for example, CVD.

Figure 47:
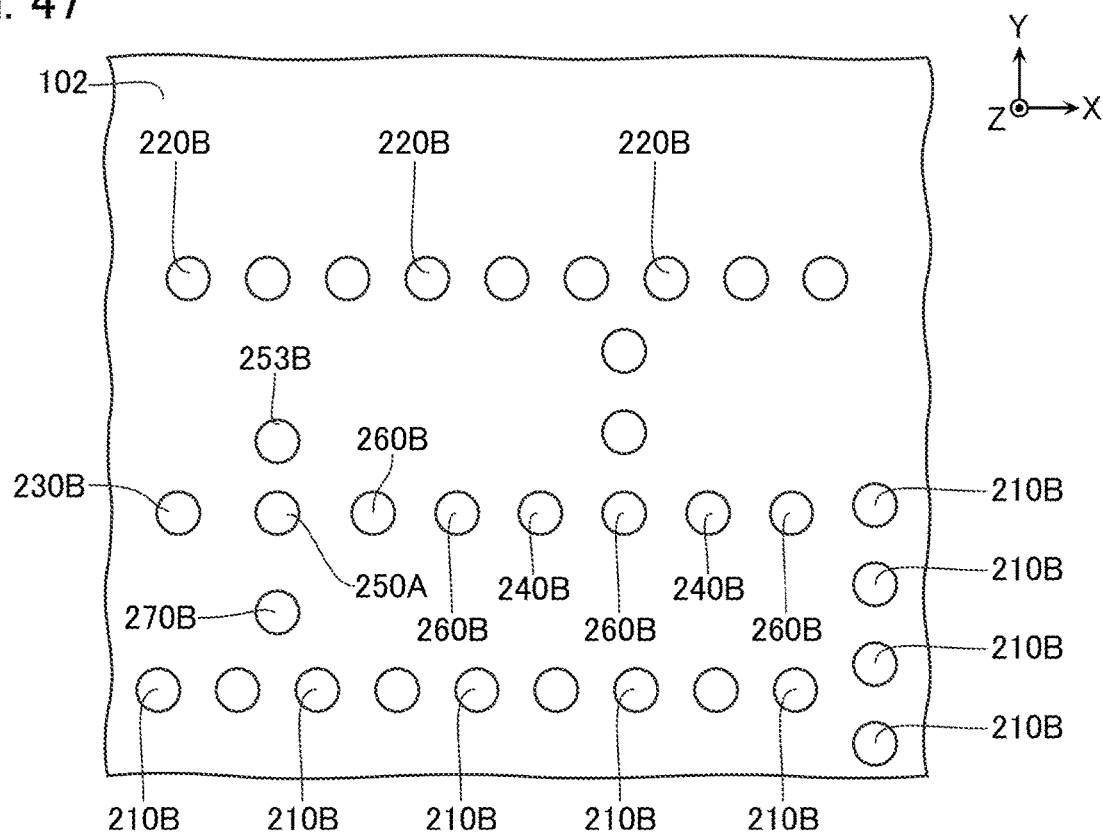
FIG. 47 is a schematic plan view for describing the manufacturing method.
Figure 48:
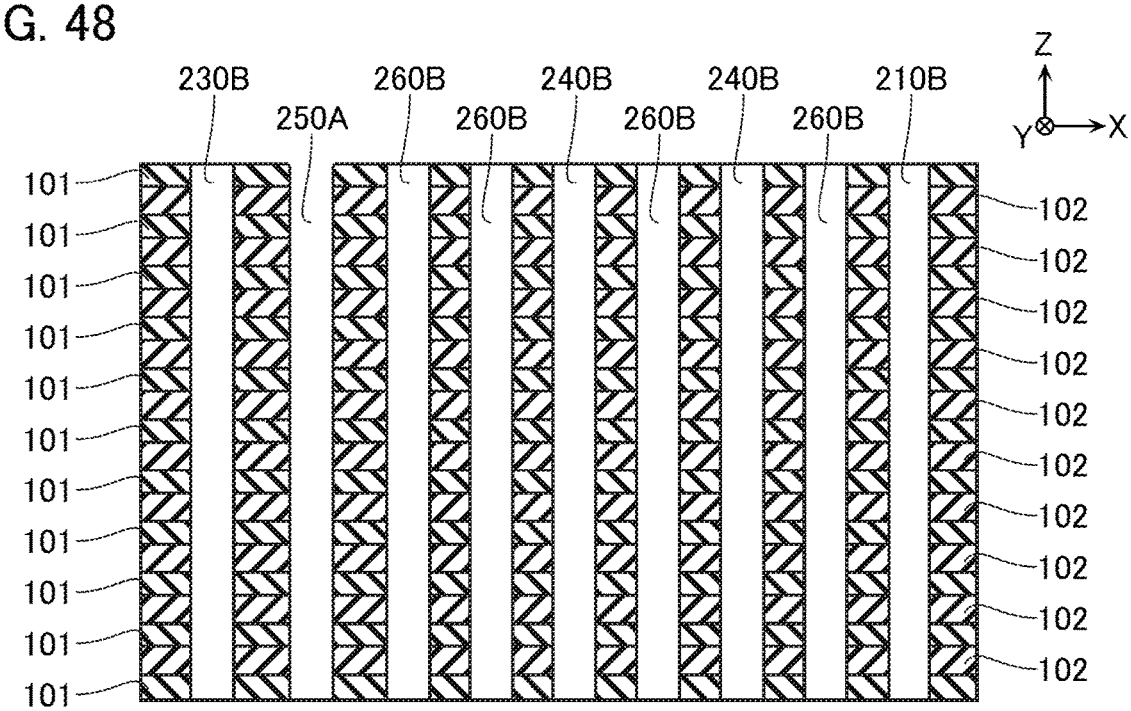
FIG. 48 is a schematic cross-sectional view for describing the manufacturing method.

Next, for example, as illustrated in FIG. 47 and FIG. 48, the sacrifice layer 250B is removed. The step is performed by, for example, wet etching.

Figure 49:
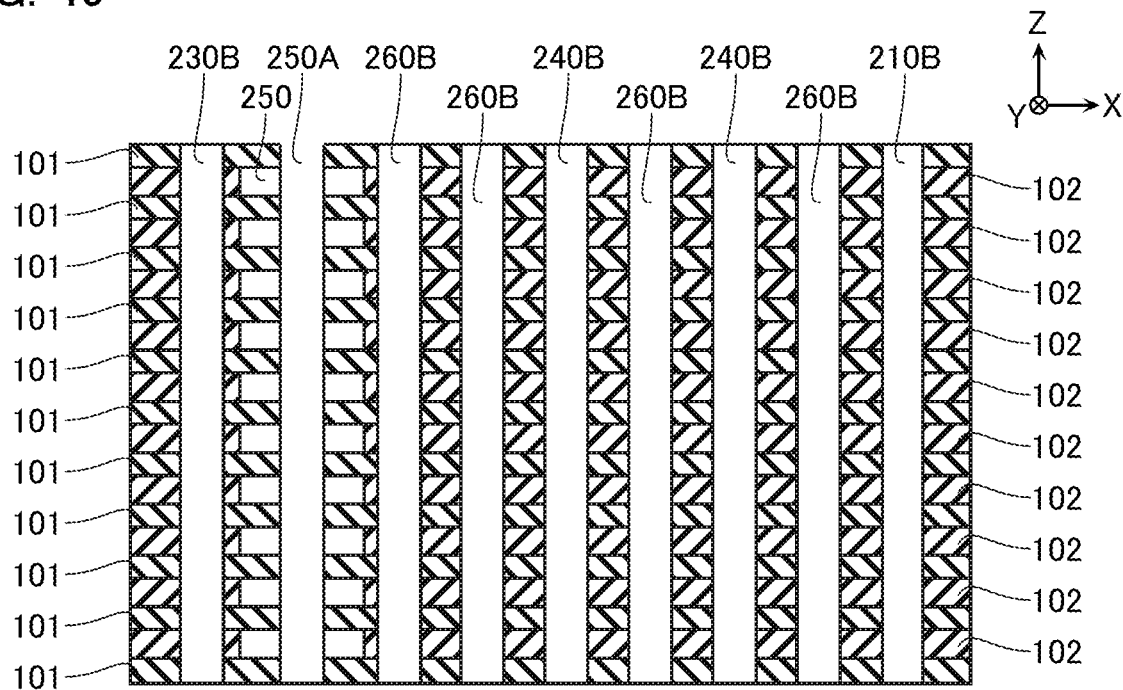
FIG. 49 is a schematic cross-sectional view for describing the manufacturing method.

Next, for example, as illustrated in FIG. 49, the semiconductor layers 250 are formed. In the step, for example, a part of the insulating layers 102 are removed via the opening 250A by a method such as wet etching. The semiconductor layers 250 are formed by a method such as CVD.

Figure 50:
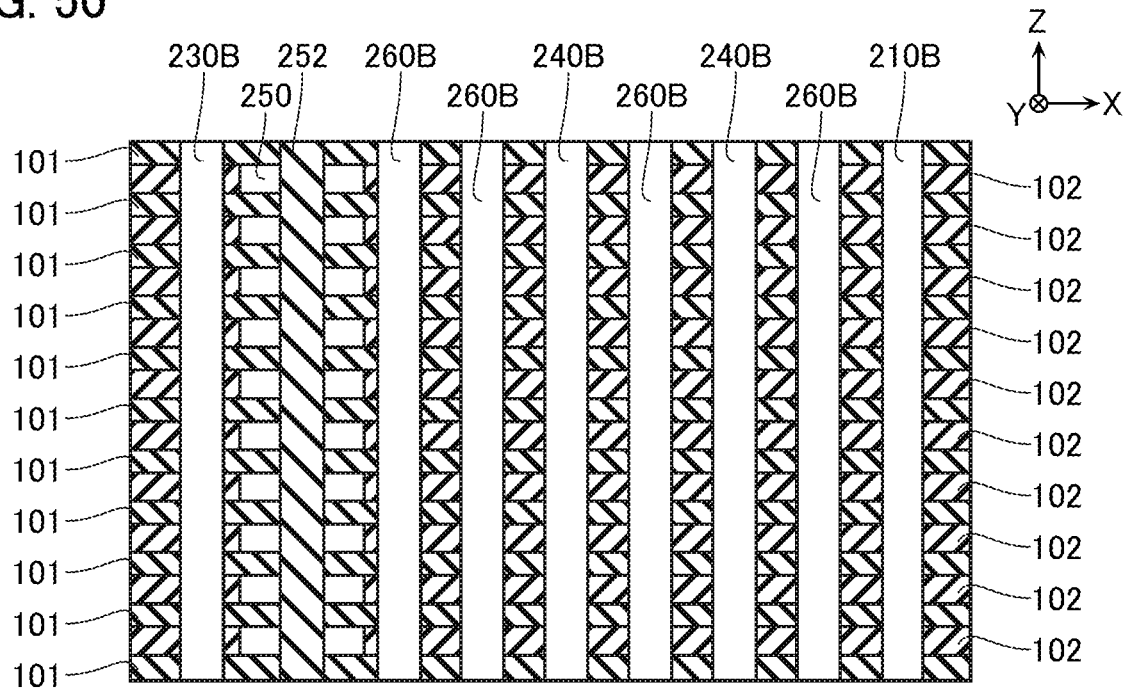
FIG. 50 is a schematic cross-sectional view for describing the manufacturing method.

Next, for example, as illustrated in FIG. 50, the insulating layer 252 is formed inside the opening 250A. The step is performed by a method such as CVD.

Figure 51:
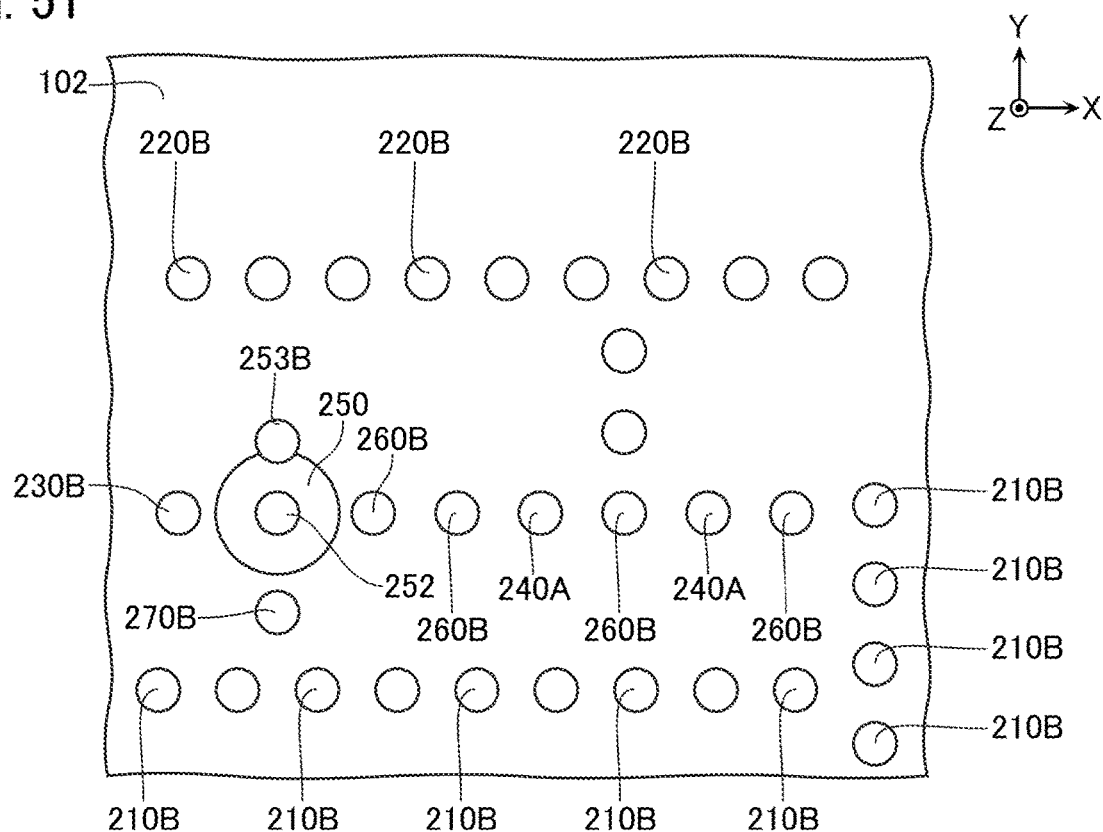
FIG. 51 is a schematic plan view for describing the manufacturing method.
Figure 52:
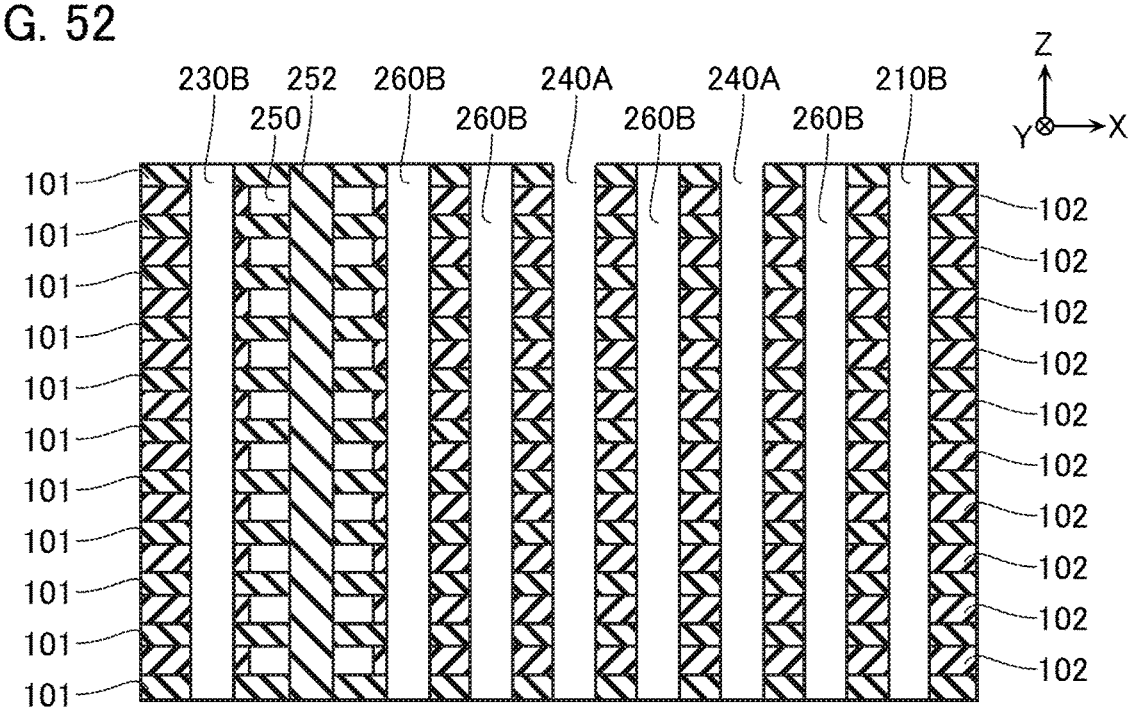
FIG. 52 is a schematic cross-sectional view for describing the manufacturing method.

Next, for example, as illustrated in FIG. 51 and FIG. 52, the sacrifice layers 240B are removed. The step is performed by, for example, wet etching.

Figure 53:
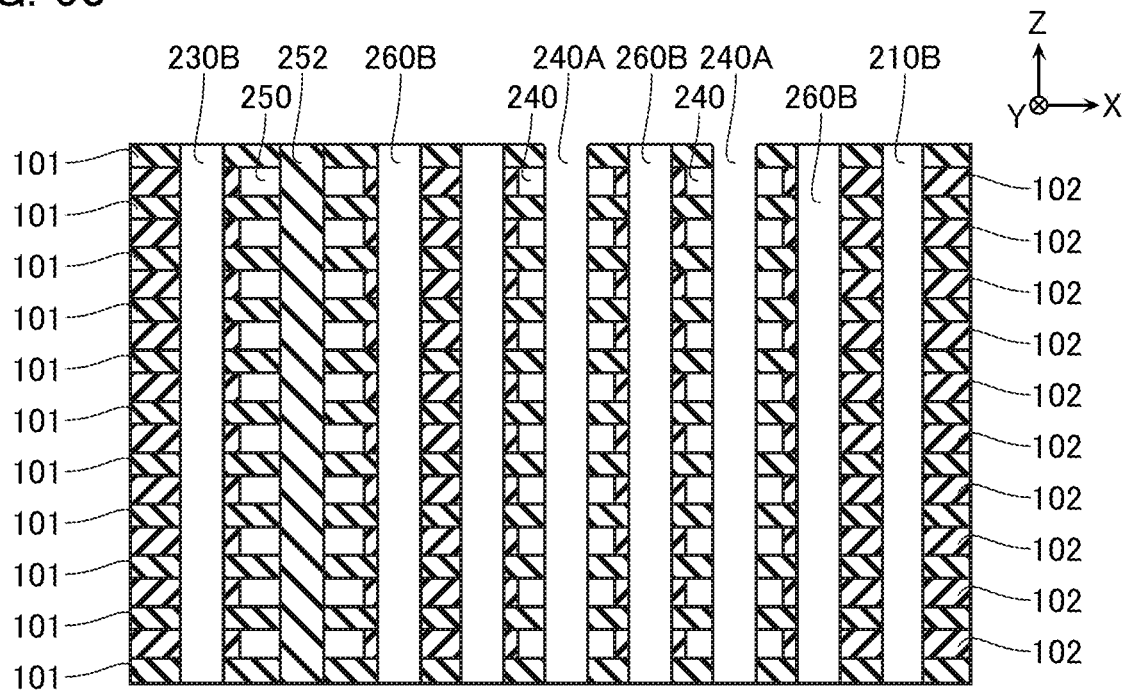
FIG. 53 is a schematic cross-sectional view for describing the manufacturing method.

Next, for example, as illustrated in FIG. 53, the semiconductor layers 240 are formed. In the step, a part of the insulating layers 102 are removed via the openings 240A by a method such as wet etching. The semiconductor layers 240 are formed by a method such as CVD.

Figure 54:
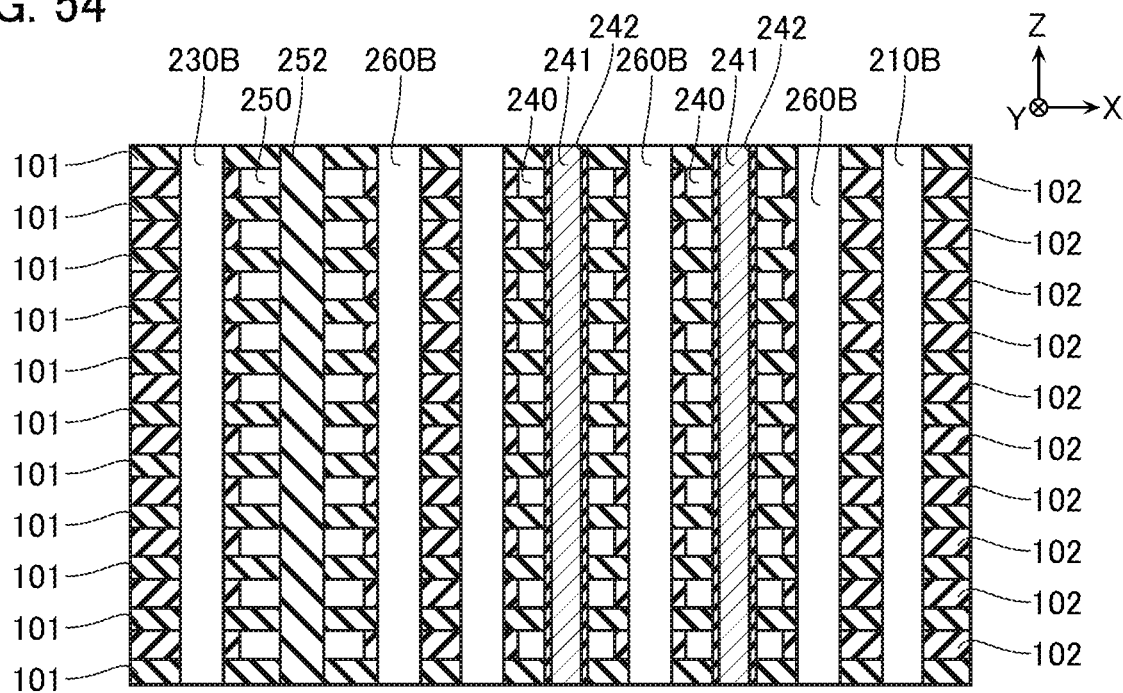
FIG. 54 is a schematic cross-sectional view for describing the manufacturing method.

Next, for example, as illustrated in FIG. 54, insulating layers 242 and conductive layers 241 are formed inside the openings 240A. The step is performed by a method such as CVD.

Figure 55:
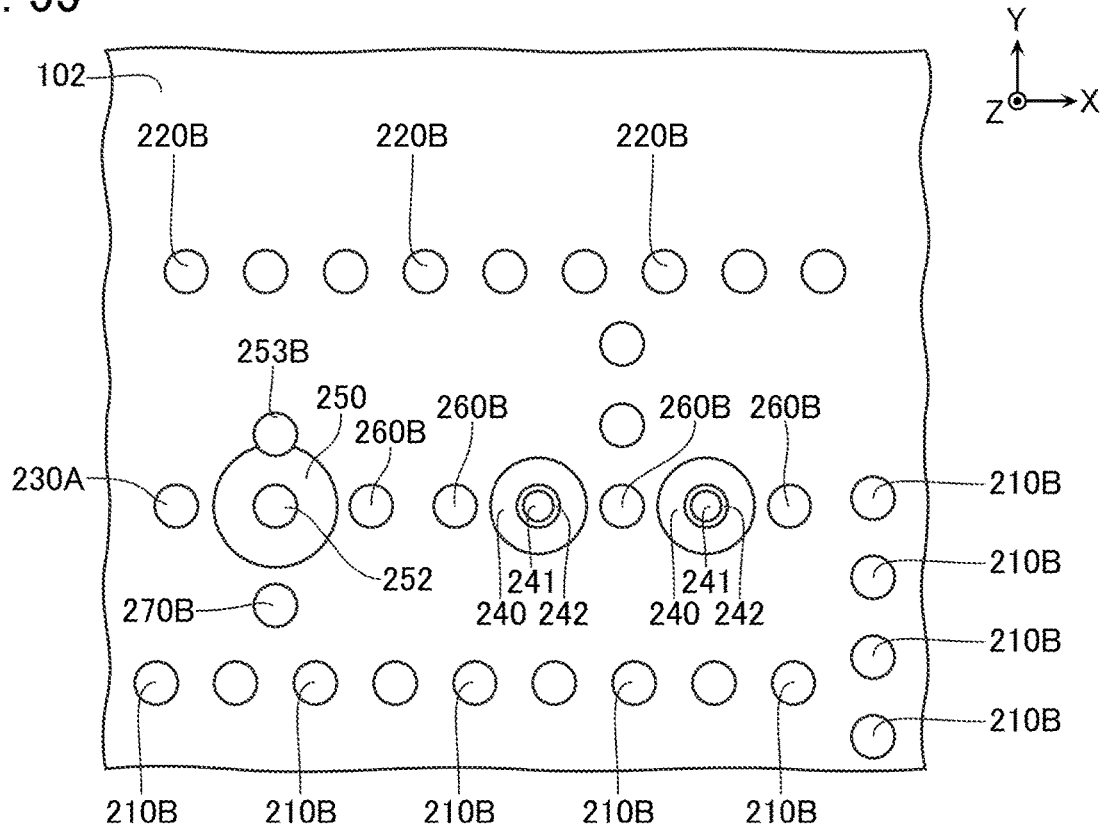
FIG. 55 is a schematic plan view for describing the manufacturing method.
Figure 56:
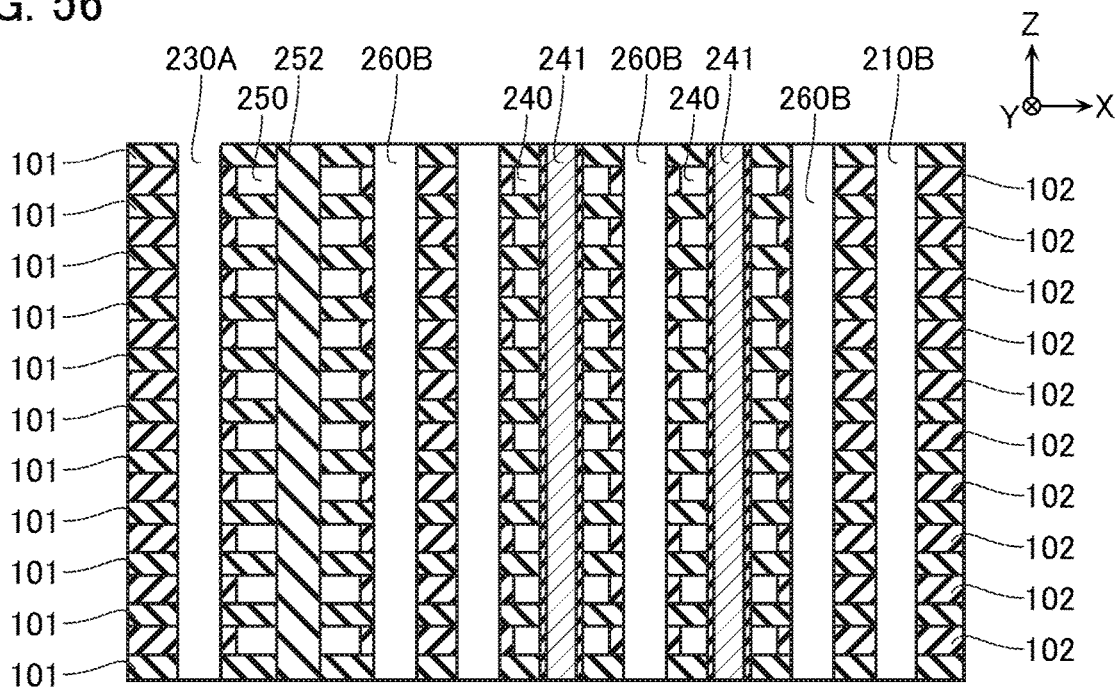
FIG. 56 is a schematic cross-sectional view for describing the manufacturing method.

Next, for example, as illustrated in FIG. 55 and FIG. 56, the sacrifice layer 230B is removed. The step is performed by, for example, wet etching.

Figure 57:
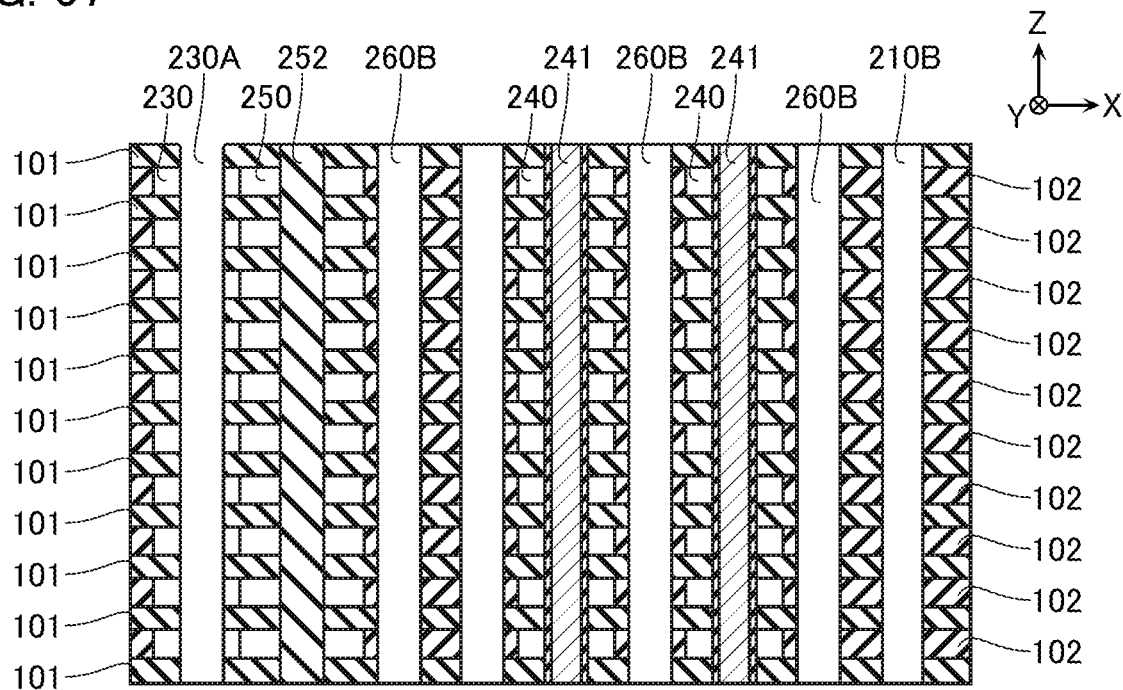
FIG. 57 is a schematic cross-sectional view for describing the manufacturing method.

Next, for example, as illustrated in FIG. 57, the semiconductor layers 230 are formed. In the step, for example, a part of the insulating layers 102 are removed via the opening 230A by a method such as wet etching. The semiconductor layers 230 are formed by a method such as CVD.

Figure 58:
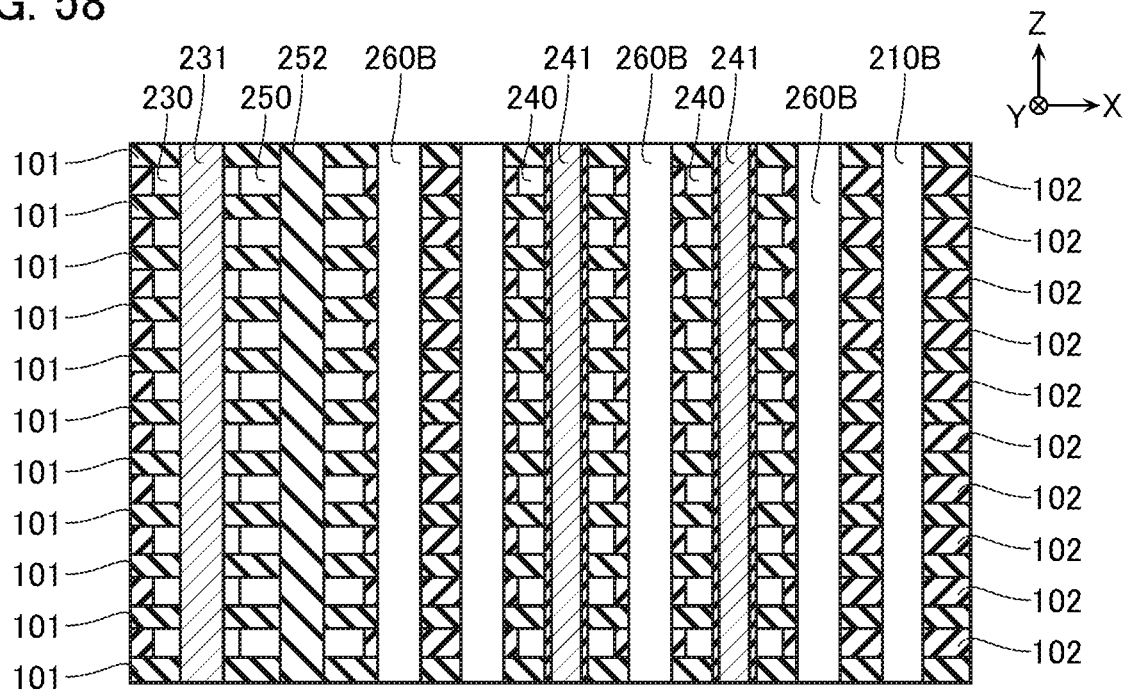
FIG. 58 is a schematic cross-sectional view for describing the manufacturing method.

Next, for example, as illustrated in FIG. 58, the conductive layer 231 is formed inside the opening 230A. The step is performed by a method such as CVD.

Figure 59:
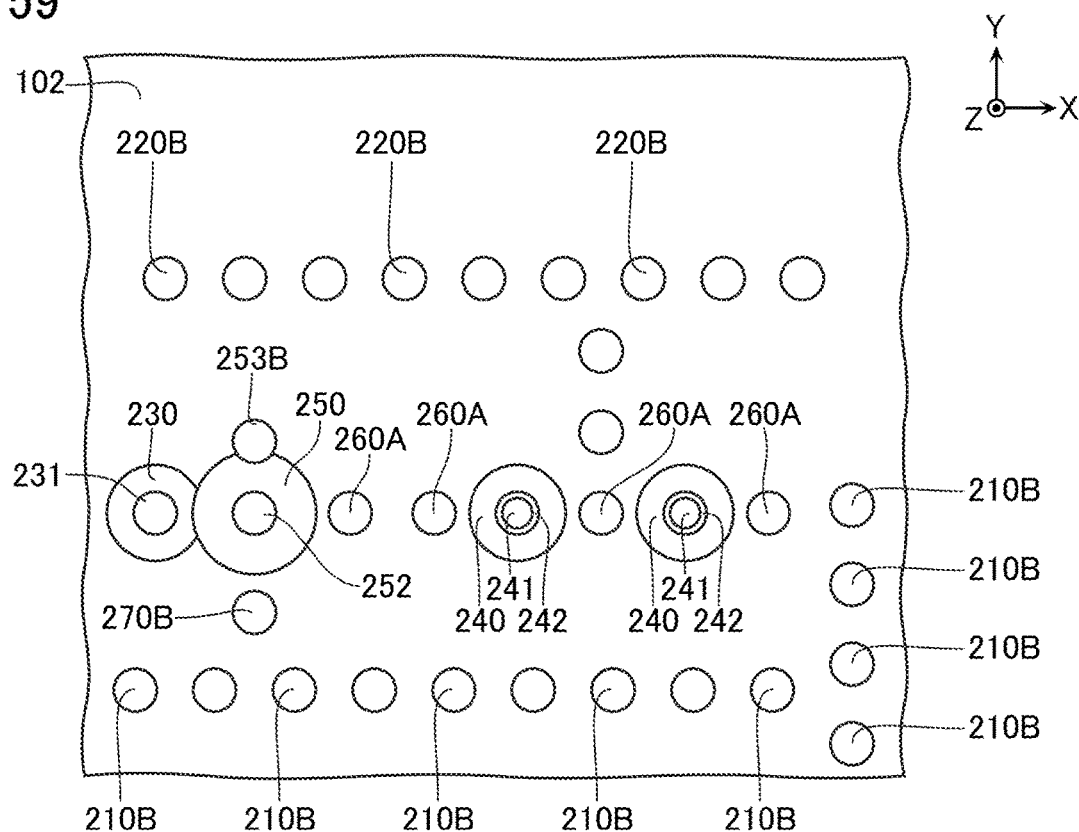
FIG. 59 is a schematic plan view for describing the manufacturing method.
Figure 60:
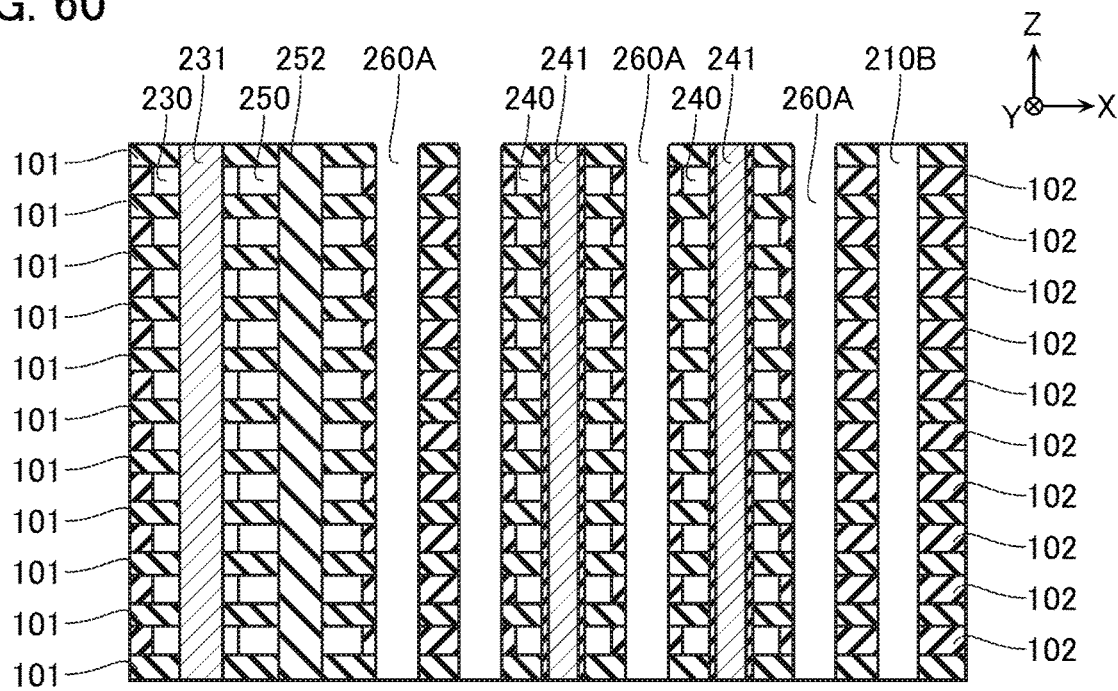
FIG. 60 is a schematic cross-sectional view for describing the manufacturing method.

Next, for example, as illustrated in FIG. 59 and FIG. 60, the sacrifice layers 260B are removed. The step is performed by, for example, wet etching.

Figure 61:
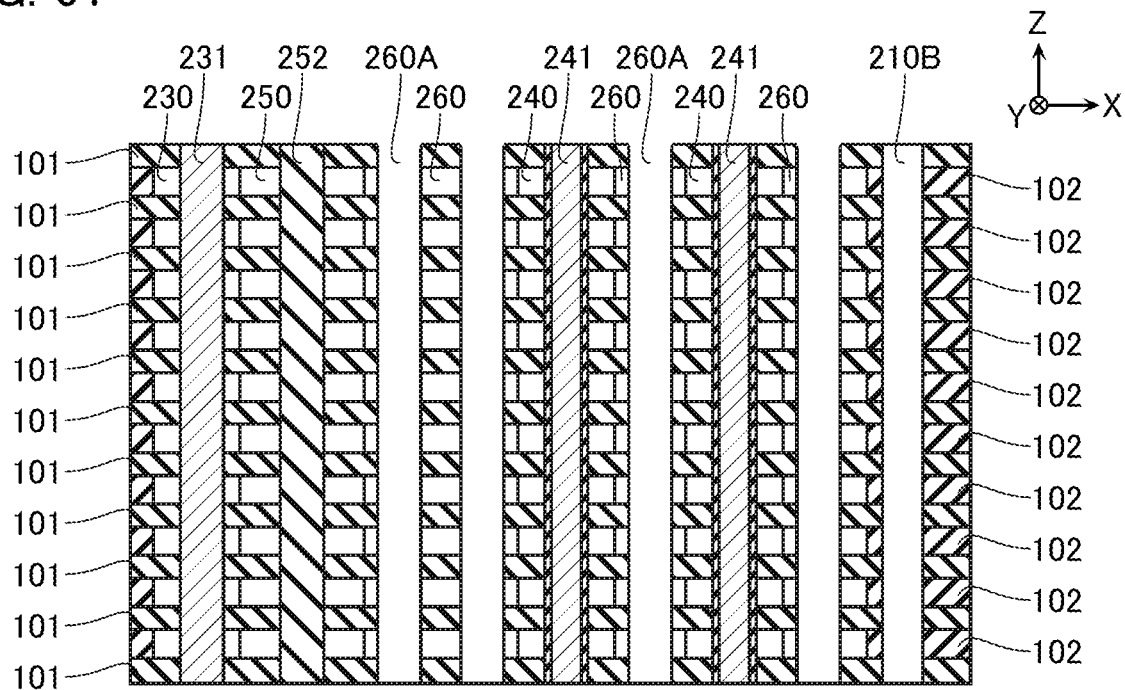
FIG. 61 is a schematic cross-sectional view for describing the manufacturing method.

Next, for example, as illustrated in FIG. 61, the semiconductor layers 260 are formed. In the step, for example, apart of the insulating layers 102 are removed via the openings 260A by a method such as wet etching. The semiconductor layers 260 are formed by a method such as CVD.

Figure 62:
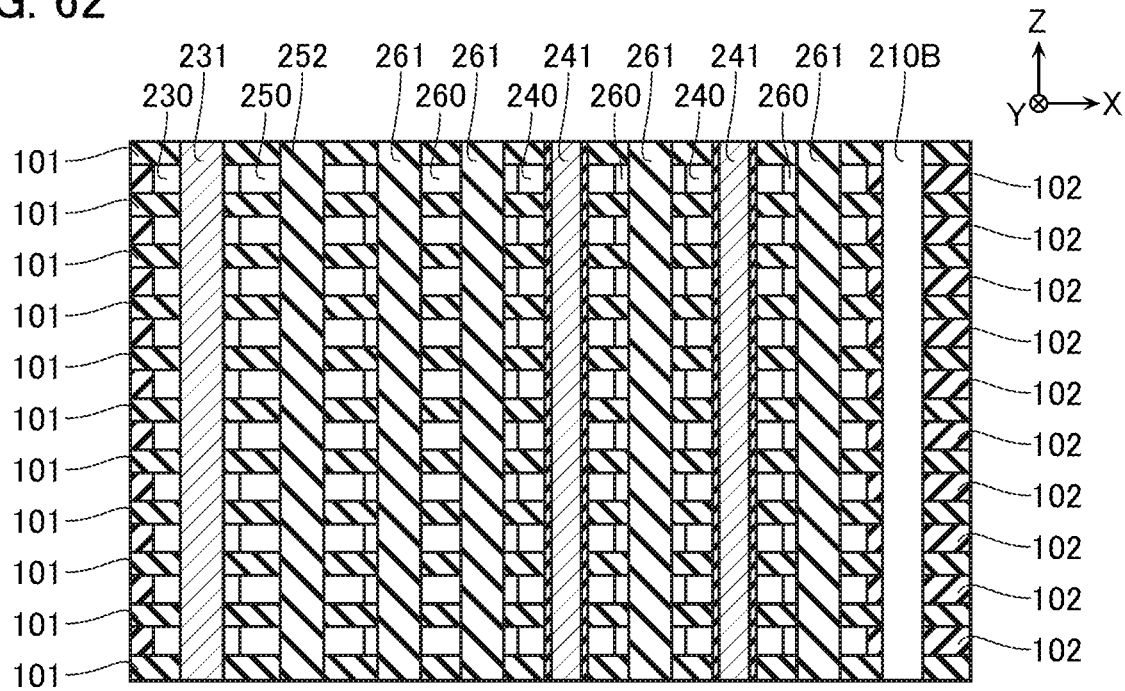
FIG. 62 is a schematic cross-sectional view for describing the manufacturing method.

Next, for example, as illustrated in FIG. 62, the insulating layers 261 are formed inside the openings 260A. The step is performed by a method such as CVD.

Figure 63:
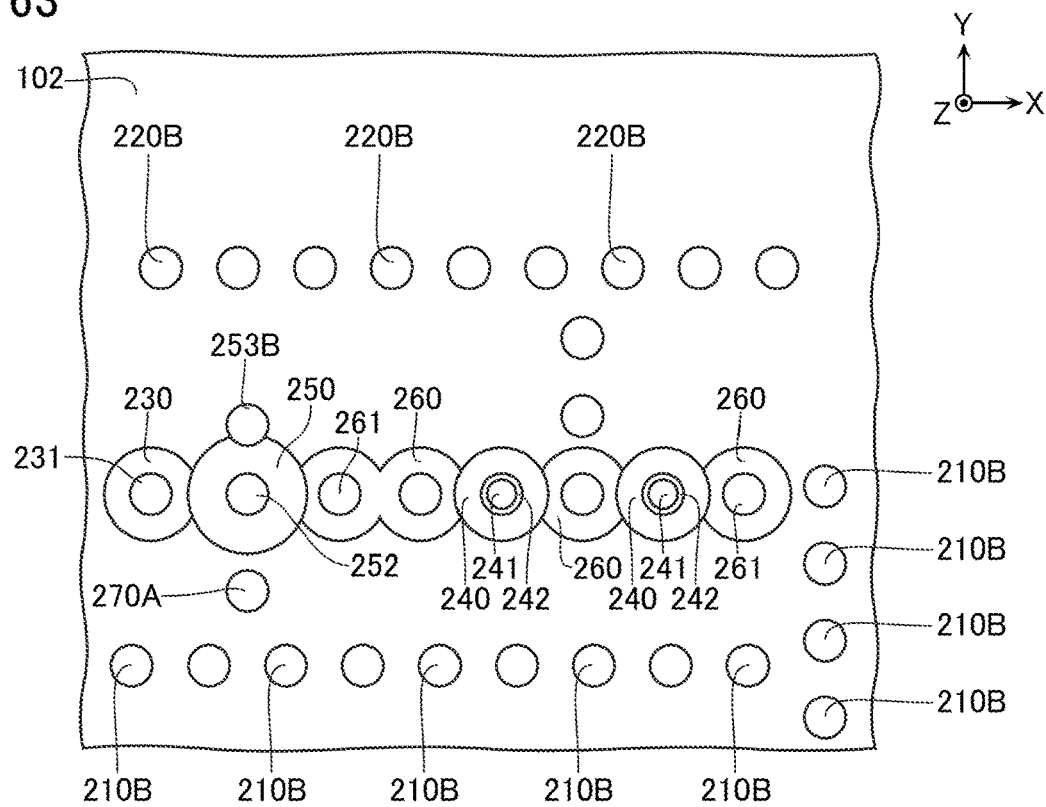
FIG. 63 is a schematic plan view for describing the manufacturing method.

Next, for example, as illustrated in FIG. 63, the sacrifice layer 270B is removed. The step is performed by, for example, wet etching.

Figure 64:
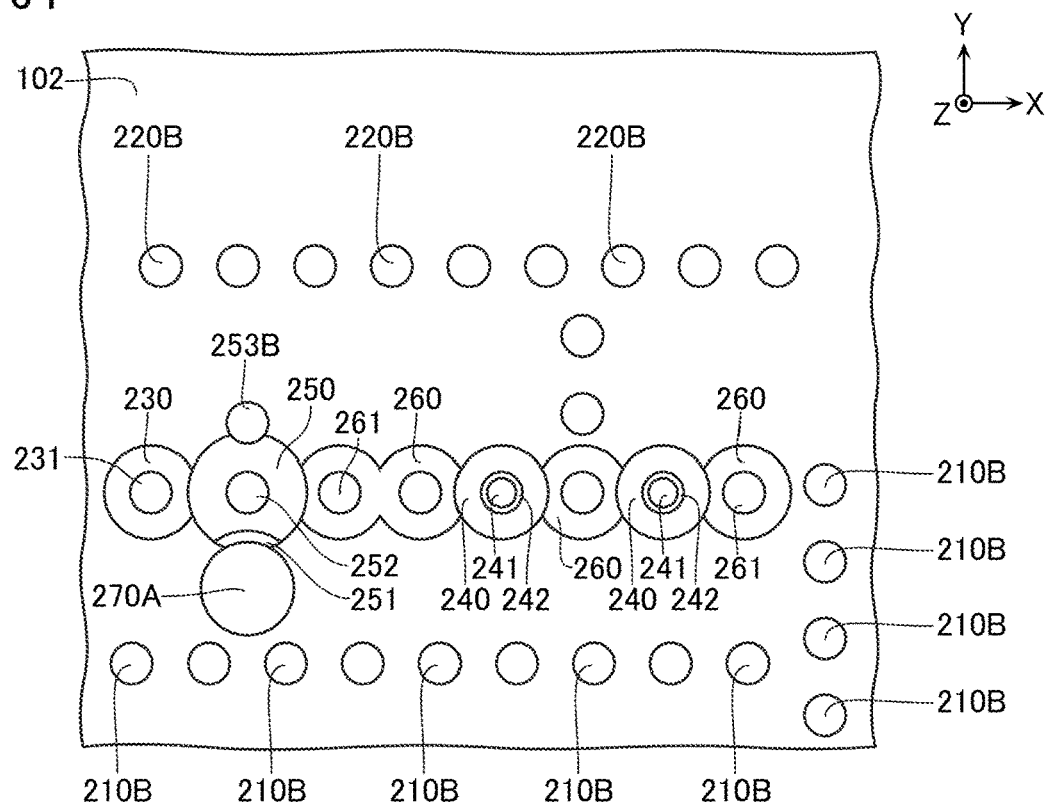
FIG. 64 is a schematic plan view for describing the manufacturing method.

Next, for example, as illustrated in FIG. 64, the insulating layer 251 is formed. In the step, for example, a part of the insulating layers 102 are removed via the opening 270A by a method such as wet etching. A part of the outer peripheral surface of the semiconductor layer 250 is oxidized by a method such as a thermal oxidation treatment to form the insulating layer 251.

Figure 65:
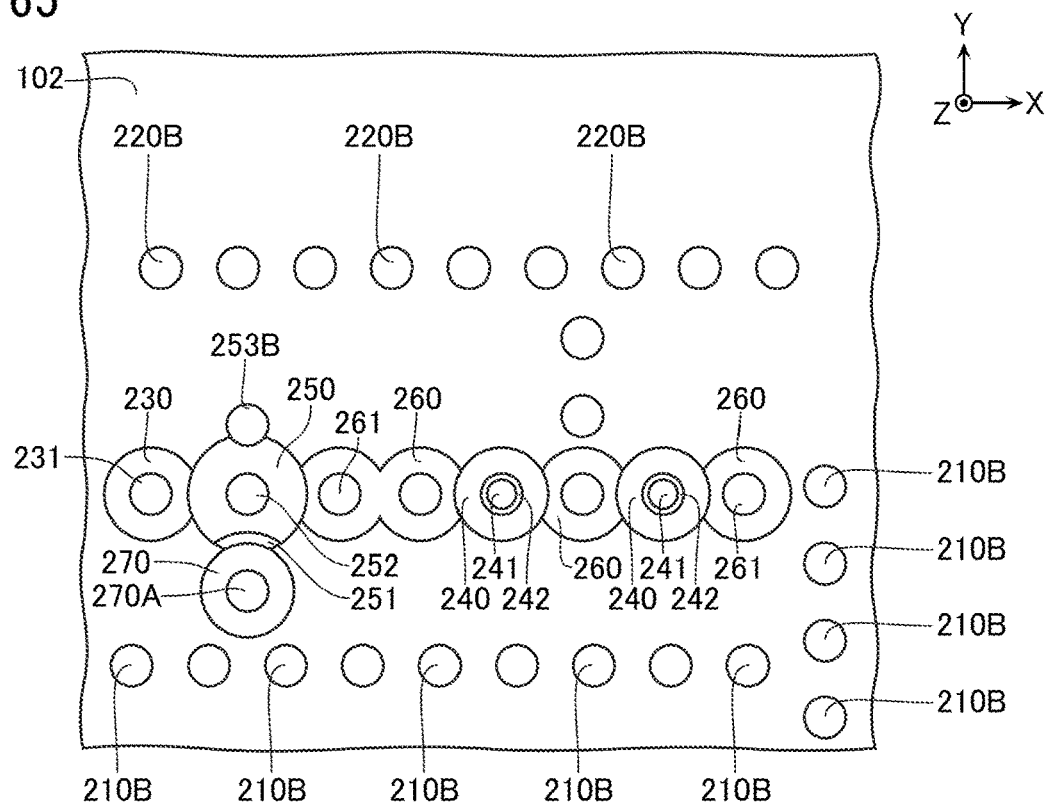
FIG. 65 is a schematic plan view for describing the manufacturing method.

Next, for example, as illustrated in FIG. 65, the semiconductor layer 270 is formed. The step is performed by a method such as CVD.

Figure 66:
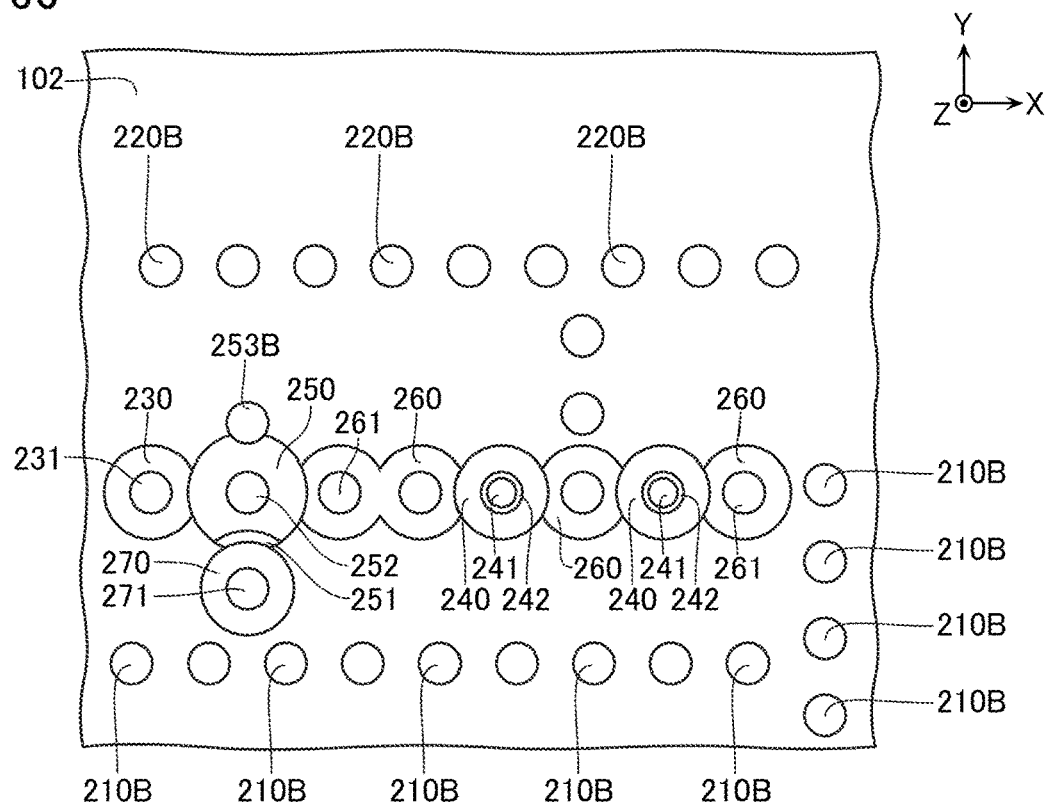
FIG. 66 is a schematic plan view for describing the manufacturing method.

Next, for example, as illustrated in FIG. 66, the insulating layer 271 is formed inside the opening 270A. The step is performed by a method such as CVD.

Figure 67:
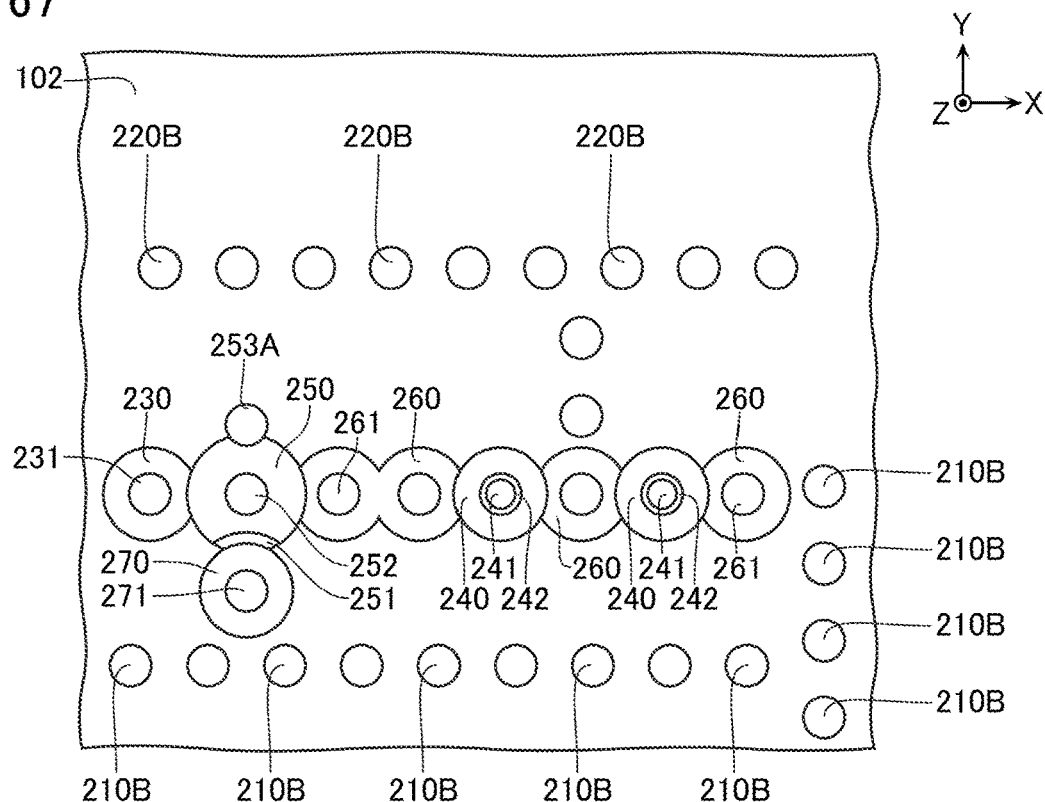
FIG. 67 is a schematic plan view for describing the manufacturing method.

Next, for example, as illustrated in FIG. 67, the sacrifice layer 253B is removed. The step is performed by, for example, wet etching.

Figure 68:
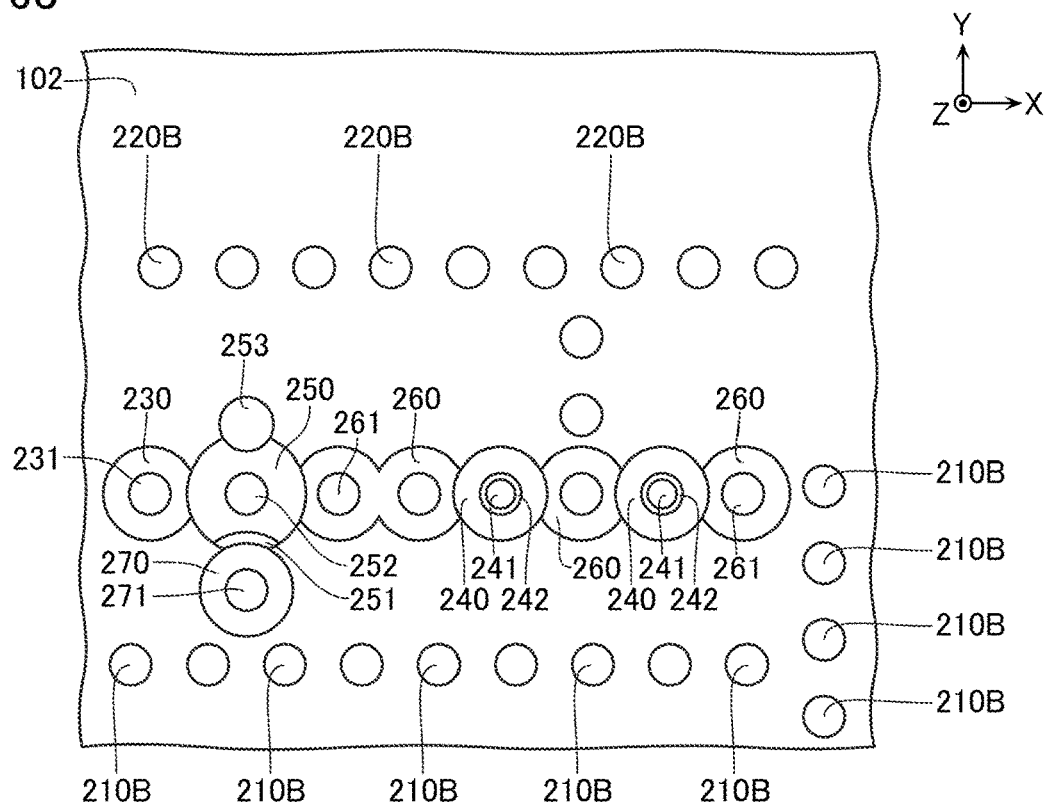
FIG. 68 is a schematic plan view for describing the manufacturing method.

Next, for example, as illustrated in FIG. 68, the semiconductor layer 253 is formed inside the opening 253A. The step is performed by a method such as CVD.

Figure 69:
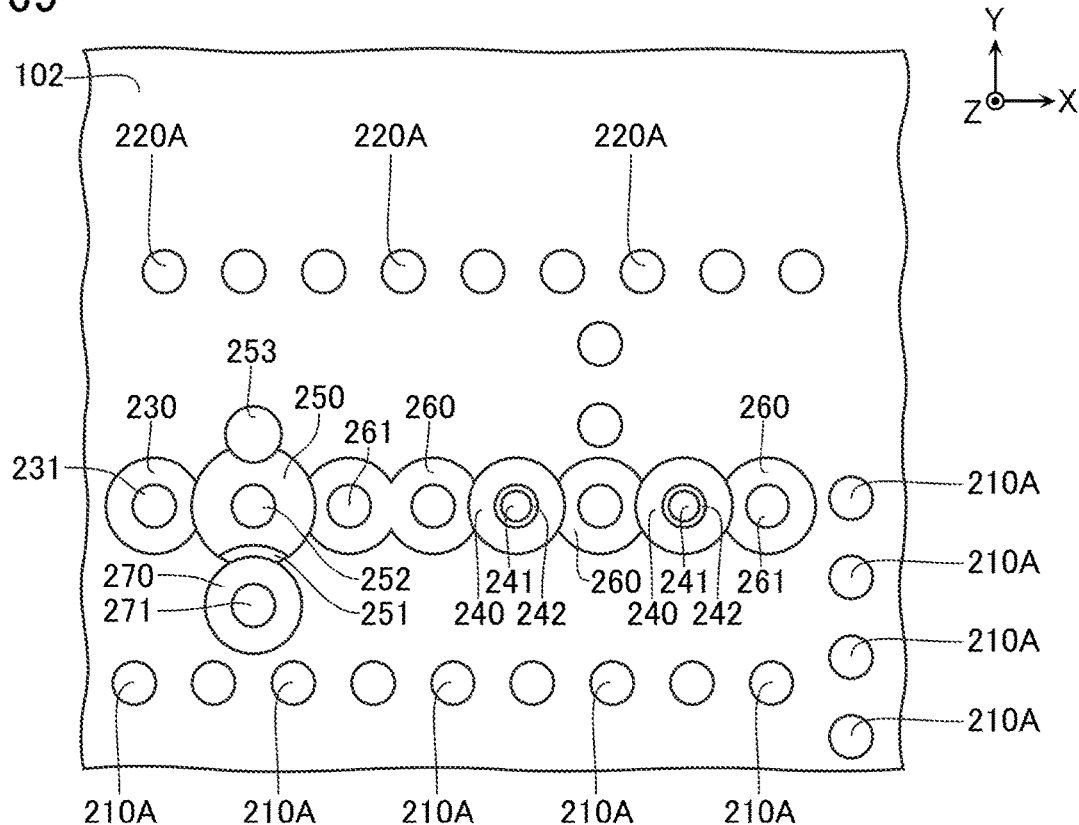
FIG. 69 is a schematic plan view for describing the manufacturing method.
Figure 70:
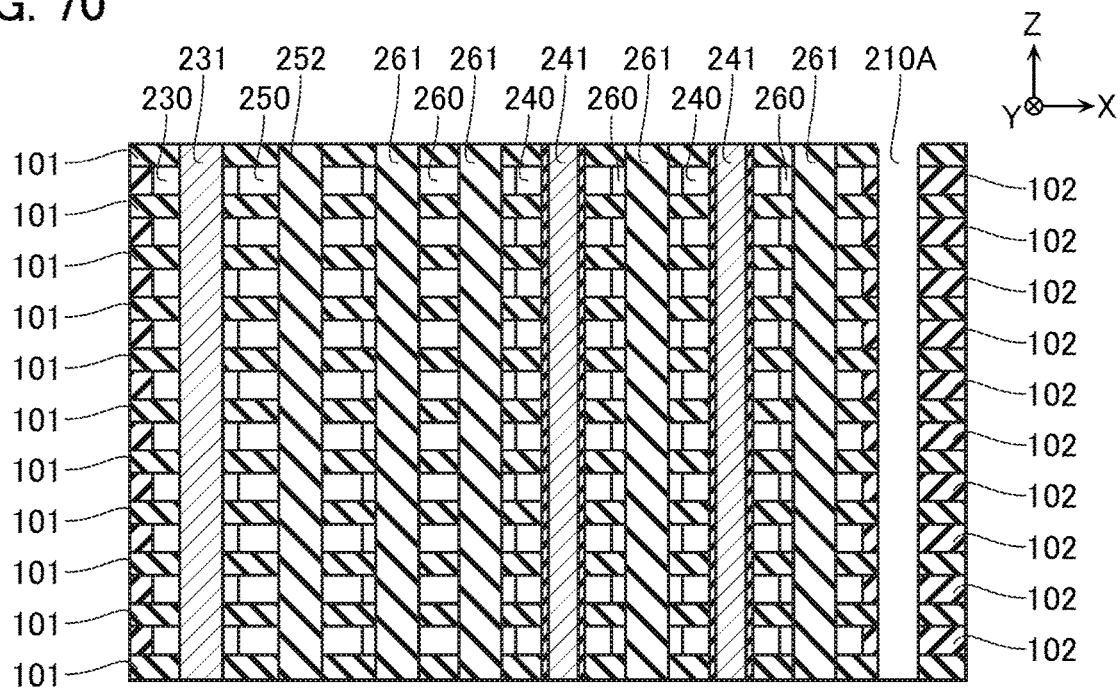
FIG. 70 is a schematic cross-sectional view for describing the manufacturing method.

Next, for example, in the step described with reference to FIG. 27 and FIG. 28, for example, as illustrated in FIG. 69 and FIG. 70, sacrifice layers 210B and 220B are removed. The step is performed by, for example, wet etching.

Figure 71:
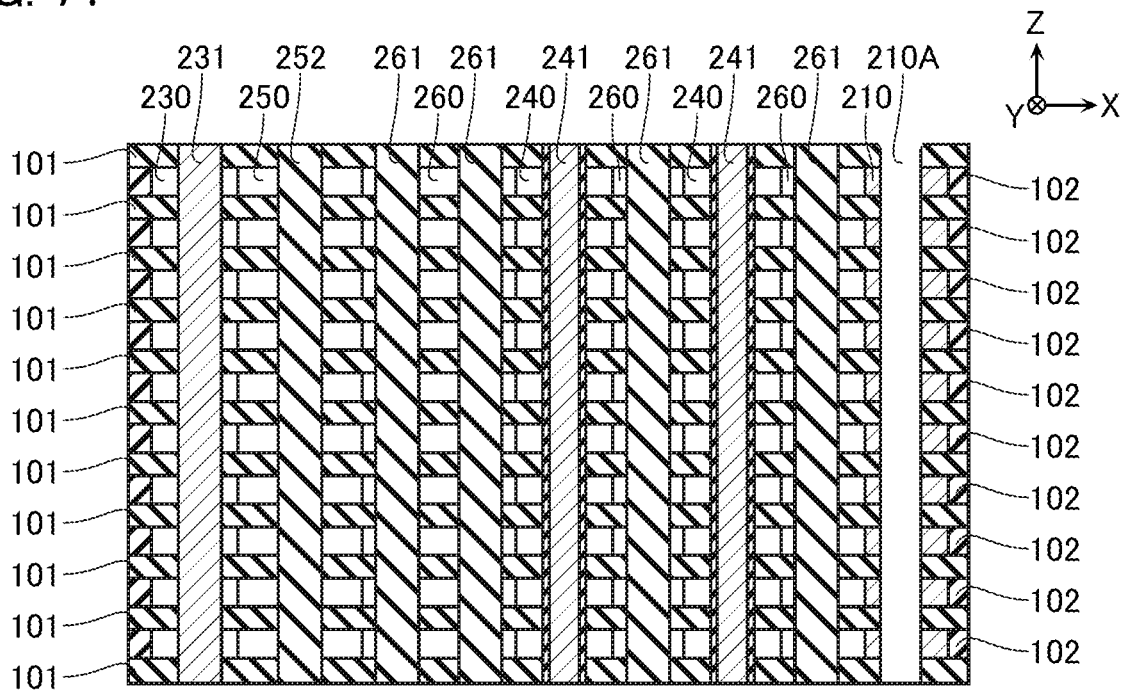
FIG. 71 is a schematic cross-sectional view for describing the manufacturing method.

Next, for example, in the step described with reference to FIG. 29, for example, as illustrated in FIG. 71, the conductive layers 210 are formed. Although the illustration is omitted, the conductive layer 220 is formed. In the step, for example, a part of the insulating layers 102 are removed via the openings 210A and 220A by a method such as wet etching. The conductive layers 210 and 220 are formed by a method such as CVD.

Figure 72:
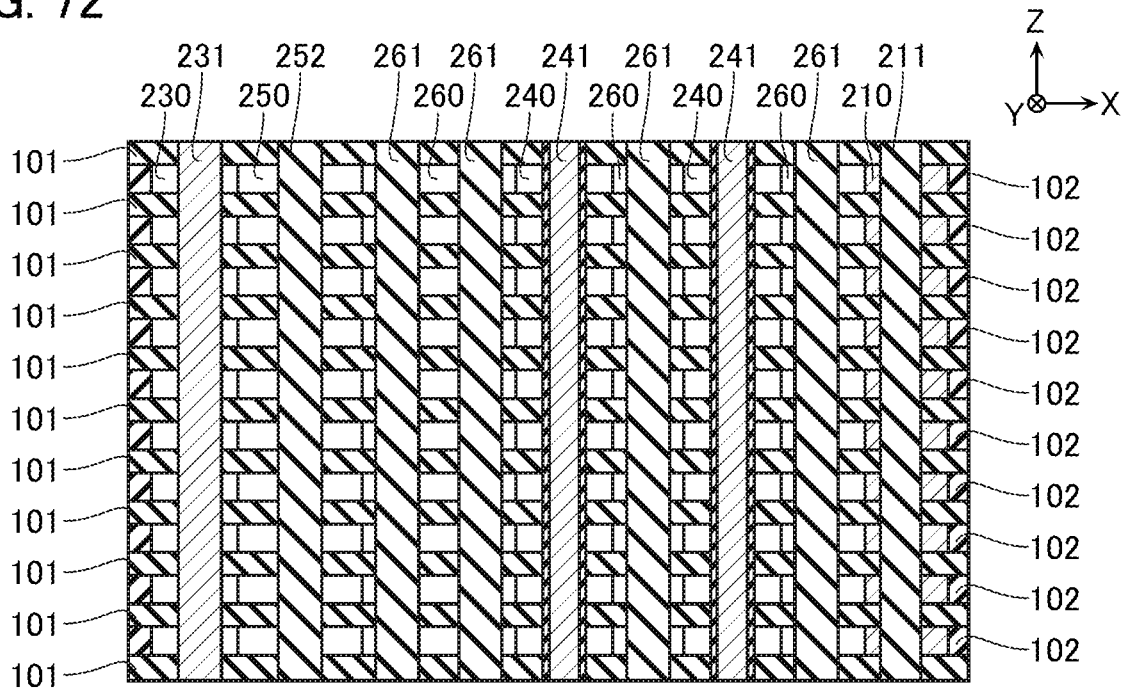
FIG. 72 is a schematic cross-sectional view for describing the manufacturing method.

Next, for example, as illustrated in FIG. 72, the insulating layer 211 is formed inside the opening 210A. Although the illustration is omitted, the insulating layers 221 are formed inside the openings 220A. The step is performed by a method such as CVD.

[Exemplary Configuration of Pre-Amplifier Circuit PA]

The configuration of the pre-amplifier circuit PA illustrated in FIG. 40 to FIG. 42 as an example is merely an example, and a specific configuration is appropriately adjustable.

Figure 73:
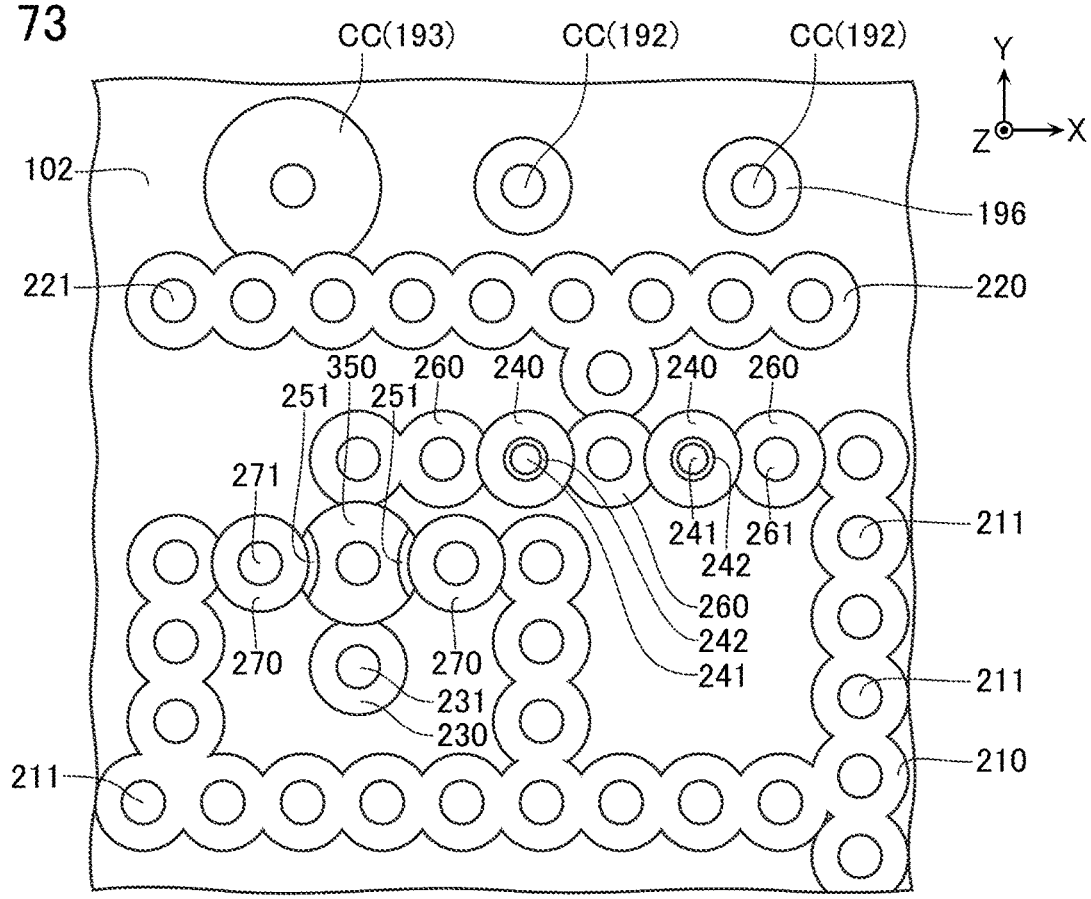
FIG. 73 is a schematic plan view for describing another example of the semiconductor memory device according to the second embodiment.

For example, the configuration illustrated in FIG. 40 as an example includes the semiconductor layer 250 and the semiconductor layer 253 in contact with a part of the outer peripheral surface of the semiconductor layer 250. Meanwhile, while the configuration illustrated in FIG. 73 as an example is configured basically similarly to the configuration illustrated in FIG. 40 as an example, the configuration includes a semiconductor layer 350 instead of the semiconductor layer 250. Additionally, the configuration does not include the semiconductor layer 253.

The semiconductor layer 350 is configured basically similarly to the semiconductor layer 250. However, one insulating layer 251 is disposed on the outer peripheral surface of the semiconductor layer 250, and the semiconductor layer 250 is opposed to one semiconductor layer 270 via the insulating layer 251. On the other hand, the two insulating layers 251 are disposed on the outer peripheral surface of the semiconductor layer 350, and the semiconductor layer 350 is opposed to the two semiconductor layers 270 via the insulating layers 251. In the configuration, a channel width of the transistor Tr3 configured by the semiconductor layer 350 can be increased to increase an ON current.

Figure 74:
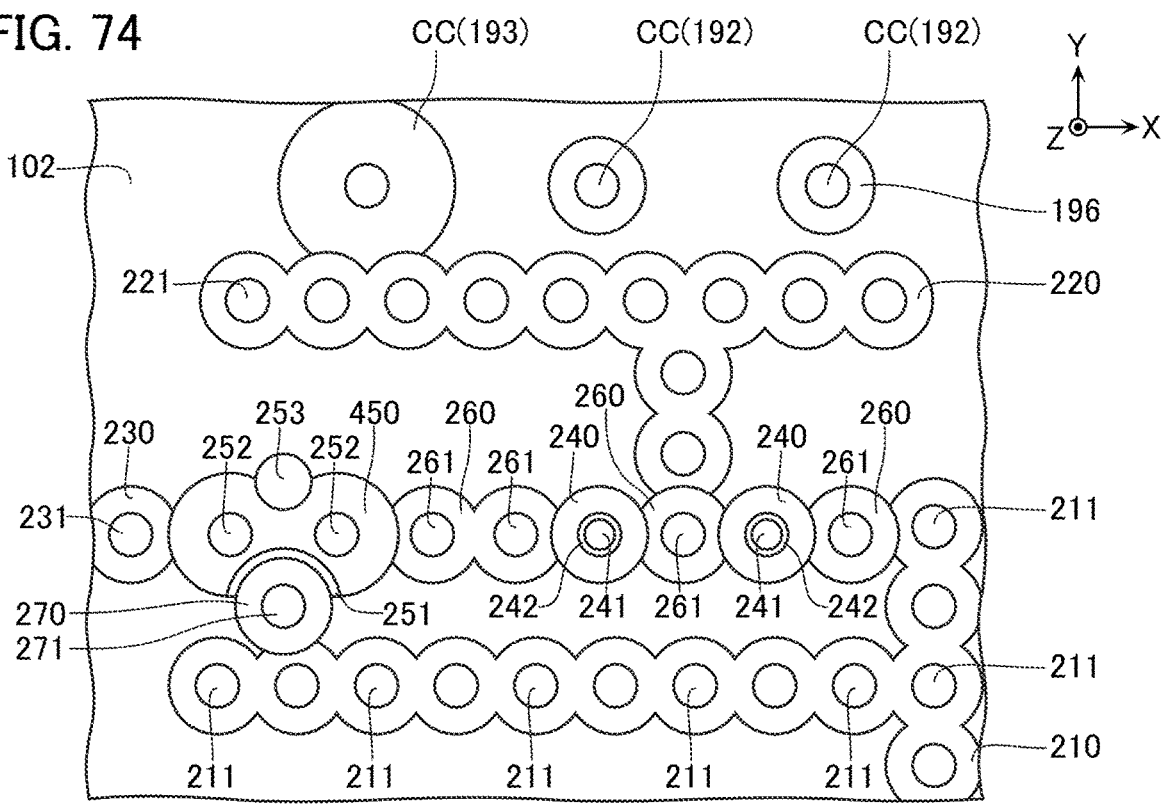
FIG. 74 is a schematic plan view for describing another example of the semiconductor memory device according to the second embodiment.

For example, the configuration illustrated in FIG. 40 as an example includes the semiconductor layer 250 and one insulating layer 252 in contact with the semiconductor layer 250. Meanwhile, while the configuration illustrated in FIG. 74 as an example is configured basically similarly to the configuration illustrated in FIG. 40 as an example, the configuration includes a semiconductor layer 450 instead of the semiconductor layer 250 and two insulating layers 252 in contact with the semiconductor layer 450.

The semiconductor layer 450 is configured basically similarly to the semiconductor layer 250. However, a part of the outer peripheral surface of the semiconductor layer 250 is disposed along a circumference of one circle with a center position of one insulating layer 252 as its center. Additionally, the other part of the outer peripheral surface of the semiconductor layer 250 is disposed within the range of the circle. On the other hand, a part of an outer peripheral surface of the semiconductor layer 450 is disposed along circumferences of two circles with center positions of the two insulating layers 252 as their respective centers. The other part of the outer peripheral surface of the semiconductor layer 450 is disposed within a range of at least one of the two circles. An opposed area of the semiconductor layer 450 with the semiconductor layer 270 is larger than an opposed area of the semiconductor layer 250 with the semiconductor layer 270. This configuration allows increasing a channel length of the transistor Tr3 configured by the semiconductor layer 450 and reducing an off-leakage current.

Figure 75:
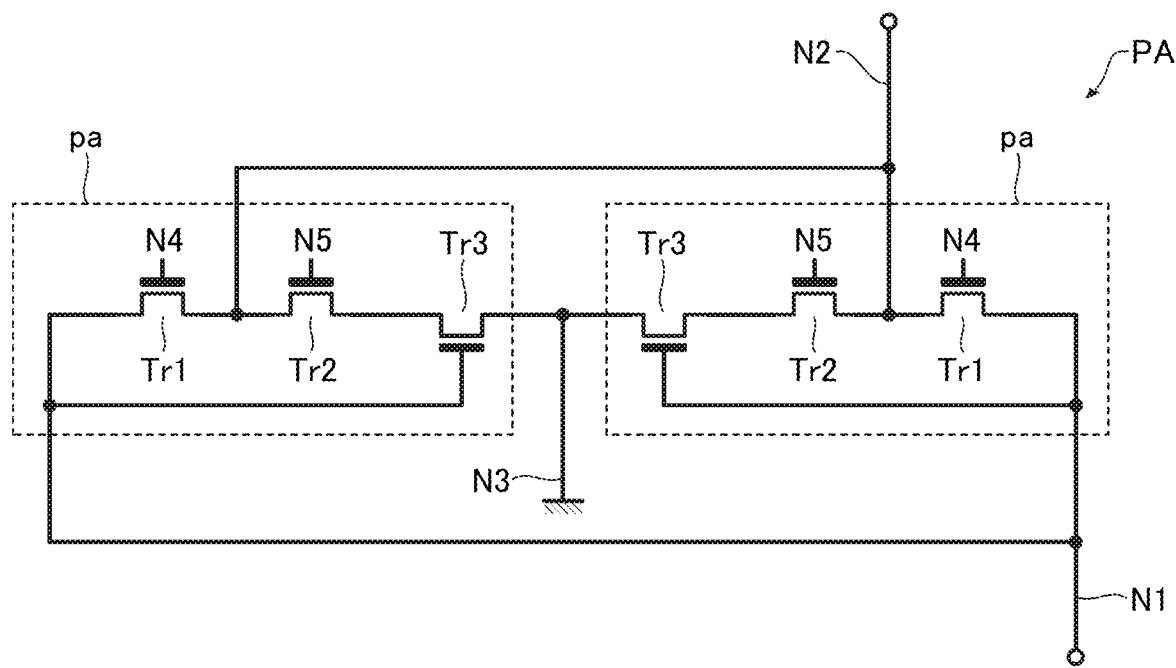
FIG. 75 is a schematic circuit diagram for describing another example of the semiconductor memory device according to the second embodiment.
Figure 76:
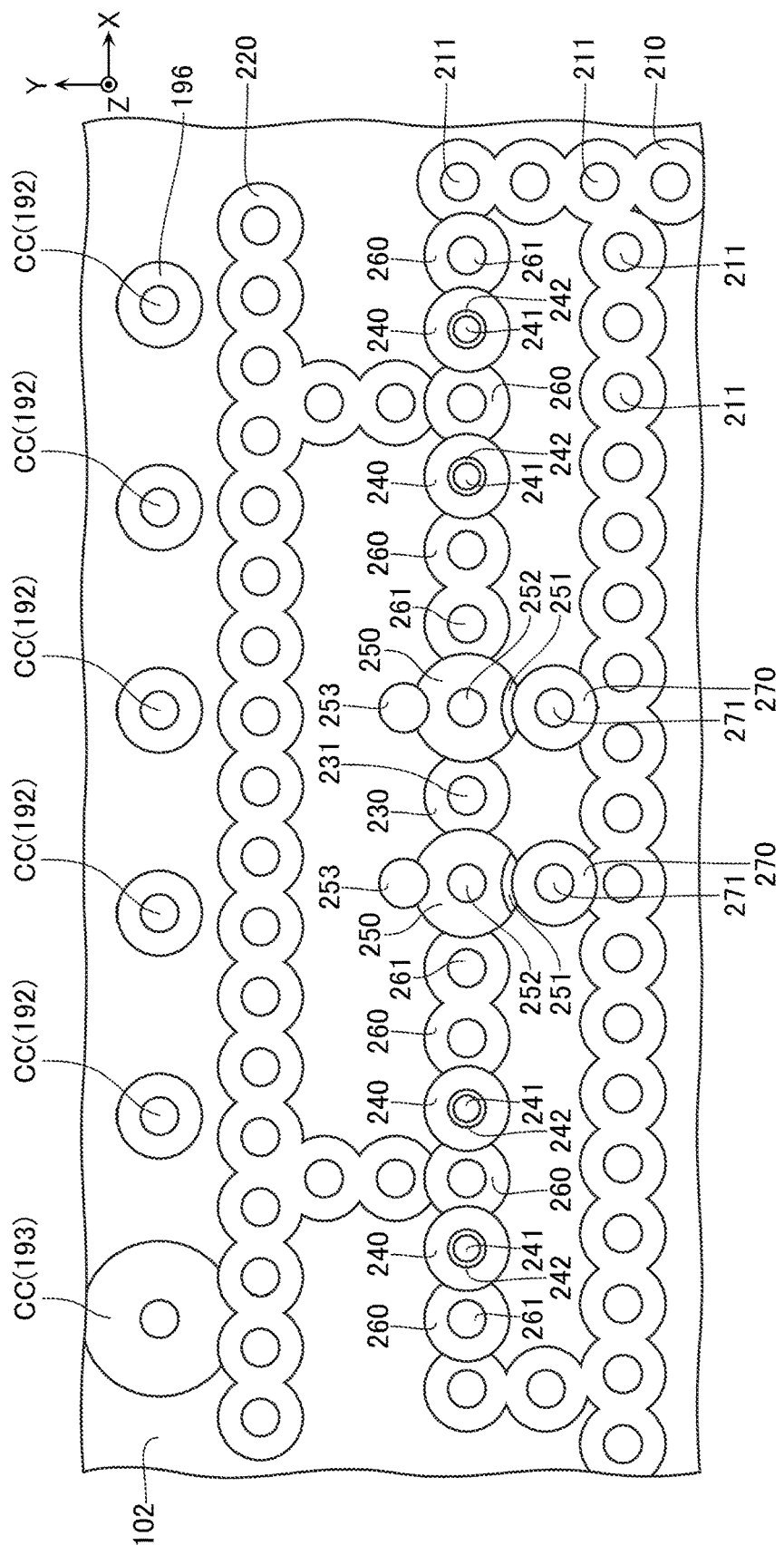
FIG. 76 is a schematic plan view for describing another example of the semiconductor memory device according to the second embodiment.

For example, as illustrated in FIG. 75, the pre-amplifier circuit PA may include two or more circuit elements pa connected in parallel between the nodes N1 and N2. The circuit elements pa may each include the transistors Tr1, Tr2, and Tr3, which have been described with reference to FIG. 41. In the case, for example, as illustrated in FIG. 76, two or more sets of components of any of the configurations described above may be disposed in the hook-up region, and may be connected in parallel between the common conductive layers 210 and 220.

Figure 77:
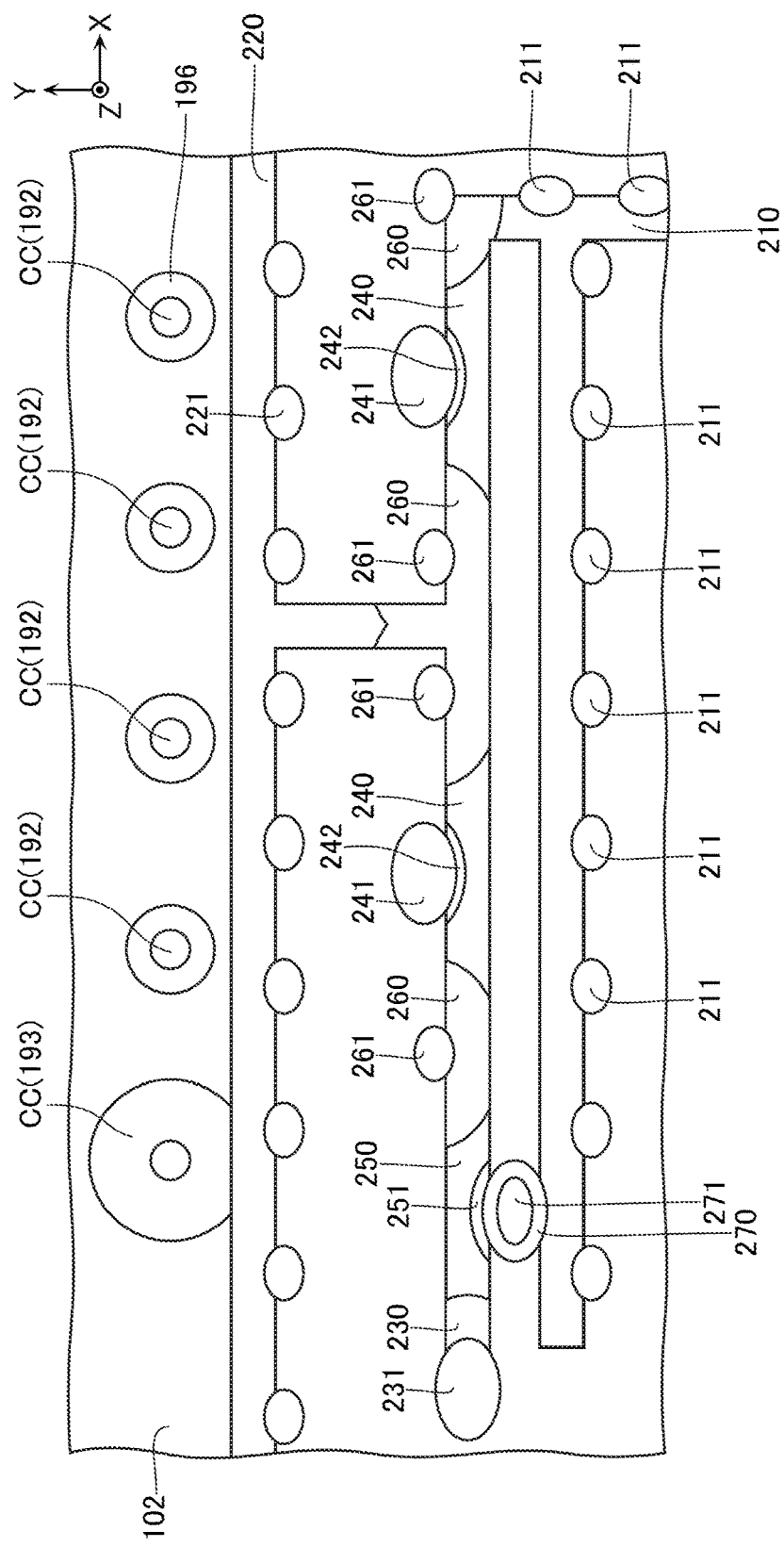
FIG. 77 is a schematic plan view for describing another example of the semiconductor memory device according to the second embodiment.

In the example described above, at least a part of the outlines of the conductive layers 210 and 220 and the semiconductor layers 230, 240, 250, 260, and 270 are formed in curved line shapes along the circumferences of the circles with center positions of the configurations passing through them as their centers. However, the configuration is merely an example, and a specific configuration is appropriately adjustable. For example, in the example of FIG. 77, the outlines of the conductive layers 210 and 220 and the semiconductor layers 230, 240, 250, 260, and 270 are formed along straight lines extending in the X-direction or the Y-direction. To manufacture the configuration, for example, in the step described with reference to FIG. 9 and FIG. 10, patterning can be performed on the hook-up region to form a plurality of trenches and in the step described with reference to FIG. 11, insulating layers of, for example, silicon oxide (SiO$_2$) can be formed in the plurality of trenches.

Other Embodiments

The semiconductor memory devices according to the first embodiment and the second embodiment have been described above. However, the semiconductor memory devices according to the embodiments are merely examples, and a specific configuration, an operation, and the like are appropriately adjustable.

For example, the semiconductor memory devices according to the first embodiment and the second embodiment include so-called NAND flash memories. However, the configurations described as examples in the first embodiment and the second embodiment are applicable to a semiconductor memory device other than the NAND flash memory. For example, the configurations as described in the first embodiment and the second embodiment as examples are applicable to a configuration that includes semiconductor layers extending in the Y-direction in the plurality of memory layers ML and ML2 and one or a plurality of memory transistors treating the semiconductor layers as channel regions. The configurations as described in the first embodiment and the second embodiment as examples are applicable to a configuration including another memory transistor. Additionally, the configurations as described in the first embodiment and the second embodiment as examples are applicable to another memory.

Additionally, as described with reference FIG. 1 and the like, the semiconductor memory devices according to the first embodiment and the second embodiment include the plurality of memory block regions $R_{BLK}$ arranged in the Y-direction and one hook-up region $R_{HU}$ disposed corresponding to the plurality of memory block regions $R_{BLK}$. However, the location of the hook-up region $R_{HU}$ is appropriately adjustable. For example, in the first embodiment and the second embodiment, the plurality of hook-up regions $R_{HU}$ may be disposed corresponding to the plurality of memory block regions $R_{BLK}$. In the case, the bit line region $R_{BL}$ may be omitted.

Additionally, as described with reference to FIG. 5 to FIG. 7, the contact electrode CC according to the first embodiment and the second embodiment includes the part 192 extending in the Z-direction and the approximately disk-shaped part 193 connected to the lower end of the part 192. However, the configuration of the contact electrode CC is appropriately adjustable. For example, in the first embodiment and the second embodiment, the approximately disk-shaped parts 193 may be omitted from the contact electrodes CC. In the case, for example, lower ends of the plurality of contact electrodes CC each may be connected to the upper surfaces of a plurality of the conductive layers 190 stacked in the Z-direction.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory block regions arranged in a first direction;
   a hook-up region arranged in the first direction with respect to the plurality of memory block regions; and
   a wiring region extending in the first direction, the wiring region being arranged with the plurality of memory block regions and the hook-up region in a second direction intersecting with the first direction, wherein
   each of the plurality of memory block regions includes:
      a plurality of memory strings that extend in the first direction and are arranged in the second direction; and
      a first wiring that extends in the second direction and is connected to the plurality of memory strings in common,
   the wiring region includes a second wiring that extends in the first direction and is connected to a plurality of the first wirings corresponding to the plurality of memory block regions in common, and the hook-up region includes:
- a third wiring electrically connected to the second wiring; and
- a contact electrode that extends in a third direction intersecting with the first direction and the second direction and is connected to the third wiring.

2. The semiconductor memory device according to claim 1, wherein the contact electrode includes:
- a first part extending in the third direction; and
- a second part connected to the first part, the second part being connected to a side surface in the first direction or the second direction of the third wiring, and when a cross-sectional surface that extends in the first direction and the second direction and includes the second part of the contact electrode is assumed to be a first cross-sectional surface, in the first cross-sectional surface:
- a part of an outline of the second part is disposed along a circumference of a first circle; and
- a part other than the part of the outline of the second part is disposed inside the first circle.

3. The semiconductor memory device according to claim 1, comprising a plurality of memory layers arranged in the third direction, wherein each of the plurality of memory layers includes the plurality of memory strings, a plurality of the first wirings, the second wiring, and the third wiring, and the hook-up region includes a plurality of the contact electrodes corresponding to the plurality of memory layers.

4. The semiconductor memory device according to claim 3, wherein each of the plurality of memory layers includes a signal amplifier circuit.

5. The semiconductor memory device according to claim 3, wherein the hook-up region includes a first voltage supply line that extends in the third direction, in the hook-up region, each of the plurality of memory layers includes:
- a fourth wiring electrically connected between the second wiring and the third wiring;
- a first transistor electrically connected between the third wiring and the fourth wiring;
- a second transistor electrically connected between the third wiring and the first voltage supply line; and
- a third transistor electrically connected between the second transistor and the first voltage supply line, wherein the fourth wiring functions as a gate electrode of the third transistor.

6. The semiconductor memory device according to claim 5, wherein the hook-up region includes a first electrode and a second electrode that extend in the third direction, and in the plurality of memory layers, the first electrode and the second electrode function as gate electrodes of the first transistor and the second transistor respectively.

7. The semiconductor memory device according to claim 6, wherein in the hook-up region, each of the plurality of memory layers includes:
- a first semiconductor layer that includes a part opposed to the fourth wiring;
- a second semiconductor layer that is opposed to the first electrode; and
- a third semiconductor layer that is opposed to the second electrode.

8. The semiconductor memory device according to claim 7, wherein the hook-up region includes a second voltage supply line that extends in the third direction and is connected to the first semiconductor layer.

9. A semiconductor memory device comprising:
- a plurality of memory cells arranged in a first direction;
- a plurality of first wirings arranged in the first direction and being electrically connected to the plurality of memory cells; and
- a contact electrode extending in the first direction and being connected to any of the plurality of first wirings, wherein the contact electrode includes:
- a first part that extends in the first direction; and
- a second part connected to the first part, the second part being connected to a side surface in a second direction intersecting with the first direction of any of the plurality of first wirings, and when a cross-sectional surface that is perpendicular to the first direction and includes the second part of the contact electrode is assumed to be a first cross-sectional surface, in the first cross-sectional surface:
- a part of an outline of the second part is disposed along a circumference of a first circle; and
- a part other than the part of the outline of the second part is disposed inside the first circle.

10. The semiconductor memory device according to claim 9, wherein when a cross-sectional surface that is perpendicular to the first direction and includes the first part of the contact electrode is assumed to be a second cross-sectional surface:
- an area of the first part in the second cross-sectional surface is smaller than an area of the second part in the first cross-sectional surface.

11. The semiconductor memory device according to claim 9, comprising a plurality of memory layers arranged in the first direction, wherein each of the plurality of memory layers includes the plurality of memory cells and the plurality of first wirings, and each of the plurality of memory layers includes a signal amplifier circuit.

12. The semiconductor memory device according to claim 11, wherein in one memory layer among the plurality of memory layers,
the signal amplifier circuit is electrically connected between at least one of the plurality of first wirings and the plurality of memory cells.

13. A semiconductor memory device comprising:
- a plurality of memory layers arranged in a first direction;
- a plurality of contact electrodes that extend in the first direction and are connected to the plurality of memory layers; and
- a first voltage supply line that extends in the first direction and is connected to the plurality of memory layers, wherein each of the plurality of memory layers includes:

a memory cell;
a first wiring electrically connected to the memory cell;
a second wiring electrically connected to any of the plurality of contact electrodes;
a first transistor electrically connected between the first wiring and the second wiring;
a second transistor electrically connected between the second wiring and the first voltage supply line; and
a third transistor electrically connected between the second transistor and the first voltage supply line, wherein
the first wiring functions as a gate electrode of the third transistor.

14. The semiconductor memory device according to claim 13, comprising
a first electrode and a second electrode that extend in the first direction and are connected to the plurality of memory layers, wherein
the first electrode and the second electrode function as gate electrodes of the first transistor and the second transistor respectively.

15. The semiconductor memory device according to claim 14, wherein
each of the plurality of memory layers includes:
a first semiconductor layer including a part opposed to the first wiring;
a second semiconductor layer opposed to the first electrode; and
a third semiconductor layer opposed to the second electrode.

16. The semiconductor memory device according to claim 15, comprising
a second voltage supply line extending in the first direction and being connected to the first semiconductor layer.

17. The semiconductor memory device according to claim 15, wherein
each of the plurality of memory layers includes at least two gate insulating layers in contact with the first semiconductor layer, and
the first semiconductor layer is opposed to the first wiring via the at least two gate insulating layers.

18. The semiconductor memory device according to claim 13, wherein
each of the plurality of contact electrodes includes:
a first part extending in the first direction; and
a second part connected to the first part, the second part being connected to a side surface in a second direction intersecting with the first direction of any of the plurality of first wirings, and
when a cross-sectional surface that is perpendicular to the first direction and includes the second parts of the plurality of contact electrodes is assumed to be a first cross-sectional surface, in the first cross-sectional surface:
a part of an outline of the second part is disposed along a circumference of a first circle; and
a part other than the part of the outline of the second part is disposed inside the first circle.

19. The semiconductor memory device according to claim 18, wherein
when a cross-sectional surface that is perpendicular to the first direction and includes the first part of the contact electrode is assumed to be a second cross-sectional surface:
an area of the first part in the second cross-sectional surface is smaller than an area of the second part in the first cross-sectional surface.

* * * * *